(12) United States Patent
Shibazaki

(10) Patent No.: US 11,742,299 B2
(45) Date of Patent: Aug. 29, 2023

(54) DETERMINATION METHOD AND APPARATUS, PROGRAM, INFORMATION RECORDING MEDIUM, EXPOSURE APPARATUS, LAYOUT INFORMATION PROVIDING METHOD, LAYOUT METHOD, MARK DETECTION METHOD, EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 6 days.

(21) Appl. No.: 17/354,016

(22) Filed: Jun. 22, 2021

(65) Prior Publication Data

US 2021/0313278 A1 Oct. 7, 2021

Related U.S. Application Data

(63) Continuation of application No. 16/351,081, filed on Mar. 12, 2019, now abandoned, which is a (Continued)

(30) Foreign Application Priority Data

Sep. 27, 2016 (JP) ................................ 2016-188889

(51) Int. Cl.
*H01L 23/544* (2006.01)
*H01L 21/68* (2006.01)
(Continued)

(52) U.S. Cl.
CPC .............. *H01L 23/544* (2013.01); *G03F 7/20* (2013.01); *G03F 7/22* (2013.01); *G03F 7/70633* (2013.01);
(Continued)

(58) Field of Classification Search
CPC ....... H01L 23/544; G03F 7/20; G03F 7/70633
(Continued)

(56) References Cited

U.S. PATENT DOCUMENTS 4,780,617 A 10/1988 Umatate et al.
4,861,162 A 8/1989 Ina
(Continued)

FOREIGN PATENT DOCUMENTS

EP 1420298 A2 5/2004
EP 1653288 A1 5/2006
(Continued)

OTHER PUBLICATIONS

Sep. 14, 2021 Office Action issued in Taiwanese Patent Application No. 106132529.
(Continued)

*Primary Examiner* — Suchin Parihar
(74) *Attorney, Agent, or Firm* — Oliff PLC

(57) ABSTRACT

A determination apparatus has a calculation section, where first and second direction pitches intersecting within a predetermined plane of a plurality of detection areas are $D_1$ and $D_2$, respectively, sizes in the first and second directions of each of a plurality of divided areas arranged two-dimensionally along the first and second directions on a substrate are $W_1$ and $W_2$, respectively, and first and second direction pitches of a plurality of marks arranged on the substrate are $p_1$ and $p_2$, respectively, calculates pitch p1 and pitch $p_2$ of the plurality of marks that satisfy formulas (a) and (b) below, based on pitch $D_1$, pitch $D_2$, size $W_1$, and size $W_2$.

$p_1 = D_1/i$ ($i$ denotes a natural number)$= W_1/m$ ($m$ denotes a natural number) (a)

$p_2 = D_2/j$ ($j$ denotes a natural number)$= W_2/n$ ($n$ denotes a natural number) (b)

14 Claims, 18 Drawing Sheets

Related U.S. Application Data continuation of application No. PCT/JP2017/033376, filed on Sep. 15, 2017.

(51) Int. Cl.
- *G03F 7/22* (2006.01)
- *G03F 7/20* (2006.01)
- *G03F 7/00* (2006.01)

(52) U.S. Cl.
CPC .... *H01L 21/68* (2013.01); *H01L 2223/54426* (2013.01)

(58) Field of Classification Search
USPC .......................................................... 438/14
See application file for complete search history.

(56) References Cited

U.S. PATENT DOCUMENTS

| | | | |
|---|---|---|---|
| 5,151,750 A | 9/1992 | Magome et al. | |
| 5,448,332 A | 9/1995 | Sakakibara et al. | |
| 5,969,441 A | 10/1999 | Loopstra et al. | |
| 6,208,407 B1 | 3/2001 | Loopstra | |
| 6,242,754 B1 | 6/2001 | Shiraishi | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,952,253 B2 | 10/2005 | Lof et al. | |
| 7,023,610 B2 | 4/2006 | Ohtsuki et al. | |
| 7,319,506 B2 | 1/2008 | Den Boef et al. | |
| 7,388,663 B2 | 6/2008 | Gui | |
| 7,589,822 B2 | 9/2009 | Shibazaki | |
| 8,054,472 B2 | 11/2011 | Shibazaki | |
| 8,432,534 B2 | 4/2013 | Shibazaki | |
| 8,514,395 B2 | 8/2013 | Shibazaki | |
| 2002/0041377 A1 | 4/2002 | Hagiwara et al. | |
| 2002/0135776 A1* | 9/2002 | Nishi | G03F 7/70775 356/500 |
| 2003/0025890 A1 | 2/2003 | Nishinaga | |
| 2004/0058540 A1* | 3/2004 | Matsumoto | G03F 9/7092 438/689 |
| 2006/0092419 A1 | 5/2006 | Gui | |
| 2006/0261288 A1 | 11/2006 | Van Santen | |
| 2008/0309903 A1 | 12/2008 | Morimoto | |
| 2009/0004580 A1* | 1/2009 | Kanaya | G03F 7/70775 430/22 |

FOREIGN PATENT DOCUMENTS

| | | |
|---|---|---|
| EP | 1653288 B1 | 5/2019 |
| JP | 2004-111861 A | 4/2004 |
| JP | 2005-026615 A | 1/2005 |
| KR | 10-2008-0078585 A | 8/2008 |
| TW | I326015 B | 6/2010 |
| WO | 2004/055803 A1 | 7/2004 |

OTHER PUBLICATIONS

Nov. 21, 2017 International Search Report issued in International Patent Application No. PCT/JP2017/033376.
Nov. 21, 2017 Written Opinion issued in International Patent Application No. PCT/JP2017/033376.
Jan. 15, 2021 Office Action issued in U.S. Appl. No. 16/351,081.
Oct. 21, 2020 Restriction Election Issued in U.S. Appl. No. 16/351,081.
Mar. 16, 2021 Office Action issued in Japanese Patent Application No. 2018-542387.
Aug. 31, 2022 Office Action issued in Korean Patent Application No. 10-2019-7011426.

* cited by examiner

DETERMINATION METHOD AND APPARATUS, PROGRAM, INFORMATION RECORDING MEDIUM, EXPOSURE APPARATUS, LAYOUT INFORMATION PROVIDING METHOD, LAYOUT METHOD, MARK DETECTION METHOD, EXPOSURE METHOD, AND DEVICE MANUFACTURING METHOD

CROSS-REFERENCE TO RELATED APPLICATIONS

This is a continuation of U.S. patent application Ser. No. 16/351,081 filed Mar. 12, 2019 (now abandoned), which in turn is a continuation of International Application No. PCT/JP2017/033376, with an international filing date of Sep. 15, 2017, which claims priority from Japanese Patent Application No. 2016-188889 filed in Japan on Sep. 27, 2016. The disclosure of each of the above-identified prior applications is hereby incorporated herein by reference in its entirety.

BACKGROUND OF THE INVENTION

Field of the Invention

The present invention relates to a determination method and an apparatus, a program, a layout information providing method, a layout method, a mark detection method, an exposure method, and a device manufacturing method.

Description of the Background Art

In a lithography process to manufacture micro-devices such as semiconductors, the devices are formed by overlaying multiple layers of circuit patterns on a substrate (hereinafter generally referred to as a wafer) such as wafer or a glass plate, however when the overlay accuracy between the layers is poor, the micro-devices will not be able to exhibit predetermined circuit characteristics and in some cases may be a defective product. Therefore, normally, a mark (an alignment mark) is formed in advance on each of a plurality of shot areas on the wafer, and position of the mark (coordinate value) on a stage coordinate system of an exposure apparatus is detected. After this, based on the mark position information and position information of a pattern (e.g., a reticle pattern) to be newly formed which is known, wafer alignment in which position of one shot area on the wafer is set with respect to the pattern is performed.

As a method of wafer alignment, enhanced global alignment (EGA) has become the main stream in which alignment marks of only several shot areas (referred to as sample shot areas or alignment shot areas) on the wafer are detected in balance with throughput and arrangement of shot areas on the wafer is calculated using a statistical technique. To obtain the arrangement of shot areas on the wafer with high precision with EGA, it is necessary to increase the number of shot areas and to detect more alignment marks.

As a method for detecting many alignment marks without decreasing the throughput as much as possible, for example, detecting a plurality of marks at once using a plurality of alignment sensors can be considered. However, shot maps (data concerning arrangement of shot areas formed on the wafer) of the wafer vary, as well as the size of the shot areas and arrangement of the marks. Accordingly, to be able to cope with the various shot maps, an exposure apparatus is known that has a part of alignment detection systems of a plurality of alignment detection systems made movable, so that space in between the systems becomes variable (for example, refer to U.S. Pat. No. 8,432,534).

However, the movable alignment detection system has many restrictions on design when compared to a fixed alignment detection system, and was also disadvantageous in terms of cost.

SUMMARY OF THE INVENTION

According to a first aspect of the present invention, there is provided a layout information providing method in which layout information is provided to arrange a plurality of marks that is detected using a mark detection system having a plurality of detection areas on a substrate on which a plurality of divided areas is set, wherein information related to an arrangement of the plurality of marks obtained based on arrangement information on the plurality of detection areas is provided as the layout information.

According to a second aspect of the present invention, there is provided a layout information providing method in which layout information is provided to arrange a plurality of marks for detection using a mark detection system having a plurality of detection areas on a substrate on which a plurality of divided areas is set, the method comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, providing as the layout information candidates for the size $W_1$ and the size $W_2$ and candidates for pitch $p_1$ in the first direction and pitch $p_2$ in the second direction of the plurality of marks corresponding thereto that satisfy formulas (a) and (b) below.

$$p_1 = D_1/i \text{ (} i \text{ denotes a natural number)} = W_1/m \text{ (} m \text{ denotes a natural number)} \quad (a)$$

$$p_2 = D_2/j \text{ (} j \text{ denotes a natural number)} = W_2/n \text{ (} n \text{ denotes a natural number)} \quad (b)$$

According to a third aspect of the present invention, there is provided a layout information providing method in which layout information is provided to arrange a plurality of marks for detection using a mark detection system having a plurality of detection areas on a substrate on which a plurality of divided areas is set, the method comprising: where pitches of a first direction and a second direction intersecting within a predetermined plane of the plurality of detection areas are $D_1$ and $D_2$, respectively, and pitch in the first direction and pitch in the second direction of the plurality of marks arranged on the substrate are $p_1$ and $p_2$, respectively, providing candidates for pitch $p_1$ in the first direction and pitch $p_2$ in the second direction of the plurality of marks that satisfy formulas (c) and (d) described below as the layout information described above.

$$p_1 = D_1/i \text{ (} i \text{ denotes a natural number)} \quad (c)$$

$$p_2 = D_2/j \text{ (} j \text{ denotes a natural number)} \quad (d)$$

According to a fourth aspect of the present invention, there is provided a layout information providing method in which layout information is provided to arrange a plurality of marks for detection using a mark detection system having a plurality of detection areas on a substrate on which a plurality of divided areas is set, the method comprising:

calculating ($D_1/i$) and ($D_2/j$), which are pitch $D_1$ in a first direction within a predetermined plane divided by natural number i (i=1 to I) and pitch $D_2$ in a second direction intersecting the first direction within the predetermined plane divided by natural number j (j=1 to J) of the plurality of detection areas as a plurality of candidates $p_{2j}$ for pitch $p_1$ in the first direction of a plurality of marks arranged on a substrate and a plurality of candidates $p_{2j}$ for pitch $p_2$ in the second direction of a plurality of marks arranged on a substrate, along with calculating $m \cdot p_{1i}$, which is a plurality of candidates $p_{1i}$ sequentially multiplied by a natural number m (m=1 to M), and $n \cdot p_{2j}$, which is a plurality of candidates $p_{2j}$ sequentially multiplied by a natural number n (n=1 to N), as candidates for size $W_1$ in the first direction and size $W_2$ in the second direction of a plurality of divided areas arranged two-dimensionally along the first direction and the second direction on the substrate, and providing candidates $W_{1m}$ for the size $W_1$ and candidates $W_{2n}$ for size $W_2$ which are calculated, and candidates $p_{1i}$ for pitch $p_1$ in the first direction and candidates $p_{2j}$ for pitch $p_2$ in the second direction of the plurality of marks corresponding thereto as the layout information.

According to a fifth aspect of the present invention, there is provided a layout information providing method in which layout information is provided to arrange a plurality of marks for detection using a mark detection system having a plurality of detection areas on a substrate on which a plurality of divided areas is set, the method comprising: calculating ($D_1/i$) and ($D_2/j$), which are pitch $D_1$ in a first direction divided by natural number i (i=1 to I) and pitch $D_2$ in a second direction divided by natural number j (j=1 to J) of a plurality of virtual points arranged in the first direction and the second direction intersecting each other in a predetermined plane including points in each of the plurality of detection areas, as a plurality of candidates $p_{1i}$ for pitch $p_1$ in the first direction of the plurality of marks arranged on the substrate and a plurality of candidates $p_{2j}$ for pitch $p_2$ in the second direction of the plurality of marks arranged on the substrate, along with calculating $m \cdot p_{1i}$, which is a plurality of candidates $p_{1i}$ sequentially multiplied by a natural number m (m=1 to M), and $n \cdot p_{2j}$, which is a plurality of candidates $p_{2j}$ sequentially multiplied by a natural number n (n=1 to N), as candidates for size $W_1$ in the first direction and size $W_2$ in the second direction of a plurality of divided areas arranged two-dimensionally along the first direction and the second direction on the substrate, and providing candidates for the size $W_1$ and candidates for size $W_2$ which are calculated, and candidates $p_{1i}$ for pitch $p_1$ in the first direction and candidates $p_{2j}$ for pitch $p_2$ in the second direction of the plurality of marks corresponding thereto as the layout information.

According to a sixth aspect of the present invention, there is provided layout information to arrange a plurality of marks detected using a mark detection system having a plurality of detection areas on a substrate on which a plurality of divided areas is set, comprising: information related to an arrangement of the plurality of marks obtained based on arrangement information on the plurality of detection areas.

According to a seventh aspect of the present invention, there is provided layout information to arrange a plurality of marks for detection using a mark detection system having a plurality of detection areas on a substrate on which a plurality of divided areas is set, the information comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, candidates for the size $W_1$ and the size $W_2$ and candidates for pitch $p_1$ in the first direction and pitch $p_2$ in the second direction corresponding thereto that satisfy formulas (a) and (b) below, obtained from the pitches $D_1$ and $D_2$.

$$p_1 = D_1/i \text{ (i denotes a natural number)} = W_1/m \text{ (m denotes a natural number)} \tag{a}$$

$$p_2 = D_2/j \text{ (j denotes a natural number)} = W_2/n \text{ (n denotes a natural number)} \tag{b}$$

According to an eighth aspect of the present invention, there is provided a determination method to determine an arrangement of a plurality of marks for detection using a mark detection system having a plurality of detection areas on a substrate on which a plurality of divided areas is set, the method comprising: determining an arrangement of the plurality of marks based on arrangement information on the plurality of detection areas.

According to a ninth aspect of the present invention, there is provided a determination method to determine an arrangement of a plurality of marks for detection using a mark detection system having a plurality of detection areas on a substrate on which a plurality of divided areas is set, the method comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, determining pitch $p_1$ in the first direction and pitch $p_2$ in the second direction of the plurality of marks that satisfy formulas (a) and (b) below, based on the pitch $D_1$, the pitch $D_2$, the size $W_1$ and the size $W_2$.

$$p_1 = D_1/i \text{ (i denotes a natural number)} = W_1/m \text{ (m denotes a natural number)} \tag{a}$$

$$p_2 = D_2/j \text{ (j denotes a natural number)} = W_2/n \text{ (n denotes a natural number)} \tag{b}$$

According to a tenth aspect of the present invention, there is provided a determination method to determine an arrangement of a plurality of marks for detection using a mark detection system having a plurality of detection areas on a substrate on which a plurality of divided areas is set, the method comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, determining at least one candidate for each of pitch $p_1$ in the first direction and pitch $p_2$ in the second direction of the plurality of marks that satisfy formulas (a) and (b) below, based on the pitch $D_1$, the pitch $D_2$, the size $W_1$ and the size $W_2$.

$$p_1 = D_1/i \text{ (} i \text{ denotes a natural number)} = W_1/m \text{ (} m \text{ denotes a natural number)} \quad \text{(a)}$$

$$p_2 = D_2/j \text{ (} j \text{ denotes a natural number)} = W_2/n \text{ (} n \text{ denotes a natural number)} \quad \text{(b)}$$

According to an eleventh aspect of the present invention, there is provided a determination method to determine an arrangement of a plurality of marks for detection using a mark detection system having a plurality of detection areas on a substrate on which a plurality of divided areas is set, and size of the divided areas, the method comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, determining size $W_1$ and size $W_2$ of the divided areas and pitch $p_1$ in the first direction and pitch $p_2$ in the second direction of the plurality of marks that satisfy formulas (a) and (b) below, based on the pitch $D_1$ and the pitch $D_2$.

$$p_1 = D_1/i \text{ (} i \text{ denotes a natural number)} = W_1/m \text{ (} m \text{ denotes a natural number)} \quad \text{(a)}$$

$$p_2 = D_2/j \text{ (} j \text{ denotes a natural number)} = W_2/n \text{ (} n \text{ denotes a natural number)} \quad \text{(b)}$$

According to a twelfth aspect of the present invention, there is provided a determination method to determine an arrangement of a plurality of marks for detection using a mark detection system having a plurality of detection areas on a substrate on which a plurality of divided areas is set, and size of the divided areas, the method comprising: where pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, determining at least one candidate for each of size $W_1$ and size $W_2$, and at least one candidate for each of pitch $p_1$ in the first direction and pitch $p_2$ in the second direction of the plurality of marks corresponding thereto that satisfy formulas (a) and (b) below.

$$p_1 = D_1/i \text{ (} i \text{ denotes a natural number)} = W_1/m \text{ (} m \text{ denotes a natural number)} \quad \text{(a)}$$

$$p_2 = D_2/j \text{ (} j \text{ denotes a natural number)} = W_2/n \text{ (} n \text{ denotes a natural number)} \quad \text{(b)}$$

According to a thirteenth aspect of the present invention, there is provided a determination method to determine size of a plurality of divided areas and mark pitch so that a plurality of marks for detection that uses a mark detection system having a plurality of detection areas is arranged along with a plurality of divided areas on a substrate, the method comprising: sequentially calculating $(D_1/i)$ and $(D_2/j)$, which are pitch $D_1$ in a first direction divided by natural number i (i=1 to I) and pitch $D_2$ in a second direction divided by natural number j (j=1 to J) of a plurality of virtual points arranged in the first direction and the second direction intersecting each other in a predetermined plane including points in each of the plurality of detection areas, as a plurality of candidates $p_{1i}$ for pitch $p_1$ in the first direction and a plurality of candidates $p_{2j}$ for pitch $p_2$ in the second direction of the plurality of marks arranged on the substrate, calculating $m \cdot p_{1i}$, which is a plurality of candidates $p_{1i}$ (i=1 to I) sequentially multiplied by a natural number m (m=1 to M), and $n \cdot p_{2j}$, which is a plurality of candidates $p_{2j}$ (j=1 to J) sequentially multiplied by a natural number n (n=1 to N), as candidates for size $W_1$ in the first direction and candidates for size $W_2$ in the second direction of the plurality of divided areas arranged two-dimensionally along the first direction and the second direction on the substrate, and of the candidates for size $W_1$ and the candidates for size $W_2$ which are calculated, determining candidates whose values satisfy conditions decided in advance as final candidates for each of the size $W_1$ and the size $W_2$, and determining candidates $p_{1i}$ for pitch $p_1$ in the first direction and candidates $p_{2j}$ for pitch $p_2$ in the second direction of the plurality of marks corresponding to the final candidates that are determined as final candidates for the pitch $p_1$ and final candidates for the pitch $p_2$.

According to a fourteenth aspect of the present invention, there is provided a determination method to determine an arrangement of a plurality of detection areas of a mark detection system used to detect a plurality of marks arranged on a substrate with a plurality of divided areas, along with an arrangement of the plurality of marks, the method comprising: sequentially calculating $(W_1/m)$ and $(W_2/n)$, which are size $W_1$ in a first direction and size $W_2$ in the second direction divided by a natural number m (m=1 to M) and a natural number n (n=1 to N), respectively, of the plurality of divided areas arranged two-dimensionally along the first direction and the second direction intersecting each other on the substrate, as a plurality of candidates $p_{1m}$ (m=1 to M) for pitch $p_1$ in the first direction and a plurality of candidates $p_{2n}$ (n=1 to N) for pitch $p_2$ in the second direction of the plurality of marks arranged on the substrate, calculating $i \cdot p_{1m}$ and $j \cdot p_{2n}$, which are the plurality of candidates $p_{1m}$ (m=1 to M) and the plurality of candidates $p_{2n}$ (n=1 to N), sequentially multiplied by a natural number i (i=1 to I) and a natural number j (j=1 to J), respectively, as candidates $D_{1im}$ for pitch $D_1$ in the first direction and candidates $D_{2jn}$ for pitch $D_2$ in the second direction of a plurality of virtual points arranged in the first direction and the second direction within a predetermined plane parallel to the substrate, and of the candidates $D_{1im}$ for pitch $D_1$ and candidates $D_{2jn}$ for pitch $D_2$ that have been calculated, determining candidates whose values satisfy conditions decided in advance as final candidates for each of the pitch $D_1$ and the pitch $D_2$, along with determining the arrangement of the plurality of detection areas of the mark detection system so that at least a part of the plurality of virtual points decided according to the final candidates which are determined is positioned within each detection area, and determining a plurality of candidates $p_{1m}$ for pitch $p_1$ in the first direction and a plurality of candidates $p_{2n}$ for pitch $p_2$ in the second direction of the plurality of marks corresponding to the final candidates that are determined as final candidates for the pitch $D_1$ and final candidates for the pitch $D_2$.

According to a fifteenth aspect of the present invention, there is provided a determination method to determine an arrangement of a plurality of detection areas of a mark detection system used to detect a plurality of marks on a substrate on which a plurality of divided areas is set, the method comprising: determining the arrangement of the plurality of detection areas, based on size of the plurality of divided areas arranged two-dimensionally along in a first direction and a second direction intersecting each other on the substrate.

According to a sixteenth aspect of the present invention, there is provided a determination method to determine an arrangement of a plurality of detection areas of a mark detection system used to detect a plurality of marks on a substrate on which a plurality of divided areas is set, wherein the plurality of detection areas includes a plurality of detection areas apart in a first direction within a predetermined plane and a plurality of detection areas apart in a second direction intersecting the first direction within the predetermined plane, and where pitch in the first direction of the plurality of detection areas is $D_1$ and pitch in the second direction of the plurality of detection areas is $D_2$, size in the first direction of the plurality of divided areas arranged on the substrate is $W_1$ and size in the second direction of the plurality of detection areas is $W_2$, determining the arrangement of the plurality of detection areas includes determining pitch $D_1$ and pitch $D_2$ of the plurality of detection areas that satisfy formulas (c) and (d) below, based on size $W_1$ and size $W_2$ of the divided areas.

$$D_1/i \ (i \text{ denotes a natural number}) = W_1/m \ (m \text{ denotes a natural number}) \tag{c}$$

$$D_2/j \ (j \text{ denotes a natural number}) = W_2/n \ (n \text{ denotes a natural number}) \tag{d}$$

According to a seventeenth aspect of the present invention, there is provided a determination apparatus that determines an arrangement of a plurality of marks for detection using a mark detection system having a plurality of detection areas on a substrate on which a plurality of divided areas is set, the apparatus comprising: a calculating means that calculates pitch $p_1$ and pitch $p_2$ of the plurality of marks that satisfy formulas (a) and (b) below, based on pitch $D_1$, pitch $D_2$, size $W_1$ and size $W_2$, when pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively.

$$p_1 = D_1/i \ (i \text{ denotes a natural number}) = W_1/m \ (m \text{ denotes a natural number}) \tag{a}$$

$$p_2 = D_2/j \ (j \text{ denotes a natural number}) = W_2/n \ (n \text{ denotes a natural number}) \tag{b}$$

According to an eighteenth aspect of the present invention, there is provided a determination apparatus that determines an arrangement of a plurality of marks for detection using a mark detection system having a plurality of detection areas on a substrate on which a plurality of divided areas is set, the apparatus comprising: a calculating means that calculates at least one candidate for pitch $p_1$ and for pitch $p_2$ of the plurality of marks that satisfy formulas (a) and (b) below, based on pitch $D_1$, pitch $D_2$, size $W_1$ and size $W_2$, when pitches of a first direction and a second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively.

$$p_1 = D_1/i \ (i \text{ denotes a natural number}) = W_1/m \ (m \text{ denotes a natural number}) \tag{a}$$

$$p_2 = D_2/j \ (j \text{ denotes a natural number}) = W_2/n \ (n \text{ denotes a natural number}) \tag{b}$$

According to a nineteenth aspect of the present invention, there is provided a determination apparatus that determines an arrangement of a plurality of marks for detection using a mark detection system having a plurality of detection areas on a substrate on which a plurality of divided areas is set, and size of the divided areas, the apparatus comprising: a calculating means that calculates size $W_1$ and size $W_2$, and pitch $p_1$ in a first direction and pitch $p_2$ in a second direction of the plurality of marks that satisfy formulas (a) and (b) below, based on pitch $D_1$ and pitch $D_2$, when pitches of the first direction and the second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively.

$$p_1 = D_1/i \ (i \text{ denotes a natural number}) = W_1/m \ (m \text{ denotes a natural number}) \tag{a}$$

$$p_2 = D_2/j \ (j \text{ denotes a natural number}) = W_2/n \ (n \text{ denotes a natural number}) \tag{b}$$

According to a twentieth aspect of the present invention, there is provided a determination apparatus that determines an arrangement of a plurality of marks for detection using a mark detection system having a plurality of detection areas on a substrate on which a plurality of divided areas is set, and size of the divided areas, the apparatus comprising: a calculating means that calculates at least one candidate for size $W_1$ and for size $W_2$ and at least one candidate for pitch $p_1$ in a first direction and for a pitch $p_2$ in a second direction of the plurality of marks corresponding thereto that satisfy formulas (a) and (b) below, based on pitch $D_1$ and pitch $D_2$, when pitches of the first direction and the second direction intersecting within a predetermined plane of the plurality of detection areas are $D_1$ and $D_2$, respectively, sizes in the first direction and the second direction of each of the plurality of divided areas arranged two-dimensionally along the first direction and the second direction on the substrate are $W_1$ and $W_2$, respectively, and pitches in the first direction and the second direction of the plurality of marks arranged on the substrate are $p_1$ and $p_2$, respectively.

$$p_1 = D_1/i \ (i \text{ denotes a natural number}) = W_1/m \ (m \text{ denotes a natural number}) \tag{a}$$

$$p_2 = D_2/j \ (j \text{ denotes a natural number}) = W_2/n \ (n \text{ denotes a natural number}) \tag{b}$$

According to a twenty-first aspect of the present invention, there is provided a determination apparatus that determines an arrangement of a plurality of marks for detection using a mark detection system having a plurality of detection areas on a substrate on which a plurality of divided areas is set, and size of the divided areas, the apparatus comprising: a first calculating means that sequentially calculates $(D_1/i)$ and $(D_2/j)$, which are pitch $D_1$ and pitch $D_2$ divided by a natural number i (i=1 to I) and a natural number j (j=1 to J), respectively, as a plurality of candidates $p_{1i}$ for pitch $p_1$ in a first direction and a plurality of candidates $p_{2j}$ for pitch $p_2$ in a second direction of the plurality of marks arranged on the substrate, in response to input of the pitch $D_1$ in the first direction and pitch $D_2$ in the second direction of a plurality of virtual points arranged in the first direction and the second direction intersecting each other in a predetermined plane including points in each of the plurality of detection areas, a second calculating means that sequentially calculates $m \cdot p_{1i}$ and $n \cdot p_{2j}$, which are a plurality of candidates $p_{1i}$ and a plurality of candidates $p_{2j}$ sequentially multiplied by a natural number m (m=1 to M) and a natural number n (n=1 to N), respectively, as candidates for size $W_1$ in the first direction and size $W_2$ in the second direction of the plurality of divided areas arranged two-dimensionally along the first direction and the second direction on the substrate, and a determining means that determines candidates whose values satisfy conditions decided in advance as final candidates for each of the size $W_1$ and the size $W_2$ of the candidates for the size $W_1$ and candidates for the size $W_2$ which are calculated, and candidates $p_{1i}$ for pitch $p_1$ in the first direction and candidates $p_{2j}$ for pitch $p_2$ in the second direction of the plurality of marks corresponding to the determined final candidates as final candidates for the pitch $p_1$ and final candidates for the pitch $p_2$.

According to a twenty-second aspect of the present invention, there is provided a determination apparatus that determines an arrangement of a plurality of detection areas of a mark detection system used to detect a plurality of marks arranged on a substrate with a plurality of divided areas, along with an arrangement of a plurality of marks, the apparatus comprising: a first calculating means that sequentially calculates ($W_1/m$) and ($W_2/n$), which are size $W_1$ and size $W_2$ divided by a natural number m (m=1 to M) and a natural number n (n=1 to N), respectively, as a plurality of candidates $p_{1m}$ (m=1 to M) for pitch $p_1$ in a first direction and a plurality of candidates $p_{2n}$ (n=1 to N) for pitch $p_2$ in a second direction of the plurality of marks arranged on the substrate, in response to input of the size $W_1$ in the first direction and the size $W_2$ in the second direction of the plurality of divided areas arranged two-dimensionally along the first direction and the second direction intersecting each other on the substrate, a second calculating means that sequentially calculates $i \cdot p_{1m}$ and $j \cdot p_{2n}$, which are the plurality of candidates $p_{1m}$ (m=1 to M) sequentially multiplied by a natural number i (i=1 to I) and the plurality of candidates $p_{2n}$ (n=1 to N) sequentially multiplied by a natural number j (j=1 to J), as candidates $D_{1im}$ for pitch $D_1$ in the first direction and candidates $D_{2jn}$ for pitch $D_2$ in the second direction of a plurality of virtual points arranged in the first direction and the second direction within a predetermined plane parallel to the substrate, and a determining means that determines final candidates for each of the pitch $D_1$ and the pitch $D_2$ whose values satisfy conditions decided in advance from the candidates $D_{1im}$ for pitch $D_1$ and candidates $D_{2jn}$ for pitch $D_2$ that have been calculated, along with determining the arrangement of the plurality of detection areas of the mark detection system so that at least a part of the plurality of virtual points decided according to the final candidates that have been determined is positioned within each detection area, and determines a plurality of candidates $p_{1m}$ for pitch $p_1$ in the first direction and a plurality of candidates $p_{2n}$ for pitch $p_2$ in the second direction of the plurality of marks corresponding to the determined final candidates for the pitch $D_1$ and the final candidates for the pitch $D_2$, as final candidates for the pitch $p_1$ and final candidates for the pitch $p_2$.

According to a twenty-third aspect of the present invention, there is provided a determination apparatus that determines an arrangement of a plurality of detection areas of a mark detection system used to detect a plurality of marks on a substrate on which a plurality of divided areas is set, wherein the plurality of detection areas includes a plurality of detection areas apart in a first direction within a predetermined plane and a plurality of detection areas apart in a second direction intersecting the first direction, and when pitch in the first direction of the plurality of detection areas is $D_1$ and pitch in the second direction of the plurality of detection areas is $D_2$, size in the first direction of the plurality of divided areas arranged on the substrate is $W_1$ and size in the second direction of the plurality of divided areas is $W_2$, determines pitch $D_1$ and pitch $D_2$ of the plurality of detection areas that satisfy formulas (c) and (d) below, based on size $W_1$ and size $W_2$ of the divided areas.

$$D_1/i \text{ ($i$ denotes a natural number)} = W_1/m \text{ ($m$ denotes a natural number)} \quad (c)$$

$$D_2/j \text{ ($j$ denotes a natural number)} = W_2/n \text{ ($n$ denotes a natural number)} \quad (d)$$

According to a twenty-fourth aspect of the present invention, there is provided a program, to make a computer execute one of the layout information providing method relating to any one of the first to fifth aspects, and the determination method relating to any one the eighth to sixteenth aspects.

According to a twenty-fifth aspect of the present invention, there is provided an information recording medium that can be read by a computer in which the program relating to the twenty-fourth aspect is stored.

According to a twenty-sixth aspect of the present invention, there is provided an exposure apparatus that exposes a substrate and forms a plurality of divided areas on the substrate, comprising: a mark detection system having a plurality of detection areas; and the determination apparatus relating to any one of the seventeenth to the twenty-third aspects that determines one of an arrangement of a plurality of marks which are detected using the mark detection system, and an arrangement of a plurality of marks which are detected using the mark detection system also with size of divided areas in which the plurality of marks is formed.

According to a twenty-seventh aspect of the present invention, there is provided an exposure apparatus that exposes a substrate with an energy beam, comprising: a mark detection system having a plurality of detection areas; and a stage having a holding section which holds the substrate and is movable with respect to the plurality of detection areas, wherein the plurality of detection areas has a first detection area, a second detection area apart in a first direction with respect to the first detection area, and a third detection area apart in a second direction intersecting with the first direction, and by movement of the stage to a first position, at least one mark on the substrate can be detected in each of the first, the second, and the third detection areas, and by movement of the stage from the first position to a second position, at least one mark on the substrate can be detected in each of the first, the second, and the third detection areas.

According to a twenty-eighth aspect of the present invention, there is provided an exposure apparatus that exposes a substrate with an energy beam, comprising: a mark detection system having a plurality of detection areas; and a stage having a holding section which holds the substrate and is movable with respect to the plurality of detection areas, wherein the plurality of detection areas includes a plurality of detection areas apart in a first direction and a plurality of detection areas apart in a second direction intersecting the first direction within a predetermined plane, and when pitch in the first direction of the plurality of detection areas is $D_1$ and pitch in the second direction of the plurality of detection areas is $D_2$, size in the first direction of the plurality of divided areas arranged on the substrate is $W_1$ and size in the second direction of the plurality of divided areas is $W_2$, determines an arrangement of the plurality of detection areas with pitch $D_1$ and pitch $D_2$ that satisfy formulas (c) and (d) below.

$$D_1/i \text{ (}i\text{ denotes a natural number)}=W_1/m \text{ (}m\text{ denotes a natural number)} \quad (c)$$

$$D_2/j \text{ (}j\text{ denotes a natural number)}=W_2/n \text{ (}n\text{ denotes a natural number)} \quad (d)$$

According to a twenty-ninth aspect of the present invention, there is provided a layout method of a plurality of marks formed on a substrate to perform detection using a mark detection system having a plurality of detection areas set by pitch $D_1$ in a first direction within a predetermined plane and pitch $D_2$ in a second direction intersecting the first direction within the predetermined plane, wherein where sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, the pitch $p_1$ and the pitch $p_2$ that satisfy formulas (a) and (b) below are determined.

$$p_1=D_1/i \text{ (}i\text{ denotes a natural number)}=W_1/m \text{ (}m\text{ denotes a natural number)} \quad (a)$$

$$p_2=D_2/j \text{ (}j\text{ denotes a natural number)}=W_2/n \text{ (}n\text{ denotes a natural number)} \quad (b)$$

According to a thirtieth aspect of the present invention, there is provided a layout method of a plurality of marks formed on a substrate to perform detection using a mark detection system having a plurality of detection areas whose detection centers coincide with at least two points of a plurality of virtual points set by pitch $D_1$ in a first direction within a predetermined plane and pitch $D_2$ in a second direction intersecting the first direction within the predetermined plane, wherein when the plurality of marks is formed on the substrate arranged parallel to the predetermined plane at pitch $p_1$ in the first direction and pitch $p_2$ in the second direction, and size in the first direction of a plurality of divided areas arranged two-dimensionally along the first direction and the second direction on the substrate is $W_1$ and size in the second direction of a plurality of divided areas is $W_2$, the pitch $p_1$ and the pitch $p_2$ are decided so that the pitch $p_1$ satisfies $p_1=D_1/i$ (i denotes a natural number) and $p_1=W_1/m$ (m denotes a natural number), and the pitch $p_2$ satisfies $p_2=D_2/j$ (j denotes a natural number) and $p_2=W_2/n$ (n denotes a natural number).

According to a thirty-first aspect of the present invention, there is provided a mark detection method to detect a plurality of marks formed on a substrate, using a mark detection system having a plurality of detection areas set by pitch $D_1$ in a first direction within a predetermined plane and pitch $D_2$ in a second direction intersecting the first direction within the predetermined plane, wherein where sizes in the first direction and the second direction of each of the plurality of divided areas arranged two-dimensionally along the first direction and the second direction on the substrate are $W_1$ and $W_2$, respectively, and pitch in the first direction and pitch in the second direction of the plurality of marks arranged on the substrate are $p_1$ and $p_2$, respectively, a plurality of marks that satisfy formulas (a) and (b) below are formed on the substrate, and at least one of the marks on the substrate is concurrently detected in each of the plurality of detection areas using the mark detection system, while position information within the predetermined plane of the substrate is detected using a position detection system.

$$p_1=D_1/i \text{ (}i\text{ denotes a natural number)}=W_1/m \text{ (}m\text{ denotes a natural number)} \quad (a)$$

$$p_2=D_2/j \text{ (}j\text{ denotes a natural number)}=W_2/n \text{ (}n\text{ denotes a natural number)} \quad (b)$$

According to a thirty-second aspect of the present invention, there is provided a mark detection method in which detection of a plurality of marks formed on a substrate is performed, using a mark detection system having a plurality of detection areas whose detection centers coincide with at least two points of a plurality of virtual points set by pitch $D_1$ in a first direction within a predetermined plane and pitch $D_2$ in a second direction intersecting the first direction within the predetermined plane, wherein when size in the first direction of a plurality of divided areas arranged along the first direction and the second direction on the substrate is $W_1$ and size in the second direction of a plurality of divided areas is $W_2$, the plurality of marks is formed at pitch $p_1=D_1/i$ (i denotes a natural number)=$W_1/m$ (m denotes a natural number) and pitch $p_2=D_2/j$ (j denotes a natural number) =$W_2/n$ (n denotes a natural number) on the substrate, and at least one of the marks on the substrate is concurrently detected in each of the plurality of detection areas using the mark detection system, while position information within the predetermined plane of the substrate is detected using a position detection system.

According to a thirty-third aspect of the present invention, there is provided an exposure method, comprising: detecting at least a part of marks of the plurality of marks formed on the substrate by the mark detection method relating to one of the thirty-first and the thirty-second aspects; and exposing the substrate with an energy beam by moving the substrate, based on detection results of the marks.

According to a thirty-fourth aspect of the present invention, there is provided a device manufacturing method, comprising: exposing the substrate using the exposure apparatus relating to any one of the twenty-sixth to twenty-eighth aspects, or using the exposure method relating to the thirty-third aspect; and developing the substrate that has been exposed.

BRIEF DESCRIPTION OF DRAWINGS

In the accompanying drawings;

FIG. 11 is a planar view showing an arrangement of an interferometer that the exposure apparatus in FIG. 9 is equipped with;

FIG. 20 is a view showing a lithography process in manufacturing electronic devices such as a semiconductor device and the like.

DESCRIPTION OF EMBODIMENTS

Hereinafter, a determination apparatus according to an embodiment will be described, based on FIGS. 1 to 6.

Figure 1:
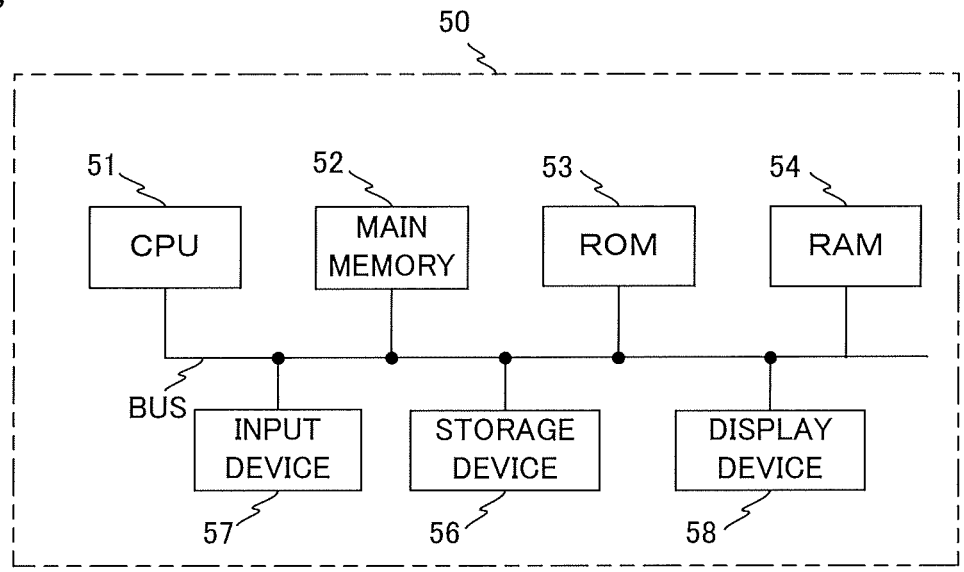
FIG. 1 is a view schematically showing a hardware structure of a determination apparatus according to an embodiment.

FIG. 1 schematically shows a hardware structure of a determination apparatus 50 according to the embodiment. Determination apparatus 50 is equipped with a central processing unit (Central Processing Unit: hereinafter referred to as a "CPU") 51, a main memory 52, a ROM (Read Only Memory) 53, a RAM (Random Access Memory) 54, a storage device 56 such as a hard disc drive (HDD) or a solid state drive (SSD), an input device 57, a display device 58 and the like. And each is connected via a common bus BUS.

CPU 51 controls the overall operation of determination apparatus 50. Main memory 52 is a device for temporarily storing programs or data, and the device can be accessed directly from CPU 51.

ROM 53 stores programs such as an IPL (Initial Program Loader) used for driving (starting) CPU 51. RAM 54 is used as a work area for CPU 51.

In storage device 56, a program is stored written in a code readable by CPU 51. Note that the program stored in storage device 56 is loaded onto main memory 52 when necessary, and is executed by CPU 51.

Input device 57 is equipped with an input medium (omitted in drawings) such as, e.g., a keyboard, a mouse, and notifies various information (including data) input by a user. Note that information from the input medium may be input using a wireless system.

Display device 58 is equipped with a display screen using, for example, a CRT, a liquid crystal display (LCD), or a plasma display panel (PDP) or the like, that displays various information.

Figure 2:
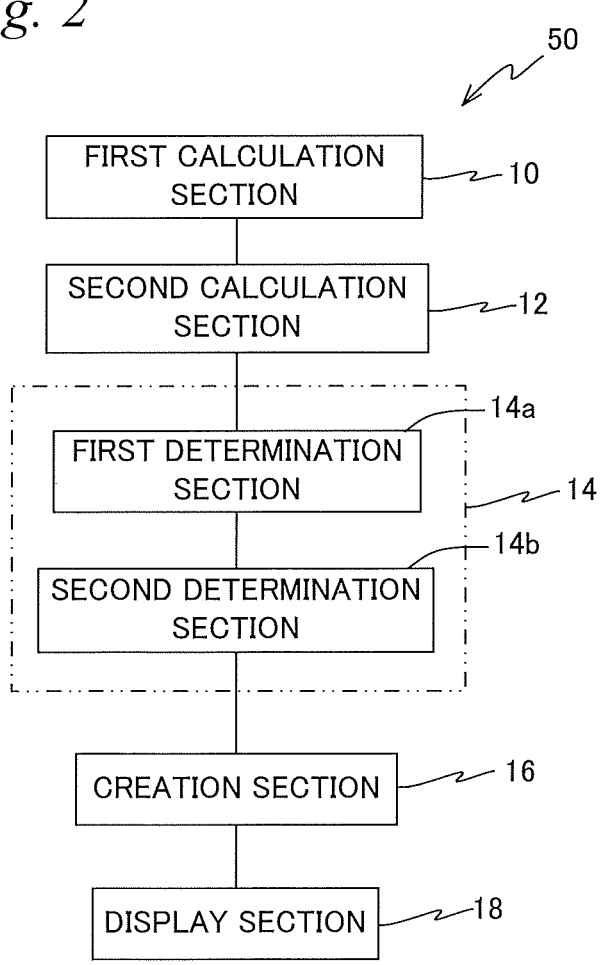
FIG. 2 is a view (function block diagram) showing a function configuration of the determination apparatus in FIG. 1.

Next, function configuration of determination apparatus 50 will be described. FIG. 2 shows the function configuration of determination apparatus 50. Each function part is achieved by each component in the hardware structure described earlier and a program corresponding to a processing algorithm shown in a flowchart to be described later on.

Determination apparatus 50 is an apparatus used to determine a layout of marks when arranging a plurality of marks (alignment marks) that are detected using a mark detection system (alignment detection system) having two or more K detection areas (e.g., having K columns) on a substrate such as a wafer or a glass plate which is used for manufacturing electronic devices (micro-devices) such as a semiconductor device or a liquid crystal display device. Determination apparatus 50 is equipped with a first calculation section 10, a second calculation section 12, a determination section 14 including a first determination section 14a and a second determination section 14b, a creation section 16, and a display section 18. Note that determination apparatus 50 may be equipped with a calculation section including the first calculation section 10 and the second calculation section 12.

The first calculation section 10, in response to input of data on a pitch Dx (Dx, for example, is 39 [mm]) in the X-axis direction of a plurality of detection areas lined in the X-axis direction and input of data on a pitch Dy (Dy, for example, is 44 [mm]) in the Y-axis direction of a plurality of detection areas lined in the Y-axis direction that are input via input device 57 as arrangement information on the K detection areas of the mark detection system, calculates (Dx/i) and (Dy/j) which are Dx and Dy divided by natural number i (i=1 to I) and natural number j (j=1 to J), respectively, as a plurality of candidates $px_i$ and $py_j$ for pitch px in the X-axis direction and pitch py in the Y-axis direction of a plurality of marks arranged on the substrate. Note that pitch Dx may be referred to as space Dx and pitch Dy may be referred to as space Dy.

Also, arrangement information on the detection areas is not limited to information on pitch (space), and may be information on coordinate position within an XY plane of each detection area (detection center).

Also, the arrangement information on the detection areas may be a designed arrangement information (e.g., design values of pitches Dx and Dy), or information regarding the arrangement of each detection area may be acquired (e.g., pitches Dx and Dy may be measured) within the apparatus in which the mark detection system is installed, and the values may serve as the arrangement information on the detection areas. Also, it may be considered that detection centers of the K detection areas of the mark detection system are arranged to coincide with a plurality of virtual points lined in the X-axis direction and the Y-axis direction orthogonal to each other within a predetermined plane (here, the XY plane) In this case, the first calculation section 10 includes at least K points that are input via input device 57 as information on pitches in the plurality of detection areas with which centers of the K detection areas of the mark detection system coincide, and in response to input of data on pitch Dx (Dx, for example, is 39 [mm]) in the X-axis direction and input of data on pitch Dy (Dy, for example, is 44 [mm]) in the Y-axis direction of a plurality of virtual points lined in the X-axis direction and the Y-axis direction orthogonal to each other within a predetermined plane (here, the XY plane), the first calculation section calculates (Dx/i) and (Dy/j) which are Dx and Dy divided by natural number i (i=i to I) and natural number j (j=1 to J), respectively, as a plurality of candidates $px_i$ and $py_j$ for pitch px in the X-axis direction and pitch py in the Y-axis direction of a plurality of marks arranged on the substrate.

Note that the arrangement information on the detection areas does not have to be input from input device 57. For example, when the information (e.g., pitches Dx, Dy) related to the arrangement of the detection areas is known, the information (data) may be stored in storage device 56, and the first calculation section 10 may calculate the plurality of candidates $px_i$ and $py_j$, based on information (e.g., pitches Dx and Dy) on the arrangement of the detection areas stored in the storage device.

Figure 3:
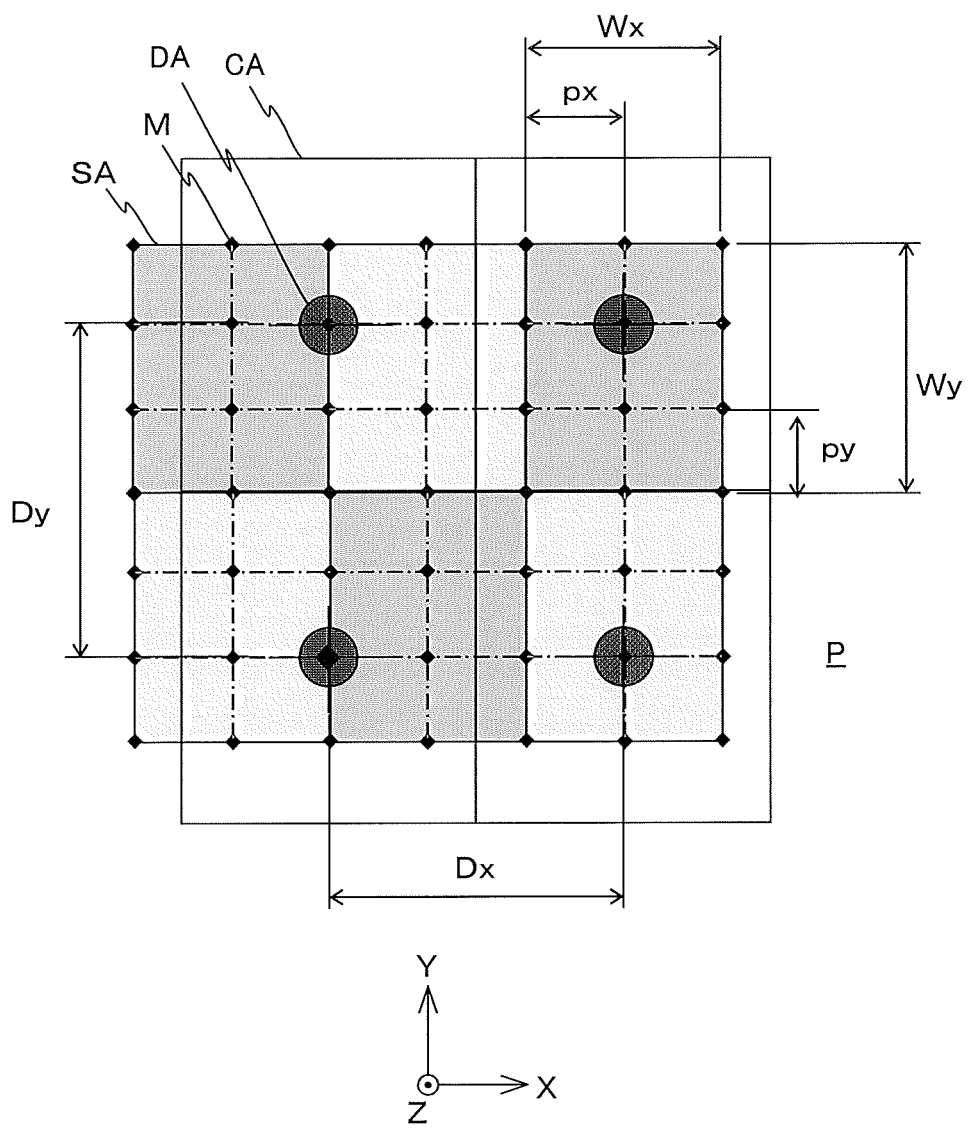
FIG. 3 is a view showing six shot areas SA taken out, formed in an arrangement of a matrix shape on a substrate, along with a plurality of alignment sensors (columns)

FIG. 3 shows, as an example, six shot areas SA of a plurality of shot areas SA formed arranged in a matrix shape along the X-axis direction and the Y-axis direction on substrate P arranged parallel to the XY plane, along with a plurality of alignment sensors, in this case, four alignment sensors (columns CA) to clarify the meaning such as the virtual points, pitches Dx and Dy, and pitches px and py described above. A small circle in the center of each column CA is detection area DA, and the center (detection center) coincides with four points of the plurality of virtual points set by pitch Dx and pitch Dy described above. In the example in FIG. 3, when focusing on each shot area SA, shot area SA is divided into six areas in a matrix shape of three rows two columns, and a mark M is arranged in the four corners of each divided area. Accordingly, in each shot area SA, mark M is arranged at 12 places. FIG. 3 shows an arrangement of mark M in the case i=3 and j=4, that is, in the case px=Dx/3 and py=Dy/4. Here, as is obvious from FIG. 3, in the case the plurality of detection areas DA is arranged lined at an equal space in two directions (or one direction) within the XY plane, pitch Dx in the X-axis direction and pitch Dy in the Y-axis direction of the plurality of detection areas are none other than space in the X-axis direction between the detection centers of two detection areas DA adjacent to each other in the X-axis direction and space in the Y-axis direction between the detection centers of two detection areas DA adjacent to each other in the Y-axis direction.

Note that in FIG. 3, it can also be said that pitch Dx in the X-axis direction of the plurality of virtual points is the space in the X-axis direction between two detection areas DA adjacent in the X-axis direction and pitch Dy in the Y-axis direction is the space in the Y-axis direction between two detection areas DA adjacent in the Y-axis direction.

Here, for convenience of explanation, as for the case, for example, when i is 1 to 10 (=I) and j is 1 to 10 (=J), calculation of (Dx/i) and (Dy/j) is to be performed. Accordingly, $px_i$=Dx/i (i=1 to 10) and $py_j$=Dy/j (j=1 to 10) are to be calculated by the first calculation section 10.

The second calculation section 12 calculates $m \cdot px_i$ and $n \cdot py_j$, which are the plurality of candidates $px_i$=Dx/i (i=1 to 10) and $py_j$=Dy/j (j=1 to 10) sequentially multiplied by a natural number m (m=1 to M) and a natural number n (n=1 to N), respectively, as a candidate $Wx_{im}$ for a size Wx in the X-axis direction and a candidate $Wy_{jn}$ for a size Wy in the Y-axis direction of the plurality of shot areas (divided areas) arranged two-dimensionally along the X-axis direction and the Y-axis direction on substrate P. Here, as for the case, for example, when m is 1 to 10 (=M) and n is 1 to 10 (=N), calculation of $Wx_{im}=m \cdot px_i$ and $Wy_{jn}=n \cdot py_j$ is to be performed. In this case, by the second calculation section 12, $m \cdot px_i$(m=1 to 10) is calculated for each of $px_i$(i=1 to 10), and as a consequence, $Wx_{im}=m \cdot px_i$ (i=1 to 10, m=1 to 10) is calculated as the candidate for size Wx. Similarly, by the second calculation section 12, $n \cdot py_j$ (j=1 to 10) is calculated for each of $py_j$ (j=1 to 10), and as a consequence, $Wy_{jn}=n \cdot py_j$ (j=1 to 10, n=1 to 10) is calculated as the candidate for size Wy.

However, since $px_i=Wx_{im}/m=Dx/i$ and $py_j=Wy_{jn}/n=Dy/j$, and Dx>Wx and Dy>Wy as is obvious from FIG. 3, in this case, i>m and j>n. Accordingly, by making such condition a premise for calculation, when calculation of $Wx_{im}=m \cdot px_i$ (i=1 to 10, m=1 to 10) and $Wy_{jn}=n \cdot py_j$ (j=1 to 10, n=1 to 10) is actually performed, only $Wx_{im}$ and $Wy_{jn}$ that satisfy i>m and j>n have to be calculated.

Note that the condition may be a condition that satisfies one of, or both Dx≤Wx and Dy≤Wy. Also, such premise condition may be input via input device 57, or may be stored in advance in storage device 56 or the like. Also, such premise condition can be used as information on the size of shot area (divided area) SA.

Of the candidate $Wx_{im}=m \cdot px_i$ for size Wx and the candidate $Wy_{jn}=n \cdot py_j$ for size Wy calculated above, the first determination section 14a determines only the candidates that satisfy a condition set in advance as final candidates for size Wx and final candidates for size Wy. For example, in the case the range of size Wx in the X-axis direction and the range of size Wy in the Y-axis direction of shot area SA are set to 30>Wx>15 and 35>Wy>25, then only candidates $Wx_{im}$ and candidates $Wy_{jn}$ that are within the ranges are to be the final candidates. Note that while there may be a case in which there is a different combination of i and m resulting to be the same $Wx_{im}$ value and a different combination of j and n resulting to be the same $Wy_{jn}$ value, as for both $Wx_{im}$ and $Wy_{jn}$, only one candidate is determined as the final candidate for the same value, Note that the range (e.g., 30>Wx>15) of size Wx in the X-axis direction and the range (e.g., 35>Wy>25) of size Wy in the Y-axis direction of shot area SA as is described above may be input via input device 57, or may be stored in storage device 56 in advance as information on the size of shot areas (divided areas).

As is described earlier, in the case $Wx_{im}$ and $Wy_{jn}$ are calculated, for example, when Dx=39, Dy=44, and i=1 to 10, j=1 to 10, m=1 to 10, and n=1 to 10 (and i>m, j>n), an example of the final candidates for Wx and Wy that satisfy the conditions described above of 30>Wx>15 and 35>Wy>25 are as follows.

TABLE 1

| | | | | | | | | |
|---|---|---|---|---|---|---|---|---|
| Final Candidates for Wx | 26.00 | 24.38 | 23.40 | 22.29 | 21.67 | 19.50 | 17.33 | 16.71 |
| Final Candidates for Wy | 33.00 | 31.43 | 30.80 | 29.33 | 27.50 | | | |

The second determination section 14b determines candidates $px_i$ and $py_j$ for pitch px in the X-axis direction and pitch py in the Y-axis direction of the plurality of marks corresponding to each of the final candidates $Wx_{im}$ and $Wy_{jn}$ for Wx and Wy determined at the first determination section 14a, as the final candidates for pitch px and pitch py. The final candidates for each of pitch px and pitch py corresponding to the final candidates for Wx and Wy described above are as follows.

TABLE 2

| Final Candidates for px | 4.333 | 4.876 | 5.573 | 6.5 | 7.8 | 9.75 | 13 | 19.5 |
|---|---|---|---|---|---|---|---|---|
| Final Candidates for py | 4.4 | 5.5 | 6.286 | 11 | 14.665 | | | |

Creation section 16 creates layout information (also called a template) of mark M in which a plurality of marks M is arranged two-dimensionally in the X-axis direction and the Y-axis direction at pitch px and pitch py in each of the shot areas (can also be referred to as shot fields) SA of a different size, based on the final candidates for size Wx and size Wy determined by determination section 14 and the final candidates for pitch px and pitch py.

Display section 18 displays the layout information created at creation section 16 on the display screen of display device 58. In this case, a plurality of, e.g., forty kinds of layout information, is displayed on the display screen, as is shown in FIG. 4.

Figure 4:
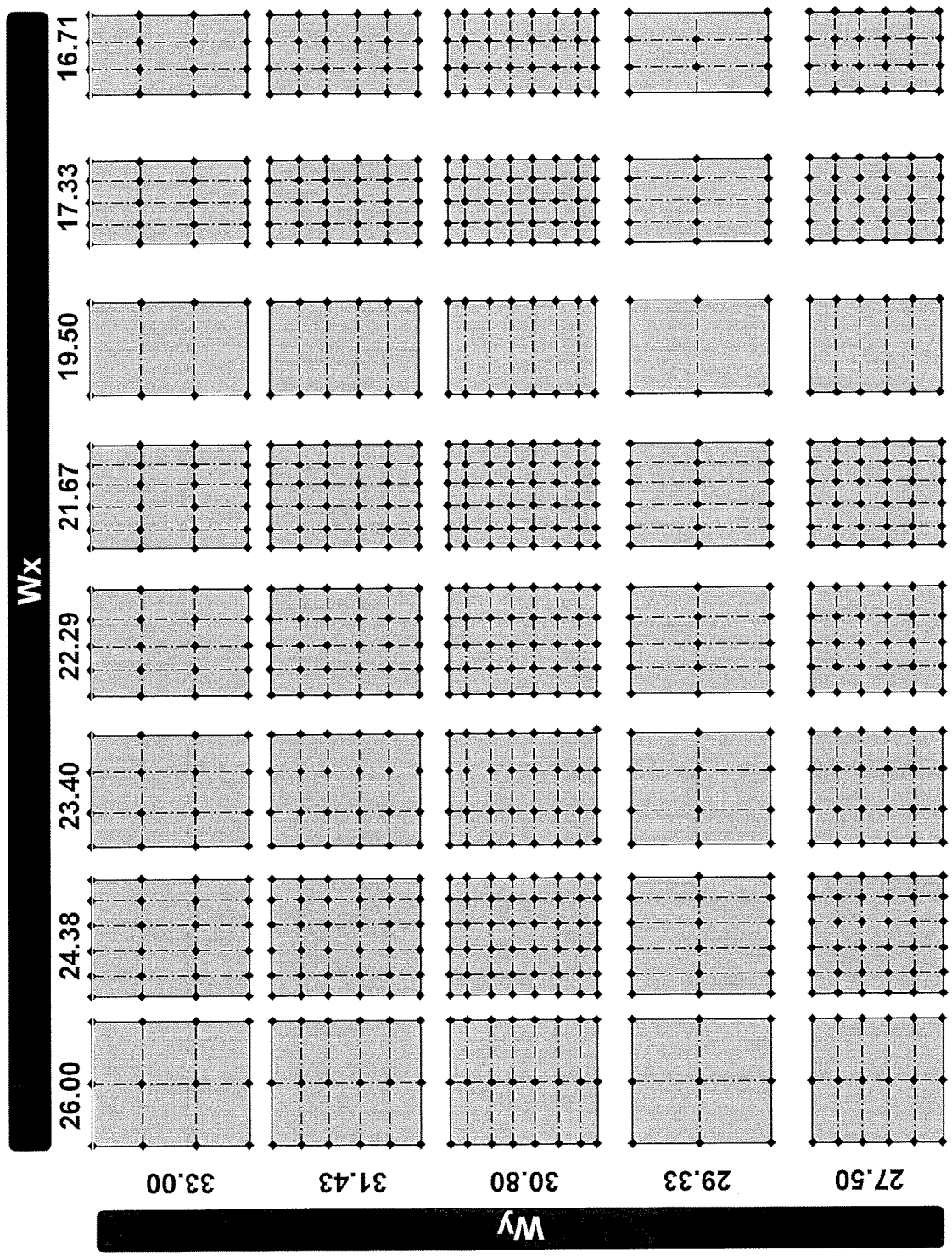
FIG. 4 is a view showing 40 kinds of layout information (templates) shown on the display screen.

Note that the layout information created at creation section 16 (layout information displayed at display section 18) is not limited to the one shown in FIG. 4. For example, layout information as in Tables 1 and 2 above may just be created (displayed).

While each function part in FIG. 2 modeled as hardware has been described so far, each of the function parts is actually achieved by CPU 51 of determination apparatus 50 executing a predetermined software program. This will be described below, based on FIG. 5.

Figure 5:
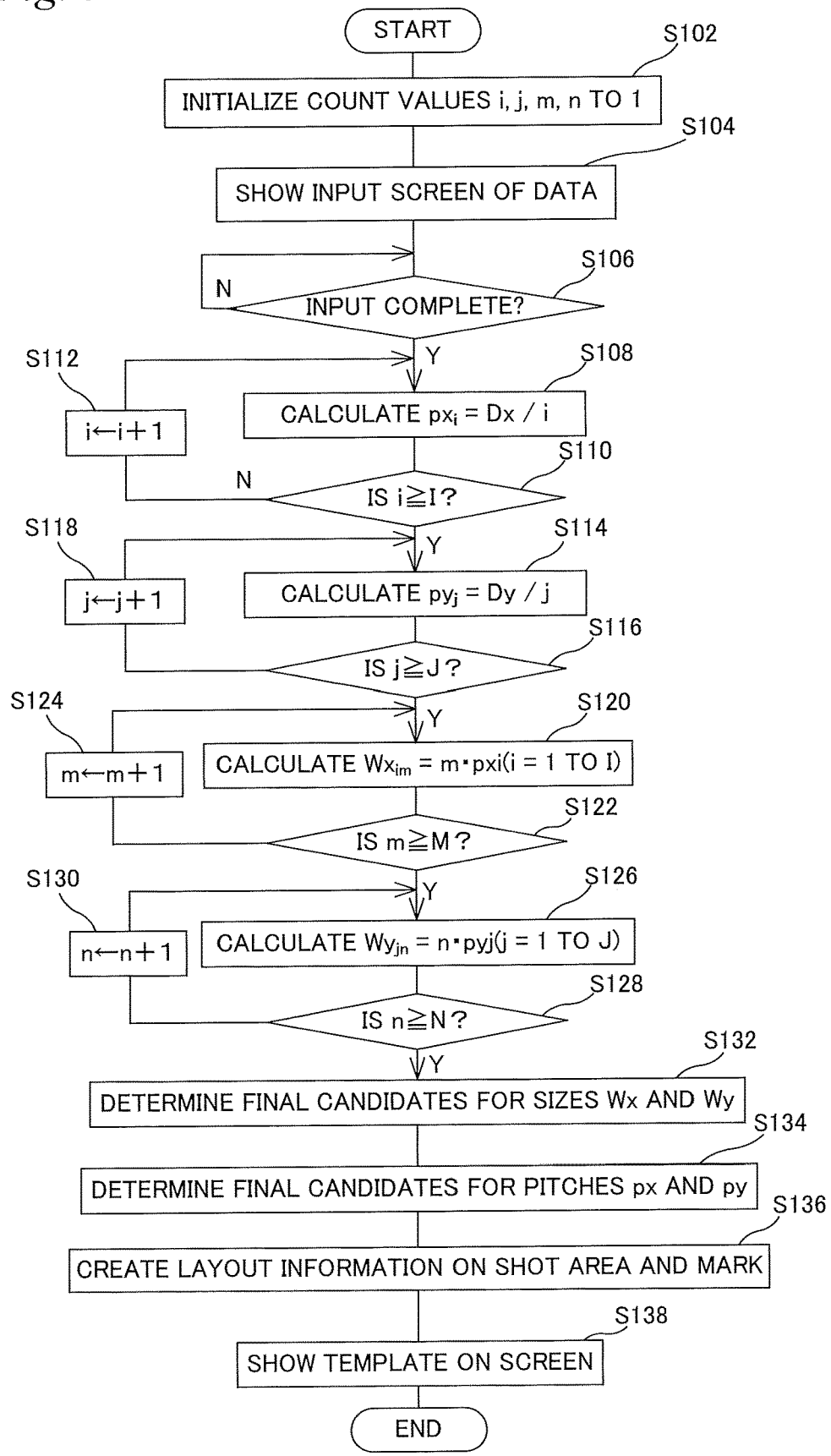
FIG. 5 is a flowchart corresponding to a processing algorithm executed by the determination apparatus.

FIG. 5 shows a flowchart corresponding to a processing algorithm executed by CPU 51. In the description below, description concerning CPU 51 will be omitted, except when especially necessary.

First of all, in step S102, a count value i of the first counter, a count value j of the second counter, a count value m of the third counter, and a count value n of the fourth counter are to be each initialized to 1.

In the next step S104, to encourage input of data on pitch Dx in the X-axis direction and data on pitch Dy in the Y-axis direction of the plurality of detection areas described earlier by a user, the display screen of display device 58 displays an input screen of the data, and then the processing proceeds to step S106 where display device 58 waits for the data to be input by the user. Then, when the data on pitch Dx and the data on pitch Dy are input by the user via input device 57, the processing is to proceed to step S108. Here, for convenience, as the data on pitch Dx, e.g., 39 [mm] is to be input, and as the data on pitch Dy, e.g., 44 [mm] is to be input.

Note that a display to encourage input of premise conditions (e.g., i>m, i>n, or Dx>Wx, Dy>Wy) like the ones described above may be displayed on the screen of display device 58 in step S104, or before step S108.

Also, a display to encourage input of information concerning the size of shot areas (divided areas) SA like the ones described above (e.g., 30>Wx>15, 35>Wy>25) may be displayed on the screen of display device 58 in step S104, or before step S108.

In step S108, $px_i=Dx/i$, which is Dx divided by count value i of the first counter, is calculated as a candidate for pitch px in the X-axis direction of the plurality of marks M arranged on substrate P, and the calculation result is stored in a predetermined storage area within RAM 54. At this time, since i=1, $px_i=Dx/1=Dx$ is calculated as the candidate for pitch px.

In the next step S110, a judgment is made of whether count value i is equal to or more than a value I determined in advance or not. Here, for convenience, I=10 is to be set. At this time, since i=1, the judgment in step S110 is negative, so the processing proceeds to step S112 where count value i is incremented by 1 (i←i+1), and then until the judgment in step S110 is affirmed, processing (including judgment) in a loop of step S108→S110→S112 is repeated. By this processing, as the candidates for pitch px, $px_2=Dx/2$, $px_3=Dx/3, \ldots, px_{10}=Dx/10$ are sequentially calculated, and are stored in a predetermined storage area within RAM 54.

Then, when $px_{10}=Dx/10$ is calculated, the judgment in step S110 is affirmed, and the processing proceeds to step S114. In step S114, $py_j=Dy/j$, which is Dy divided by count value j of the second counter, is calculated as a candidate for pitch py in the Y-axis direction of the plurality of marks M arranged on substrate P, and the calculation result is stored in a predetermined storage area within RAM 54. At this time, since j=1, $py_1=Dy/1=Dy$ is calculated as the candidate for pitch py.

In the next step S116, a judgment is made of whether count value j is equal to or more than a value J determined in advance or not. Here, for convenience, J=10 is to be set. At this time, since j=1, the judgment in step S116 is negative, so the processing proceeds to step S118 where count value j is incremented by 1 (j←j+1), and then until the judgment in step S116 is affirmed, processing (including judgment) in a loop of step S114→S116→S118 is repeated. By this processing, as the candidates for pitch py, $py_2=Dy/2$, $py_3=Dy/3, \ldots, py_{10}=Dy/10$ are sequentially calculated, and are stored in a predetermined storage area within RAM 54.

Then, when $py_{10}=Dy/10$ is calculated, the judgment in step S116 is affirmed, and the processing proceeds to step S120. In step S120, $Wx_{im}=m \cdot px_i$ (i=1 to 10), which is each of the plurality of (10, in this case) candidates $px_i=Dx/i$ (i=1 to 10) calculated and stored in a predetermined storage area within RAM 54 multiplied by count value m of the third counter, is calculated as candidates for size Wx in the X-axis direction of the plurality of shot areas (divided areas) arranged two-dimensionally on substrate P, and after the calculation is stored in a predetermined storage area within RAM 54, the processing proceeds to step S122. At this time, m=1, therefore, $Wx_{i1}=1 \cdot px_i=px_i$ (i=1 to 10) is calculated.

In step S122, a judgment is made of whether count value m of the third counter is equal to or more than a value M determined in advance or not. Here, for convenience, M=10 is to be set. At this time, since m=1, the judgment in step S122 is negative, so the processing proceeds to step S124 where count value m is incremented by 1 (m←m+1), and then until the judgment in step S122 is affirmed, processing (including judgment) in a loop of step S120→S122→S124 is repeated. By this processing, as the candidates for size Wx, $Wx_{im}=m \cdot px_i$ (i=1 to 10, m=2 to 10) is calculated. Here, as is described earlier, i>m can be a premise condition of calculation in the embodiment; therefore, only $Wx_{im}$ that satisfies such premise condition may be calculated.

When judgment in step S122 is positive, then the processing moves to step S126. At the point when the judgment made in step S122 turns positive, within the predetermined storage area of RAM 54, $Wx_{im}=m \cdot px_i$ calculated for i=1 to 10, m=1 to 10, or of these calculations, $Wx_{im}=m \cdot px_i$ calculated for i and m that satisfy i>m, are stored as candidates for size Wx.

In step S126, $Wy_{jn}=n \cdot py_j$ (j=1 to 10), which is each of the plurality of (10, in this case) candidates $py_j=Dy/j$ (j=1 to 10) stored in a predetermined storage area within RAM 54 multiplied by count value n of the fourth counter, is calculated as candidates for size Wy in the Y-axis direction of the plurality of shot areas (divided areas) arranged two-dimensionally on substrate P, and after the calculation is stored in a predetermined storage area within RAM 54, the processing proceeds to step S128. At this time, n=1, therefore, $Wy_{j1}=1 \cdot py_j=py_j$ (j=1 to 10) is calculated.

In the next step S128, a judgment is made of whether count value n is equal to or more than a value N determined in advance or not. Here, for convenience, N=10 is to be set. At this time, since n=1, the judgment in step S128 is negative, so the processing proceeds to step S130 where count value n is incremented by 1 (n←n+1), and then until the judgment in step S128 is affirmed, processing (including judgment) in a loop of step S126→S128→S130 is repeated. By this processing, as the candidates for size Wy, $Wy_{jn}=n \cdot py_j$ (j=1 to 10, n=2 to 10) is calculated. Here, as is described earlier, j>n can be made a premise condition for calculation in the embodiment, therefore, only $Wy_{jn}$ that satisfies such premise condition may be calculated.

When judgment in step S128 is positive, then the processing moves to step S132. At the point when the judgment made in step S128 turns positive, within the predetermined storage area of RAM 54, $Wy_{jn}=n \cdot py_j$ calculated for j=1 to 10, n=1 to 10, or of these calculations, $Wy_{jn}=n \cdot py_j$ calculated for j and n that satisfy j>n are stored as candidates for size Wy.

In step S132, of the candidate $Wx_{im}=m \cdot px_i$ for size Wx and the candidate $Wy_{jn}=n \cdot py_j$ of size Wy stored in a predetermined storage area within RAM 54, only the candidates that satisfy a condition set in advance are decided as a final candidate for size Wx and a final candidate for size Wy. For example, in the case the range of size Wx in the X-axis direction and the range of size Wy in the Y-axis direction of shot area SA are set to 30>Wx>15 and 35>Wy>25, then only candidates $Wx_{im}$ and candidates $Wy_{jn}$ that are within the ranges are to be the final candidates. Note that while there may be a case in which there is a different combination of i and m resulting to be the same $Wx_{im}$ value and a different combination of j and n resulting to be the same $Wy_{jn}$ value, as for both $Wx_{im}$ and $Wy_{jn}$, only one candidate is determined as the final candidate for the same value.

As is described earlier, in the case $Wx_{im}$ and $Wy_{jn}$ are calculated for, e.g., Dx=39, Dy=44, and i=1 to 10, j=1 to 10, m=1 to 10, and n=1 to 10 (and i>m, j>n), an example of the final candidates for Wx and Wy that satisfy the conditions described above of 30>Wx>15 and 35>Wy>25 turn out as in Table 1 described earlier.

In the next step S134, candidates $px_i$ and $py_j$ for pitch px in the X-axis direction and pitch py in the Y-axis direction of the plurality of marks corresponding to the final candidates for Wx and Wy determined in step S132 are determined as the final candidates for pitch px and pitch py. The final candidates for pitch px and pitch py corresponding to the final candidates for Wx and Wy described above turn out as in Table 2 described earlier.

In the next step S136, layout information (template) of mark M is created in which a plurality of marks M are arranged two-dimensionally in the X-axis direction and the Y-axis direction at pitch px and pitch py in shot areas (shot fields) SA of a different size, based on the final candidates for size Wx and size Wy determined in step S132 and the final candidates for pitch px and pitch py determined in step S134.

In the next step S138, the layout information on mark M created in step S136 is displayed on the display screen of display device 58, which completes the series of processing in this routine. In this case, a plurality of, e.g., forty kinds of layout information, is displayed on the display screen, as is shown in FIG. 4. Then, by the user looking at the screen and selecting the template closest to the shot size that the user wishes to produce from the forty kinds of templates (layout information), an optimum layout of the alignment marks corresponding to the shot size can be determined.

Figure 6:
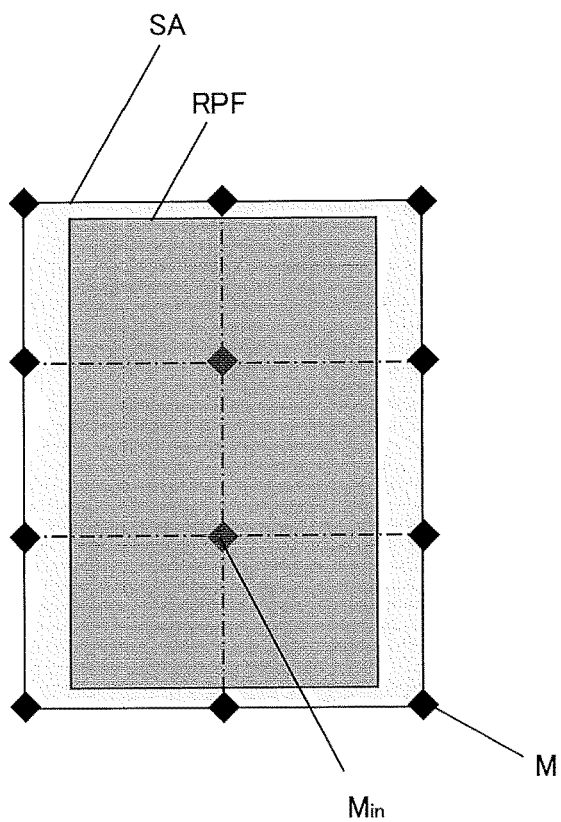
FIG. 6 is a view showing an example of a layout of a shot area and alignment marks when a device pattern (actual pattern field) is arranged in the shot area.

Here, the user may select a template having a shot size as close as possible with a slightly larger shot area to the one that the user wishes to produce from the forty kinds of templates (layout information), and as is shown in FIG. 6, for example, shot area SA and the layout of alignment marks M may be determined so that a device pattern (actual pattern field) RPF is arranged in shot area SA. In this case, as is obvious from FIG. 6, alignment mark (in-die mark) M has to be arranged (formed) within the actual pattern field RPF.

Note that the user can determine the layout of a reticle used in an exposure apparatus, based on the shot size and the layout of the alignment marks. For example, as is shown in FIG. 6, device pattern field RPF and an arrangement on the reticle of a plurality of alignment marks can be determined. Accordingly, it can also be said that to determine the shot size and the alignment marks as is described above is to determine the layout of the reticle.

In the case of performing detection (alignment measurement) of marks with a substrate on which a plurality of marks is arranged according to a determined mark layout in each shot area (shot size Wx, Wy) serving as a detection target, when rotation (θz rotation) of the substrate is adjusted and a certain mark is positioned within one detection area of a plurality of detection areas of the mark detection system (alignment system), another mark is positioned also in the remaining detection areas. Accordingly, it becomes possible to concurrently detect a plurality of marks on the substrate in a plurality of detection areas DA of the mark detection system.

As is obvious from the description so far, in the embodiment, the first calculation section 10 is realized by CPU 51 executing the processing of steps S104 to S118 (including judgment), the second calculation section 12 is realized by CPU 51 executing the processing of steps S120 to S130 (including judgment), the first determination section 14a is realized by CPU 51 executing the processing of step S132, the second determination section 14b is realized by CPU 51 executing the processing of step S134, creation section 16 is realized by CPU 51 executing the processing of step S136, and display section 18 is realized by CPU 51 executing the processing of step S138. However, the embodiment is not limited to this, and each of the sections described above may be structured by hardware including a microprocessor and the like.

Also, in the embodiment, a first calculation means is structured by the first calculation section 10, and a second calculation means is structured by the second calculation section 12. Also, a determination means is structured by determination section 14 including the first determination section 14a and the second determination section 14b. Also, a creation means is structured by creation section 16 and a display means is structured by display section 18.

Modified Example

Figure 7:
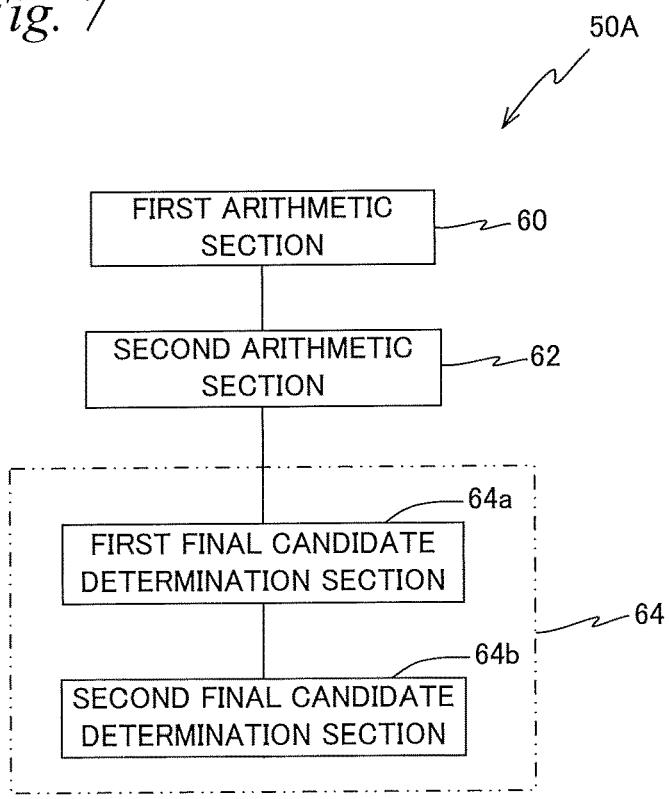
FIG. 7 is a function block diagram of a determination apparatus according to a modified example.

Next, a determination apparatus according to a modified example will be described. FIG. 7 shows a function block diagram of a determination apparatus 50A according to the embodiment. The structure of the hardware of determination apparatus 50 according to the modified example is similar to determination apparatus 50 described earlier. Therefore, for the hardware structure, codes which are the same as the ones described earlier are to be used. Note that in FIG. 7, while creation section 16 and display section 18 are omitted, creation of layout information (templates) and display thereof are performed similarly to determination apparatus 50 in FIG. 2.

Determination apparatus 50A determines an arrangement of two or more K detection areas DA (and detection centers) of a mark detection system (alignment system) used to detect a plurality of marks arranged on the substrate in a predetermined positional relation, along with an arrangement of a plurality of marks, based on a known size of a plurality of shot areas (divided areas) formed on a substrate in a first direction and a second direction crossing each other, such as, for example, being arranged two-dimensionally along an X-axis direction and a Y-axis direction orthogonal to each other.

Determination apparatus 50A is equipped with a first arithmetic section 60, a second arithmetic section 62, and a final candidate determination section 64 including a first final candidate determination section 64a and a second final candidate determination section 64b. Each function part is achieved by each component in the hardware structure described earlier and a program corresponding to a processing algorithm shown in a flowchart to be described later on.

The first arithmetic section 60, in response to input of data on a size Wx in the X-axis direction and data on a size Wy in the Y-axis direction of a shot area (divided area) via input device 57, sequentially calculates (Wx/m), which is size Wx divided by a natural number m (m=1 to M), and (Wy/n), which is size Wy divided by a natural number n (n=1 to N), as a plurality of candidates $px_m$ and $py_n$ for pitch px in the X-axis direction and pitch py in the Y-axis direction of the plurality of marks arranged on the substrate.

Here, for convenience of explanation, calculation of (Wx/m) and (Wy/n) is to be performed as for the case, for example, when m is 1 to 10 (=M) and n is 1 to 10 (=N). Accordingly, $px_m$=Wx/m (m=1 to 10) and $py_n$=Wy/n (n=1 to 10) are to be calculated by the first arithmetic section 60.

The second arithmetic section 62, calculates i·$px_m$ and j·$py_n$, which are the calculated plurality of candidates $px_m$=Wx/m (m=1 to 10) and $py_n$=Wy/n (n=1 to 10) sequentially multiplied by a natural number i (i=1 to I) and a natural number j (j=1 to J), respectively, as candidates for pitch Dx in the Y-axis direction and pitch Dy in the Y-axis direction of the plurality of detection areas arranged in the X-axis direction and the Y-axis direction within an XY plane parallel to a substrate P. Here, calculation of i·$px_m$ and j·$py_n$ is to be performed as for the case, for example, when i is 1 to 10 (=I) and j is 1 to 10 (=J). In this case, by the second arithmetic section 62, i·$px_m$ (i=1 to 10) is calculated for each of $px_m$ (i=1 to 10), and as a consequence, $Dx_{im}$=i·$px_m$(i=1 to 10, m=1 to 10) is calculated as the candidate for pitch Dx. Similarly, by the second arithmetic section 62, j·$py_n$ (j=1 to 10) is calculated for each of $py_n$ (n=1 to 10), and as a consequence, $Dy_{jn}$=j·$py_n$ (j=1 to 10, n=1 to 10) is calculated as the candidate for pitch Dy.

Note that in the case of making the detection center of the plurality of detection areas coincide with a plurality of virtual point arranged in the X-axis direction and the Y-axis direction within the XY plane, the detection center can be calculated as candidates for pitch Dx in the X-axis direction and pitch Dy in the Y-axis direction of the plurality of virtual points.

Here, similarly to the description earlier, the amount of calculation may be reduced by setting large/small relations of i and m, and j and n as premise conditions, and calculating only $Dx_{im}$ and $Dy_{jn}$ that satisfy the premise conditions.

Of the candidate $Dx_{im}$=i·$px_m$ for pitch Dx and the candidate $Dy_{jn}$=j·$py_n$ for pitch Dy calculated above, the first final candidate determination section 14a determines the candidates that satisfy the conditions set in advance as a final candidate for pitch Dx and a final candidate for pitch Dy. For example, in the case Dx<Dy, and 60≥Dx>30, and 60≥Dy>30 are set as the satisfying conditions for pitch Dx and pitch Dy, only candidates $Dx_{im}$ and candidates $Dy_{jn}$ that satisfy the conditions are to be the final candidates. Note that while there may be a case in which there is a different combination of i and m resulting to be the same $Dx_{im}$ value and a different combination of j and n resulting to be the same $Dy_{jn}$ value, as for both $Dx_{im}$ and $Dy_{jn}$, only one candidate is determined as the final candidate for the same value.

As is described earlier, in the case $Dx_{im}$ and $Dy_{jn}$ are calculated, for example, when Wx=26, Wy=33, and i=1 to 10, j=1 to 10, m=1 to 10, and n=1 to 10, the final candidates for Dx and Dy that satisfy the conditions described above are as follows.

TABLE 3

| Final Candidates for Dx | 39 | 52 | |
| Final Candidates for Dy | 44 | 49.5 | 55 |

The second final candidate determination section 64b determines candidates $px_m$ and $py_n$ for pitch px in the X-axis direction and pitch py in the Y-axis direction of the plurality of marks corresponding to the final candidates for Dx and Dy determined at the first final candidate determination section 64a, as the final candidates for pitch px and pitch py. The final candidates for pitch px and pitch py corresponding to each of the final candidates for Dx and Dy described above turn out as follows.

TABLE 4

| Candidates for px | 4.333 | 6.5 | 13 |
| Candidates for py | 5.5 | 11 | |

Information on each of the final candidates that has been determined is stored in a predetermined final candidate storage area in RAM. Accordingly, the user can read the information from the final candidate storage area via input device 57 and determine pitch Dx and pitch Dy by choosing arbitrary information from the information that has been read, and based on such pitch Dx and pitch Dy, can determine positional relation (arrangement) of the center (detection center) of each of the plurality of detection areas DA of the mark detection system (alignment system), along with mark pitches px and py suitable for shot sizes Wx and Wy, that is, a mark layout corresponding to the shot sizes.

While each function part in FIG. 7 modeled as hardware has been described so far, each of the function parts is actually achieved by CPU 51 of determination apparatus 50 executing a predetermined software program. This will be described below, based on FIG. 8.

Figure 8:
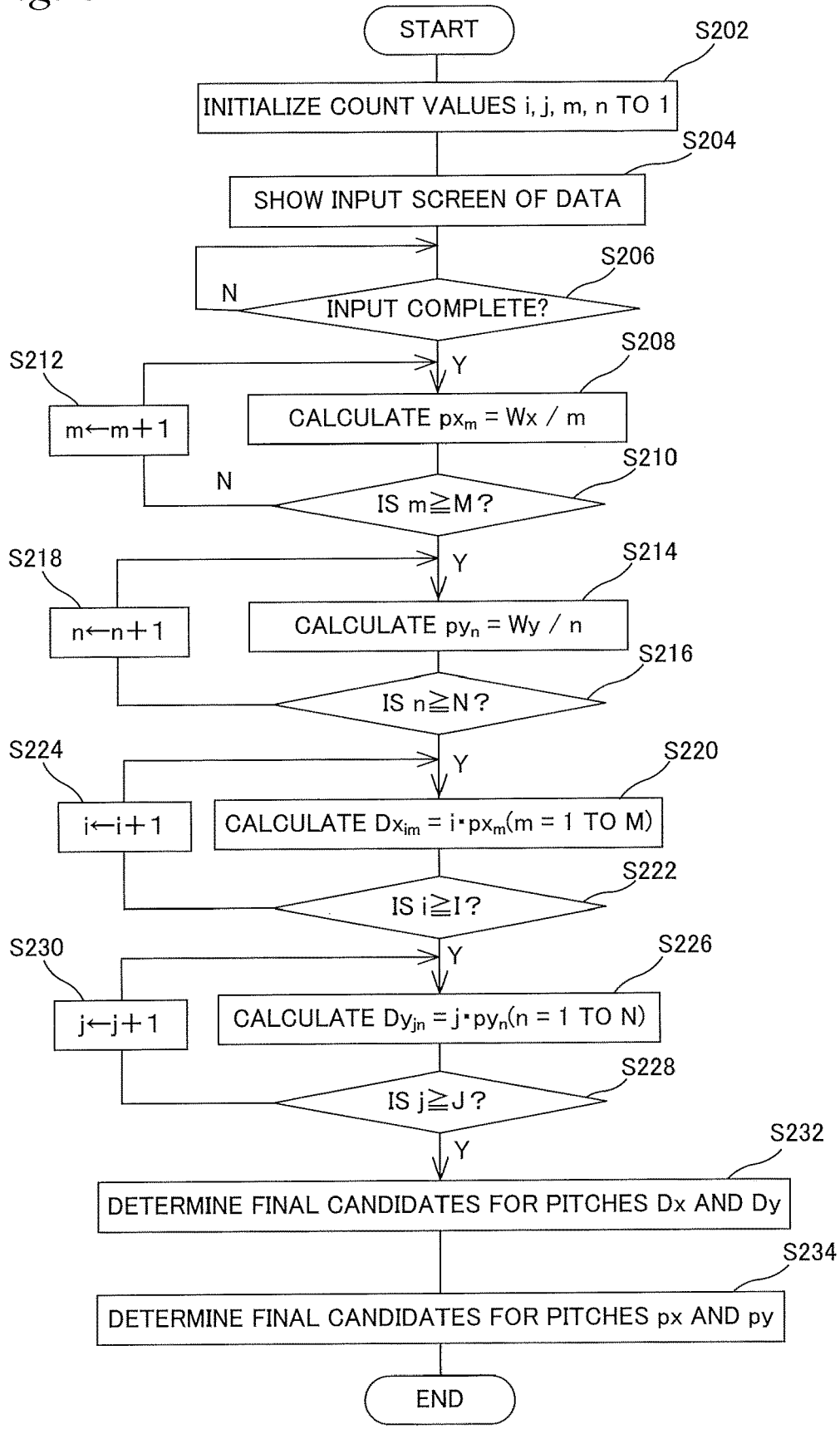
FIG. 8 is a flow chart corresponding to a processing algorithm executed by the determination apparatus according to the modified example.

FIG. 8 shows a flowchart corresponding to a processing algorithm executed by CPU 51. Description concerning CPU 51 will be omitted below, except when especially necessary.

First of all, in step S202, a count value i of the first counter, a count value j of the second counter, a count value m of the third counter, and a count value n of the fourth counter are to be each initialized to 1.

In the next step S204, to encourage input of data on size Wx in the X-axis direction and data on size Wy in the Y-axis direction of the shot area by a user, the display screen of display device 58 displays an input screen of the data, and then the processing proceeds to step S206 where display device 58 waits for the data to be input by the user. Then, when the data on size Wx and the data on size Wy are input by the user via input device 57, the processing is to proceed to step S208. Here, for convenience, as the data on size Wx, e.g., 26 [mm] is to be input, and as the data on size Wy, e.g., 33 [mm] is to be input.

In step S208, $px_m = Wx/m$, which is size Wx divided by count value m of the third counter, is calculated as a candidate for pitch px in the X-axis direction of the plurality of marks M arranged on substrate P, and the calculation result is stored in a predetermined storage area within RAM 54. At this time, since m=1, $px_i = Wx/1 = Wx$ is calculated as the candidate for pitch px.

In the next step S210, a judgment is made of whether count value m is equal to or more than a value M determined in advance or not. Here, for convenience, M=10 is to be set. At this time, since m=1, the judgment in step S210 is negative, so the processing proceeds to step S212 where count value m is incremented by 1 (m←m+1), and then until the judgment in step S210 is affirmed, processing (including judgment) in a loop of step S208→S210→S212 is repeated. By this processing, as the candidates for pitch px, $px_2 = Wx/2$, $px_3 = Wx/3$, ..., $px_{10} = Wx/10$ are sequentially calculated, and are stored in a predetermined storage area within RAM 54.

Then, when $px_{10} = Wx/10$ is calculated, the judgment in step S210 is affirmed, and the processing proceeds to step S214. In step S214, $py_n = Wy/n$, which is size Wy divided by count value n of the fourth counter, is calculated as a candidate for pitch py in the Y-axis direction of the plurality of marks M arranged on substrate P, and the calculation result is stored in a predetermined storage area within RAM 54. At this time, since n=1, $py_1 = Wy/1 = Wy$ is calculated as the candidate for pitch py.

In the next step S216, a judgment is made of whether count value n is equal to or more than a value N determined in advance or not. Here, for convenience, N=10 is to be set. At this time, since n=1, the judgment in step S216 is negative, so the processing proceeds to step S218 where count value n is incremented by 1 (n←n+1), and then until the judgment in step S216 is affirmed, processing (including judgment) in a loop of step S214→S216→S218 is repeated. By this processing, as the candidates for pitch py, $py_2 = Wy/2$, $py_3 = Wy/3$, ..., $py_{10} = Wy/10$ are sequentially calculated, and are stored in a predetermined storage area within RAM 54.

Then, when $py_{10} = Wy/10$ is calculated, the judgment in step S216 is affirmed, and the processing proceeds to step S220. In step S220, $Dx_{im} = i \cdot px_m$ (m=1 to 10), which is each of the plurality of (10, in this case) candidates $px_m = Wx/m$ (m=1 to 10) stored in a predetermined storage area within RAM 54 multiplied by count value i of the first counter, is calculated as candidates for pitch Dx in the X-axis direction of the plurality of virtual points arranged in the X-axis direction and the Y-axis direction within the XY plane parallel to substrate P, and after the calculation is stored in a predetermined storage area within RAM 54, the processing proceeds to step S222. At this time, i=1, therefore, $Dx_{im} = 1 \cdot px_m = px_m$ (m=1 to 10) is calculated.

In step S222, a judgment is made of whether count value i of the first counter is equal to or more than a value I determined in advance or not. Here, for convenience, I=10 is to be set. At this time, since i=1, the judgment in step S222 is negative, so the processing proceeds to step S224 where count value i is incremented by 1 (i←i+1), and then until the judgment in step S222 is affirmed, processing (including judgment) in a loop of step S220→S222→S224 is repeated. By this processing, as the candidates for pitch Dx, $Dx_{im} = i \cdot px_m$ (i=2 to 10, m=1 to 10) is calculated. When judgment in step S222 turns positive, the processing then moves to step S226. At the point when the judgment made in step S222 turns positive, within the predetermined storage area of RAM 54, $Dx_{im} = i \cdot px_m$ (i=1 to 10, m=1 to 10) is stored as candidates for pitch Dx. Here, similarly to the description earlier, large/small relation of i and m may be set as premise conditions, and only $Dx_{im}$ that satisfy the premise conditions may be calculated in step S220.

In step S226, $Dy_{jn} = j \cdot py_n$ (n=1 to 10), which is each of the plurality of (10, in this case) candidates $py_n = Wy/n$ (n=1 to 10) stored in a predetermined storage area within RAM 54 multiplied by count value j of the second counter, is calculated as candidates for pitch Dy in the Y-axis direction of the plurality of virtual points arranged in the X-axis direction and the Y-axis direction within the XY plane parallel to substrate P, and after the calculation is stored in a predetermined storage area within RAM 54, the processing proceeds to step S228. At this time, j=1, therefore, $Dy_{jn} = 1 \cdot py_n = py_n$ (n=1 to 10) is calculated.

In the step S228, a judgment is made of whether count value j is equal to or more than a value J determined in advance or not. Here, for convenience, J=10 is to be set. At this time, since j=1, the judgment in step S228 is negative, so the processing proceeds to step S230 where count value j is incremented by 1 (j←j+1), and then until the judgment in step S228 is affirmed, processing (including judgment) in a loop of step S226→S228→S230 is repeated. By this processing, as the candidates for pitch Dy, $Dy_{jn} = j \cdot py_n$ (j=2 to 10, n=1 to 10) is calculated. When judgment in step S228 turns positive, the processing then moves to step S232. At the point when the judgment made in step S228 turns positive, within the predetermined storage area of RAM 54, $Dy_{jn} = j \cdot py_n$ (j=1 to 10, n=1 to 10) is stored as candidates for pitch Dy. Here, similarly to the description earlier, large/small relation of j and n may be set as premise conditions, and only $Dy_{jn}$ that satisfy the premise conditions may be calculated in step S226.

In step S232, of the candidate $Dx_{im} = i \cdot px_m$ of pitch Dx and the candidate $Dy_{jn} = j \cdot py_n$ of pitch Dy stored in a predetermined storage area within RAM 54, only the candidates that satisfy a condition set in advance are decided as a final candidate for size Wx and a final candidate for size Wy and are stored in the final candidate storage area in RAM. For example, in the case Dx<Dy, and 60≥Dx>30, and 60≥Dy>30 are set as the satisfying conditions for pitch Dx and pitch Dy, only candidates $Dx_{im}$ and candidates $Dy_{jn}$ that satisfy the conditions are to be the final candidates. Note that while there may be a case in which there is a different combination of i and m resulting to be the same $Dx_{im}$ value and a different combination of j and n resulting to be the same $Wy_{jn}$ value, as for both $Dx_{im}$ and $Dy_{jn}$, only one candidate is determined as the final candidate for the same value.

As is described earlier, in the case $Dx_{im}$ and $Dy_{jn}$ are calculated, for example, when Wx=26, Wy=33, and i=1 to 10, j=1 to 10, m=1 to 10, and n=1 to 10, the final candidates for Dx and Dy that satisfy the conditions described above turn out as in Table 3 described earlier.

In the next step S234, candidates $px_m$ and $py_n$ for pitch px in the X-axis direction and pitch py in the Y-axis direction of the plurality of marks corresponding to the final candidates for Dx and Dy determined in step S232 are determined as the final candidates for pitch px and pitch py, and storing the final candidates in the final candidate storage area in RAM completes the series of processing in this routine. The final candidates for pitch px and pitch py corresponding to each of the final candidates for Dx and Dy described above turn out as in Table 4 described earlier.

Accordingly, the user can read the information from the final candidate storage area via input device 57, display the information on the display screen, and choose (determine) pitch Dx and pitch Dy based on the information that has been displayed, and based on such pitch Dx and pitch Dy, can determine positional relation (arrangement) of the center (detection center) of the plurality of detection areas DA of the mark detection system, along with mark pitches px and py suitable for shot sizes Wx and Wy, that is, a mark layout corresponding to the shot sizes.

In the case of performing detection (alignment measurement) of marks with a substrate on which a plurality of marks is arranged according to a determined mark layout in each shot area (shot size Wx, Wy) serving as a detection target, when rotation (θz rotation) of the substrate is adjusted and a certain mark is positioned within one detection area of a plurality of detection areas of the mark detection system, another mark is positioned also in the remaining detection areas. Accordingly, it becomes possible to concurrently detect a plurality of marks on the substrate in a plurality of detection areas DA of the mark detection system.

As is obvious from the description so far, in the modified example, the first arithmetic section 60 is realized by CPU 51 executing the processing of steps S204 to S218 (including judgment), the second arithmetic section 62 is realized by CPU 51 executing the processing of steps S220 to S230 (including judgment), the first final candidate determination section 64a is realized by CPU 51 executing the processing of step S232, and the second final candidate determination section 64b is realized by CPU 51 executing the processing of step S234. However, the embodiment is not limited to this, and each of the sections described above may be structured by hardware including a microprocessor and the like.

Also, in the modified example, a first arithmetic means is structured by the first arithmetic section 60, and a second arithmetic means is structured by the second arithmetic section 62. Also, a determination means is structured by final candidate determination section 64 including the first final candidate determination section 64a and the second final candidate determination section 64b. Also, a means of determination is structured by final candidate determination section 64 including the first final candidate determination section 64a and the second final candidate determination section 64b.

Note that so far, an example of the case has been given in which of the three sets described earlier; arrangement of detection area DA (pitches Dx and Dy), shot sizes Wx and Wy, and arrangement of marks (pitches px and py), when pitches Dx and Dy or shot sizes Wx and Wy are known, the final candidates are to be obtained for the remaining two sets. However, in the case two sets are known of the three sets described above, a determination apparatus may be provided that determines the final candidate for the remaining one set. For example, in the case the arrangement of detection area DA (pitches Dx and Dy) and shot sizes Wx and Wy are known, a determination apparatus may be provided that determines the final candidate for the arrangement (pitches px and py) of the marks. Such a determination apparatus can be easily realized by slightly changing the algorithm corresponding to the flowchart described earlier.

Also, while the final candidates for the two sets or one set of the three sets described above are to be determined in the description above, the determination does not have to be "candidates". That is, the final judgment may be made, not by the user but the determination apparatus.

While determination apparatus 50 according to the embodiment described earlier was equipped with creation section 16 and display section 18 in addition to the first calculation section 10, the second calculation section 12, and determination section 14, the determination apparatus does not necessarily have to be equipped with at least one of creation section 16 and display section 18. This is because if the final candidates for sizes Wx and Wy and the final candidates for pitches px and py are determined, the user can make layout information of marks that are a plurality of alignment marks arranged two-dimensionally in pitch px and pitch py on the shot areas (divided areas) relatively easily, based on these final candidates. As a matter of course, of creation section 16 and display section 18, the determination apparatus may be equipped only with the creation section. This is because as long as the layout information on the shot areas and the marks is created and stored in RAM, the user can read the information via input device 57, and can make the information be displayed on the display screen.

Also, the case has been described so far in which the shot areas and the alignment marks are arranged along two-axis directions that are orthogonal (the X-axis direction and the Y-axis direction) on the substrate. However, the shot areas, the alignment marks and the like arranged may not be limited to the orthogonal two-axis directions, and may also be arranged in two directions intersecting with each other at an angle other than 90 degrees.

Also, the case has been described so far in which the plurality of detection areas of the mark detection system is arranged along two-axis directions that are orthogonal (the X-axis direction and the Y-axis direction) within the XY plane. The plurality of detection areas is not limited to the two-axis directions that are orthogonal, and may be arranged in the two directions that intersect with each other at an angle other than 90 degrees. Note that while the case has been described in which the detection center of the plurality of detection areas of the mark detection system coincides with one of the plurality of virtual points set along the two-axis directions that are orthogonal (the X-axis direction and the Y-axis direction) within the XY plane, the plurality of virtual points is not limited to the two-axis direction that are orthogonal and may be arranged in the two directions that intersect with each other at an angle other than 90 degrees.

Note that the program corresponding to the flowchart (FIG. 5 or 8) described earlier may be stored in a CD-ROM, a DVD-ROM, or in other information recording mediums.

Next, an embodiment of an exposure apparatus will be described, to which a mark detection method can be applied for detecting alignment marks on a wafer (substrate) W where alignment marks M are formed in a plurality of shot areas according to one template selected from a plurality of templates shown on a display screen by determination apparatus 50.

Figure 9:
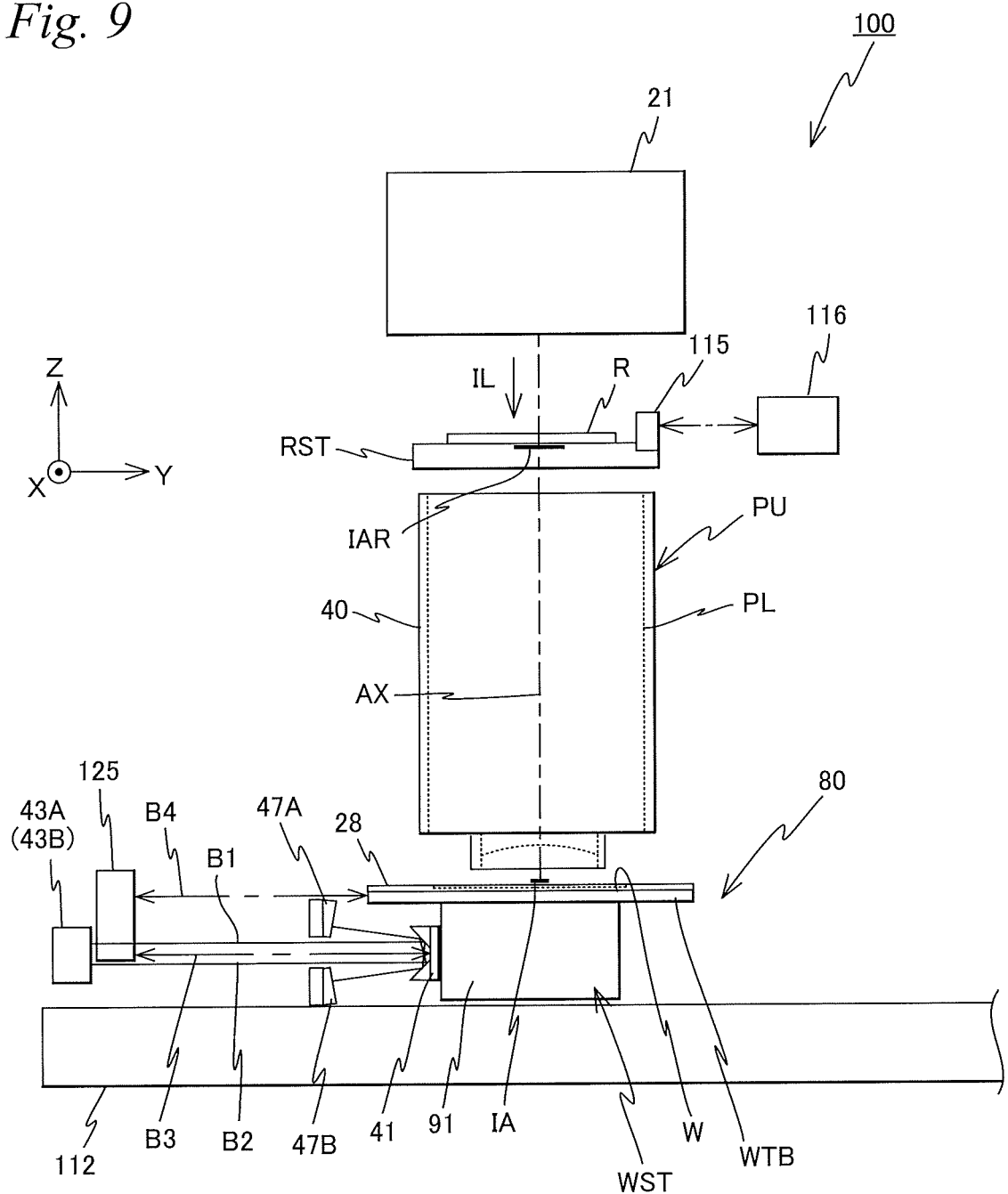
FIG. 9 is a view schematically showing a structure of an exposure apparatus related to an embodiment.

FIG. 9 schematically shows a structure of an exposure apparatus 100 according to an embodiment. Exposure apparatus 100 is a projection exposure apparatus of a step-and-scan method, or a so called scanner. As it will be described later on, exposure apparatus 100 is equipped with a projection optical system PL. In the description below, a direction parallel to an optical axis AX of projection optical system PL will be described as a Z-axis direction, a scanning direction in which a reticle R and a wafer W are relatively scanned within a surface orthogonal to the Z-axis direction will be described as a Y-axis direction, and a direction orthogonal to the Z-axis and the Y-axis will be described as an X-axis direction, and rotation (tilt) directions around the X-axis, the Y-axis, and the Z-axis will be described as θx, θy, and θz directions, respectively.

Exposure apparatus 100 is equipped with an illumination system 21, a reticle stage RST, a projection unit PU, a stage device 80 having a wafer stage WST, and a control system for these parts. In FIG. 9, wafer W is mounted on wafer stage WST.

Illumination system 21 illuminates an illumination area IAR of a slit shape on reticle R set (limited) by a reticle blind (also called a masking system) with an illumination light (exposure light) in an almost uniform illuminance. The structure of illumination system 21 is disclosed in, for example, U.S. Patent Application Publication No. 2003/0025890 and the like. Here, as illumination light IL, an ArF excimer laser beam (wavelength 193 nm) is used as an example.

On reticle stage RST, reticle R that has a circuit pattern or the line formed on a pattern surface (the lower surface in FIG. 9) is fixed, for example, by vacuum chucking. Reticle stage RST, for example, can be finely moved in the XY plane by a reticle stage drive system 81 (not shown in FIG. 9, refer to FIG. 14) including a linear motor or the like, and can also be moved in a scanning direction (the Y-axis direction which is the lateral direction in FIG. 9) at a predetermined scanning speed.

Position information (including rotation information in the θz direction) of reticle stage RST within the XY plane is detected at all times at a resolution of, for example, around 0.25 nm, by a reticle laser interferometer (hereinafter referred to as "reticle interferometer") 116, via a movable mirror 115 (or a reflection mirror formed on an end surface of reticle stage RST). Measurement values of reticle interferometer 116 is sent to a main controller 20 (not shown in FIG. 9, refer to FIG. 14). Note that the position information on reticle stage RST may be measured using an encoder system instead of, or along with reticle interferometer 116.

Projection unit PU is arranged below reticle stage RST in FIG. 9. Projection unit PU includes a barrel 40 and projection optical system PL held within barrel 40. As projection optical system PL, for example, a dioptric system is used consisting of a plurality of optical devices (lens elements) arranged along optical axis AX parallel to the Z-axis direction. Projection optical system PL, for example, is double telecentric, and has a predetermined projection magnification (e.g., ¼ times, ⅕ times, or ⅛ times and the like). Reticle R is arranged so that the pattern surface almost coincides with a first surface (object plane) of projection optical system PL, and wafer W that has a resist (sensitive agent) coated on its surface is arranged on a second surface (image plane) of projection optical system PL. Therefore, when illumination area IAR on reticle R is illuminated with illumination light IL from illumination system 21, illumination light IL that has passed through reticle R forms a reduced image (a reduced image of a part of the circuit pattern) of the circuit pattern of reticle R within illumination area IAR on an area (hereinafter also referred to as an exposure area) conjugate with illumination area IAR, via projection optical system PL. And, by synchronously driving reticle stage RST and wafer stage WST, reticle R is relatively moved in the scanning direction (the Y-axis direction) with respect to illumination area IAR (illumination light IL) and wafer W is relatively moved in the scanning direction (the Y-axis direction) with respect to exposure area IA (illumination light IL) so that scanning exposure of one shot area (divided area) on wafer W is performed, and the pattern of reticle R is transferred onto the shot area.

Stage device 80, as is shown in FIG. 9, is equipped with wafer stage WST arranged on a base board 112, an interferometer system 118 (refer to FIG. 14) which measures position information on wafer stage WST, a stage drive system 124 (refer to FIG. 14) which moves wafer stage WST, and the like.

Wafer stage WST is supported above base board 112 by a non-contact bearing not shown, such as for example, an air bearing or the like, via a clearance (void space, gap) of around several μm. Also, wafer stage WST can be moved in the X-axis direction and the Y-axis direction in predetermined strokes by a drive system including a linear motor, a planar motor or the like, and can also be finely moved in the θz direction.

Figure 14:
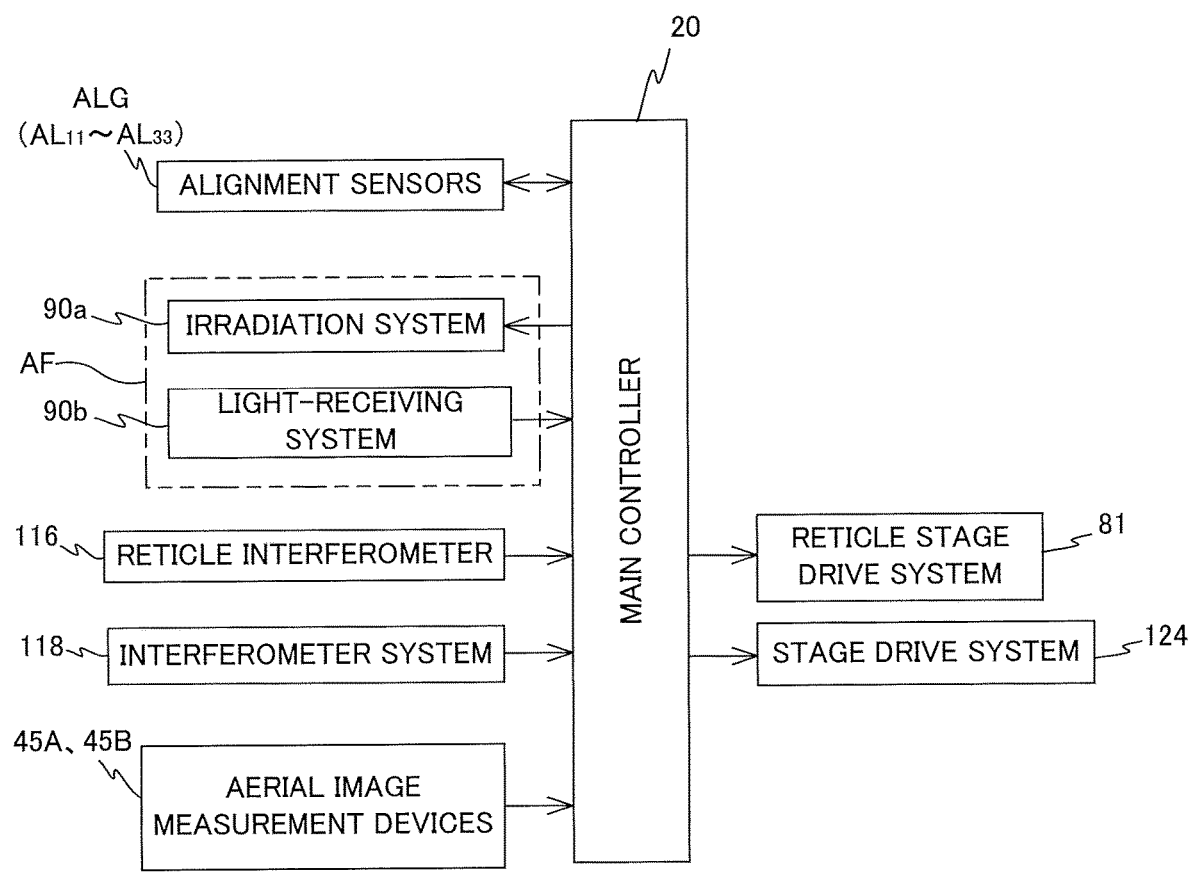
FIG. 14 is a block diagram showing an output relation of a main controller that mainly structures a control system of the exposure apparatus.

Wafer stage WST includes a stage main section 91, and a wafer table WTB mounted on stage main section 91. Wafer table WTB can be finely moved in the Z-axis direction, the θx direction, and the θy direction on stage main section 91 via a Z-leveling mechanism (including a voice coil motor and the like). FIG. 14 shows stage drive system 124, which includes a drive system that drives wafer stage WST and the Z-leveling mechanism. Wafer table WTB can be moved in directions of six degrees of freedom (in each of the X-axis, the Y-axis, the Z-axis, the θx, the θy, and the θz directions) with respect to base board 112 by stage drive system 124. Note that wafer stage WST may be structured movable in directions of six degrees of freedom using, for example, a magnetic levitation type planar motor or the like.

Figure 10:
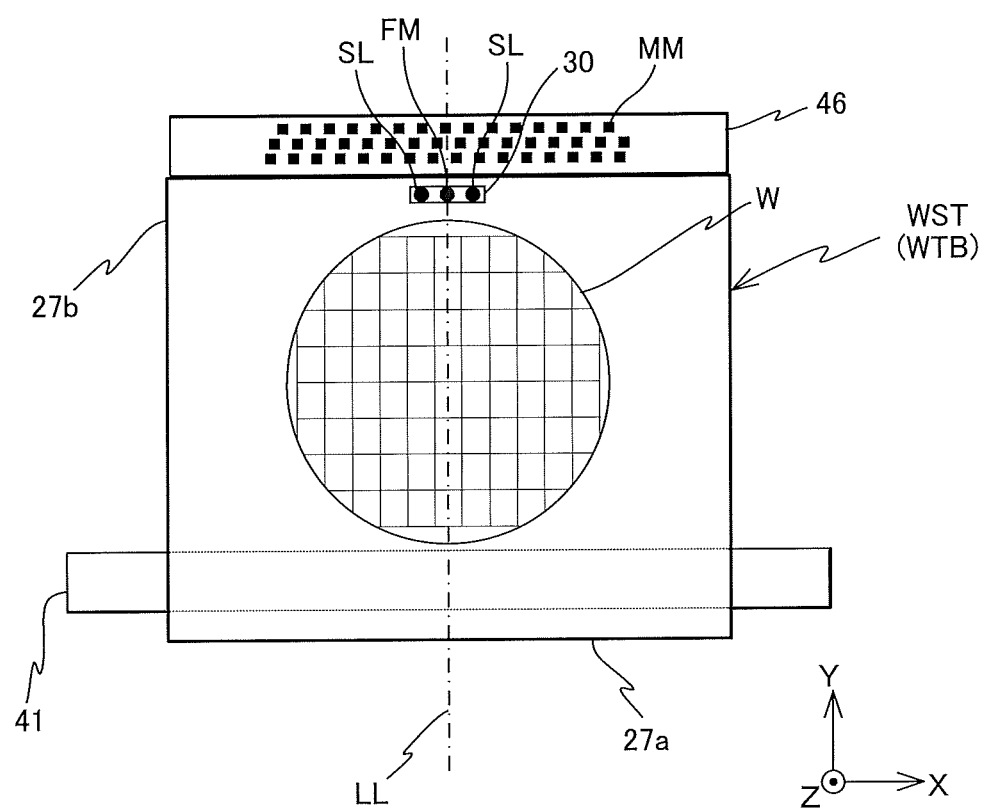
FIG. 10 is a planar view showing a wafer stage.

On the upper surface of wafer table WTB, a wafer holder (not shown) is provided that holds wafer W by vacuum chucking or the like. As is shown in FIG. 10, a measurement plate 30 is provided on the +Y side of the wafer holder (wafer W) on the upper surface of wafer table WTB. On this measurement plate 30, a fiducial mark FM is provided and on both sides in the X-axis direction of fiducial mark FM, a pair of aerial image measurement slit plates is provided. In each of the aerial image measurement slit plates SL, although it is omitted in the drawings, a linear opening pattern (X slit) of a predetermined width (e.g., 0.2 μm) whose longitudinal direction is in the Y-axis direction and a linear opening pattern (Y slit) of a predetermined width (e.g., 0.2 μm) whose longitudinal direction is in the X-axis direction are formed.

Then, corresponding to each of the aerial image measurement slit plates SL, an optical system including a lens and the like and a light receiving element such as a photomultiplier tube (photomultiplier tube (PMT)) are arranged inside wafer table WTB, and by the pair of aerial image measurement slit plates SL and the corresponding optical system and light receiving element, a pair of aerial image measurement devices 45A and 45B (refer to FIG. 14) is structured similarly to the one disclosed in, for example, U.S. Patent Application Publication No. 2002/0041377 and the like. Measurement results (output signals of the light receiving element) of aerial image measurement devices 45A and 45B, to which a predetermined signal processing is applied by a signal processor (not shown), is sent to main controller 20 (refer to FIG. 14). Note that the light receiving elements of aerial image measurement devices 45A and 45B may be provided not inside wafer table WTB, but in another member (such as in a component). Also, a part of the optical system of aerial image measurement devices 45A and 45B may be provided not inside wafer table WTB, but in another member.

On the −Y end surface and the −X end surface of wafer table WTB, as is shown in FIG. 10, a reflection surface 27a and a reflection surface 27b are formed which are used in interferometer system 118.

Also, to the surface on the +Y side of wafer table WTB, as is shown in FIG. 10, a fiducial bar (hereinafter shortly referred to as an "FD bar") 46 is attached extending in the X-axis direction, similarly to the CD bar disclosed in, for example, U.S. Pat. No. 8,054,472. On the upper surface of FD bar 46, a plurality of fiducial marks MM is formed. As each fiducial mark MM, a two-dimensional mark having a size that can be detected by an alignment system to be described later on is used. Note that code LL shows a center line in the X-axis direction of wafer table WTB.

Figure 12:
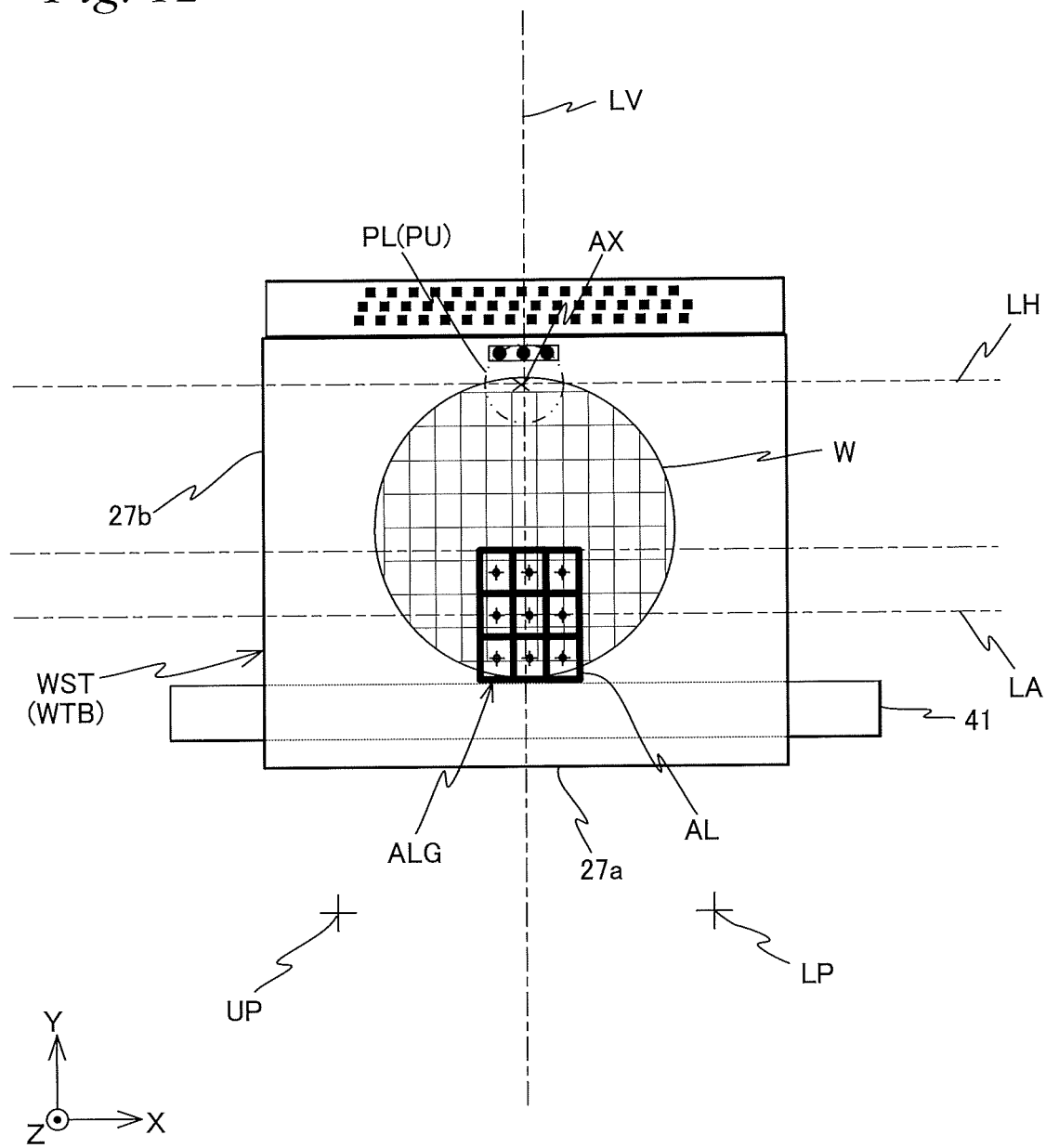
FIG. 12 is a planar view showing an alignment system that the exposure apparatus in FIG. 9 is equipped with, along with a wafer stage.

In exposure apparatus 100, as is shown in FIG. 12, an alignment system ALG is arranged at a position a predetermined distance away to the −Y side from projection optical system PL. Alignment system ALG has nine alignment sensors AL (corresponding to column CA described earlier) arranged in a matrix of three rows and three columns with the X-axis direction serving as the row direction (one row horizontally) and the Y-axis direction serving as the column direction (one row vertically). In the description below, for identification, these alignment sensors are to be written as $AL_{11}, AL_{12}, AL_{13}, AL_{21}, AL_{22}, AL_{23}, AL_{31}, AL_{32}$, and $AL_{33}$ (refer to FIG. 13).

Figure 13:
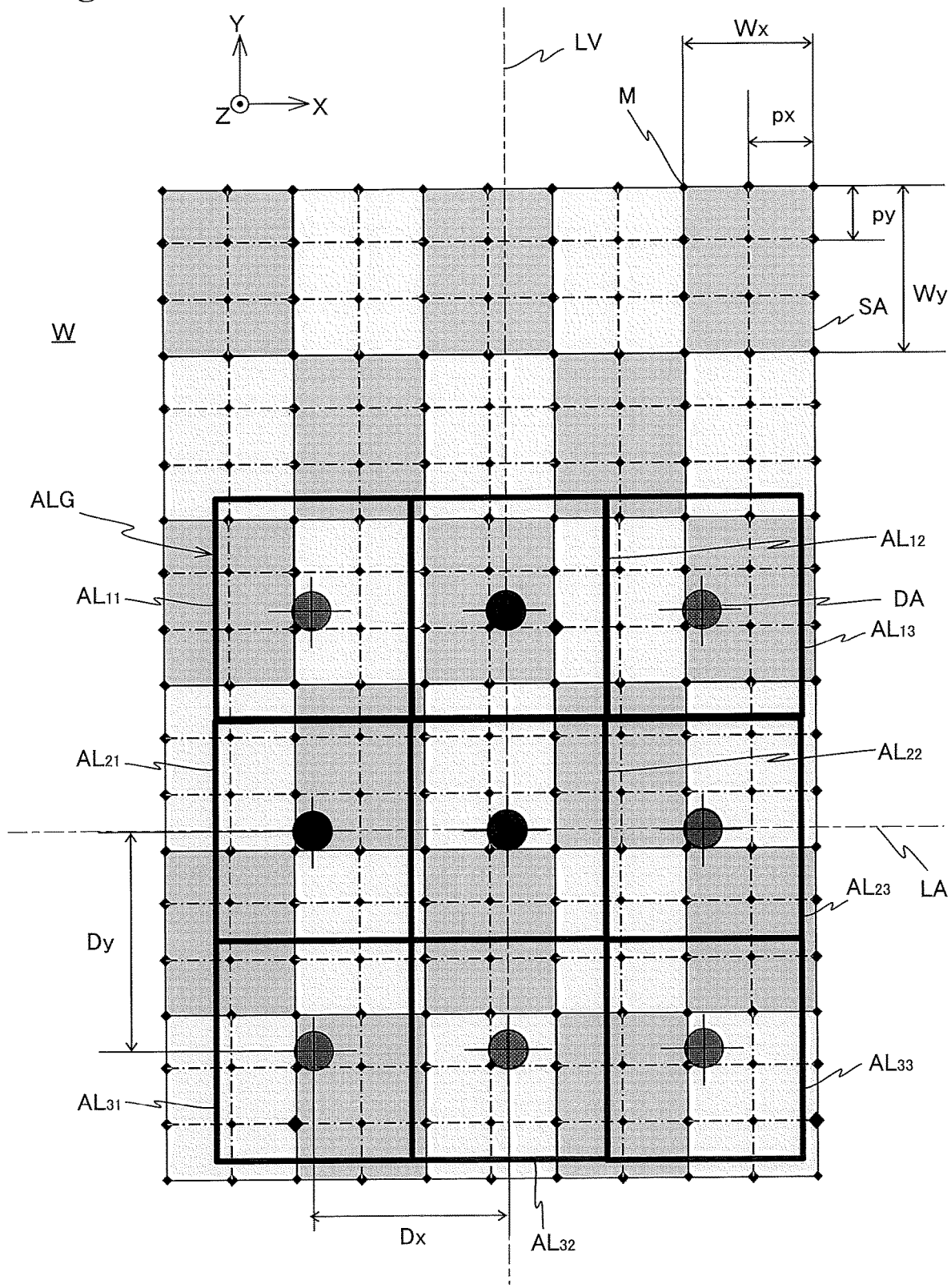
FIG. 13 is a planar view showing the alignment system taken out, along with a plurality of shot areas on a wafer.

Of the nine alignment sensors $AL_{11}$ to $AL_{33}$, detection center of alignment sensor $AL_{22}$ positioned in the center is at a position a predetermined distance away to the −Y side from optical axis AX, on a straight line (hereinafter called a reference axis) LV, which is parallel to the Y-axis and passes through optical axis AX of projection optical system PL. As is shown in FIG. 13, on one side and the other side in the X-axis direction with alignment sensor $AL_{22}$ in between, alignment sensors $AL_{21}$ and $AL_{23}$ are provided whose detection centers are arranged almost symmetrically to reference axis LV. The detection center of alignment sensor $AL_{22}$ is positioned on a straight line (hereinafter called a reference axis) LA in the X-axis direction. On one side and the other side in the Y-axis direction with alignment sensor $AL_{22}$ in between, alignment sensors $AL_{12}$ and $AL_{32}$ are provided whose detection centers are arranged almost symmetrically to reference axis LA. On one side and the other side in the X-axis direction with alignment sensor $AL_{12}$ in between, alignment sensors $AL_{11}$ and $AL_{13}$ are provided whose detection centers are arranged almost symmetrically to reference axis LV. On one side and the other side in the X-axis direction with alignment sensor $AL_{32}$ in between, alignment sensors $AL_{31}$ and $AL_{33}$ are provided whose detection centers are arranged almost symmetrically to reference axis LV. Detection centers of alignment sensors $AL_{11}$ and $AL_{13}$ and detection centers of alignment sensors $AL_{31}$ and $AL_{33}$ are arranged symmetrically to reference axis LA. In the embodiment, each of the detection centers (center of detection area DA) of the nine alignment sensors $AL_{11}$ to $AL_{33}$ are arranged two-dimensionally in the X-axis direction and the Y-axis direction orthogonal to each other within the XY plane. In the embodiment, the detection centers of alignment sensors $AL_{11}, AL_{12}$, and $AL_{13}$ are arranged at a predetermined space (pitch) Dx in the X-axis direction, the detection centers of alignment sensors $AL_{21}, AL_{22}$, and $AL_{23}$ are arranged at a predetermined space (pitch) Dx in the X-axis direction, and the detection centers of alignment sensors $AL_{31}, AL_{32}$, and $AL_{33}$ are arranged at a predetermined space (pitch) Dx in the X-axis direction. Also, the detection centers of alignment sensors $AL_{11}, AL_{21}$, and $AL_{31}$ are arranged at a predetermined space (pitch) Dy in the Y-axis direction, the detection centers of alignment sensors $AL_{12}, AL_{22}$, and $AL_{32}$ are arranged at a predetermined space (pitch) Dy in the Y-axis direction, and the detection centers of alignment sensors $AL_{13}, AL_{23}$, and $AL_{33}$ are arranged at a predetermined space (pitch) Dy in the X-axis direction. In the embodiment, the detection centers (center of detection area DA) of each of the nine alignment sensors $AL_{11}$ to $AL_{33}$ coincide with nine points of a plurality of virtual points arranged two-dimensionally in the X-axis direction and the Y-axis direction orthogonal to each other in the XY plane. Alignment system ALG (the nine alignment sensors $AL_{11}$ to $AL_{33}$) is fixed to a lower surface of a main frame not shown. Note that the detection center can also be called a detection position.

Note that detection area (detection center) of alignment sensor $AL_{22}$ ($Al_{12}, AL_{32}$) does not have to be arranged on reference axis LV that passes through optical axis AX of the projection optical system.

As each alignment sensor $AL_{11}$ to $AL_{33}$, for example, an FIA (Field Image Alignment) system of an image processing method is used. Imaging signals from each alignment sensor $AL_{11}$ to $AL_{33}$ are supplied (refer to FIG. 14) to main controller 20 via a signal processing system not shown.

Here, positional relation between a plurality of detection centers (detection center of each of a plurality of alignment sensors) of alignment system ALG, size of each of a plurality of shot areas SA formed on wafer W, layout of mark M with respect to each shot area and the like are to be described, based on FIG. 13.

The plurality of shot areas SA is formed in an arrangement of a matrix shape on wafer W with the X-axis direction and the Y-axis direction serving as a row direction (one row horizontally, that is, a direction in which a column proceeds) and a column direction (one row vertically, that is, a direction in which a row proceeds).

In the embodiment, of the forty kinds of layout information (templates) described earlier, layout information (template) is selected in which mark M is arranged in each of the shot areas SA whose size Wy in the Y-axis direction is 33.00 mm and size Wx in the X-axis direction is 26.00 mm, at a total of twelve points corresponding to the four corners of each divided area when shot area SA is divided into six sections in a matrix of three rows and two columns, and according to this layout information, on wafer W, a plurality of shot areas SA and marks M are formed on wafer W.

Of alignment sensors $AL_{11}$ to $AL_{33}$, distance in the X-axis direction between detection centers of alignment sensors $AL_{ij}$ and $AL_{i(j+1)}$ (i is either 1, 2, or 3, j is 1 or 2) adjacent in the X-axis direction, that is, pitch Dx in the X-axis direction between detection centers, is 39 mm, and of alignment sensors $AL_{11}$ to $AL_{33}$, distance in the Y-axis direction between detection centers of alignment sensors $AL_{ij}$ and $AL_{(i+1)j}$ (i is 1 or 2, j is either 1, 2, or 3) adjacent in the Y-axis direction, that is, pitch Dy in the Y-axis direction between detection centers, is 44 mm.

In this case the space between marks M adjacent in the X-axis direction, that is, pitch px in the X-axis direction of mark M is, Wx/2=26.00/2=13.00 (mm), and the space between marks M adjacent in the Y-axis direction, that is, pitch py in the Y-axis direction of mark M is, Wy/3=33.00/3=11.00.

Also, Dx/3=13.00, and Dy/4=11.00.

Accordingly, the following relations hold between pitch px, pitch Dx, and size Wx, and between pitch px, pitch Dy, and size Wy.

$$px=Dx/3=Wx/2 \quad (1)$$

$$py=Dy/4=Wy/3 \quad (2)$$

Since the formulas (1) and (2) are valid, in a state where rotation in the θz direction of wafer W with respect to alignment system ALG is adjusted (a state in which direction of each shot area coincides with direction of each alignment sensor $AL_{ij}$), as is obvious from FIG. 13, positional relation between detection center (center of detection area DA) and mark M is the same in any of the alignment sensors.

Figure 11:
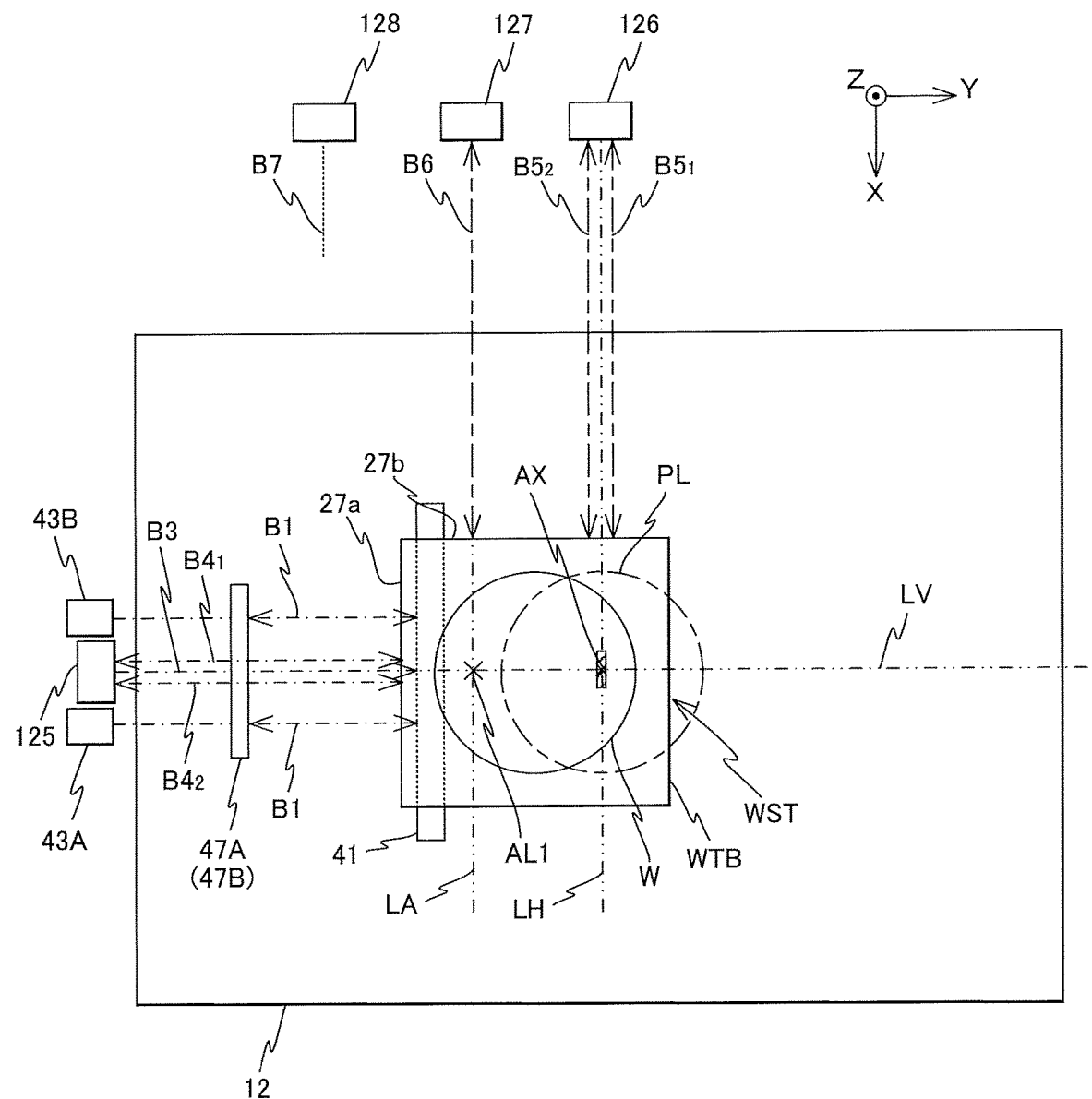

Interferometer system 118 is equipped with a Y interferometer 125 that measures position of wafer stage WST within the XY plane by irradiating an interference light (measurement beam) on reflection surface 27a and receiving a reflection light from reflection surface 27a, and three X interferometers 126 to 128 that each irradiate an interference light (measurement beam) on reflection surface 27b and receive a reflection light from reflection surface 27b, as is shown in FIG. 11.

To describe this more in detail, as is shown in FIG. 11, Y interferometer 125 irradiates reflection surface 27a and a movable mirror 41 with at least three measurement beams parallel to the Y-axis including a pair of measurement beams $B4_1$ and $B4_2$ symmetric to reference axis LV. Also, X interferometer 126 irradiates reflection surface 27b with at least three measurement beams parallel to the X-axis including a pair of measurement beams $B5_1$ and $B5_2$ symmetric to a straight line (hereinafter called a reference axis) LH orthogonal to optical axis AX and reference axis LV. Also, X interferometer 127 irradiates reflection surface 27b with at least two measurement beams parallel to the X-axis including a measurement beam B6 whose measurement axis is reference axis LA. Also, X interferometer 128 irradiates reflection surface 27b with a measurement beam B7 parallel to the X-axis.

Position information from each interferometer described above of interferometer system 118 is sent to main controller 20. Main controller 20, in addition to the X and Y positions of wafer table WTB (wafer stage WST), can also calculate rotation in the θx direction (that is, pitching), rotation in the θy direction (that is, rolling), and rotation in the θz direction (that is, yawing) of wafer table WTB, based on measurement results of Y interferometer 125 and X interferometer 126 or 127.

Also, as is shown in FIG. 9, on a side surface at the −Y side of stage main section 91, movable mirror 41 is attached that has a concave-shaped reflection surface. Movable mirror 41, as it can be seen from FIG. 10, has its length in the X-axis direction designed longer than reflection surface 27a of wafer table WTB.

Interferometer system 118 (refer to FIG. 14) is further equipped with a pair of Z interferometers 43A and 43B (refer to FIGS. 9 and 11) arranged facing movable mirror 41. Z interferometers 43A and 43B each irradiates movable mirror 41 with two measurement beams B1 and B2 parallel to the Y-axis, and then irradiates fixed mirrors 47A and 47B fixed to a frame (not shown) supporting, for example, projection unit PU, with each of the measurement beams B1 and B2 via movable mirror 41. Then, optical path lengths of measurement beams B1 and B2 are measured, by receiving each of the reflection lights. By the measurement results, main controller 20 calculates position of wafer stage WST in directions of four degrees of freedom (Y, Z, θy, and θz).

Note that instead of interferometer system 118, or along with interferometer system 118, an encoder system may be used to measure all position information on wafer stage WST (wafer table WTB). Note that in FIG. 12, reference code UP indicates an unloading position where unloading of a wafer on wafer stage WST is performed, and reference code LP indicates a loading position where loading of a new wafer on wafer stage WST is performed.

Other than this, in exposure apparatus 100 of the embodiment, a multi-point focal point detection system (hereinafter to be shortly referred to as a "multi-point AF system") AF is provided, consisting of an irradiation system 90a and a light-receiving system 90b used to detect a Z position of the wafer W surface at multiple detection points. As multi-point AF system AF, a multi-point AF system of an oblique incidence method is employed whose structure is similar to the one disclosed in, for example, U.S. Pat. No. 5,448,332. Note that irradiation system 90a and light-receiving system 90b of multi-point AF system AF may be arranged near alignment system ALG as is disclosed in, for example, U.S. Pat. No. 8,054,472 and the like, so that position information (surface position information) in the Z-axis direction may be measured (perform focus mapping) for almost the entire surface of wafer W at the time of wafer alignment. In this case, it is desirable to provide a surface position measurement system that measures the Z position of wafer table WTB during this focus mapping.

FIG. 14 shows a block diagram of an output relation of controller 20 which mainly structures a control system of exposure apparatus 100. Man controller 20 consists of a microcomputer (or a workstation), and has overall control over the entire exposure apparatus 100.

In exposure apparatus 100 structured in the manner described above, a series of processing using wafer stage WST is executed by main controller 20, according to a procedure similar to the procedure disclosed in an embodiment in, for example, U.S. Pat. No. 8,054,472, (however, since exposure apparatus 100 is not equipped with an encoder system, processing related to the encoder system is not included), such as unloading of wafer W at unloading position UP (refer to FIG. 12), loading of a new wafer W onto wafer table WTB at loading position LP (refer to FIG. 12), a first half processing of base line measurement (check) of alignment sensor $AL_{22}$ using fiducial mark FM of measurement plate 30 and a predetermined alignment sensor (here, to be alignment sensor $AL_{22}$), resetting (reset) the origin of interferometer system 118, alignment measurement of wafer W using alignment sensors $AL_{11}$ to $AL_{33}$, a second half processing of base line measurement (check) of alignment sensor $AL_{22}$ using aerial image measurement devices 45A and 45B, exposure of a plurality of shot areas on wafer W by a step-and-scan method, based on position information on each shot area on the wafer obtained by results of the alignment measurement and the latest base line of alignment system ALG (alignment sensors $AL_{11}$ to $AL_{33}$), and the like.

Figure 15:
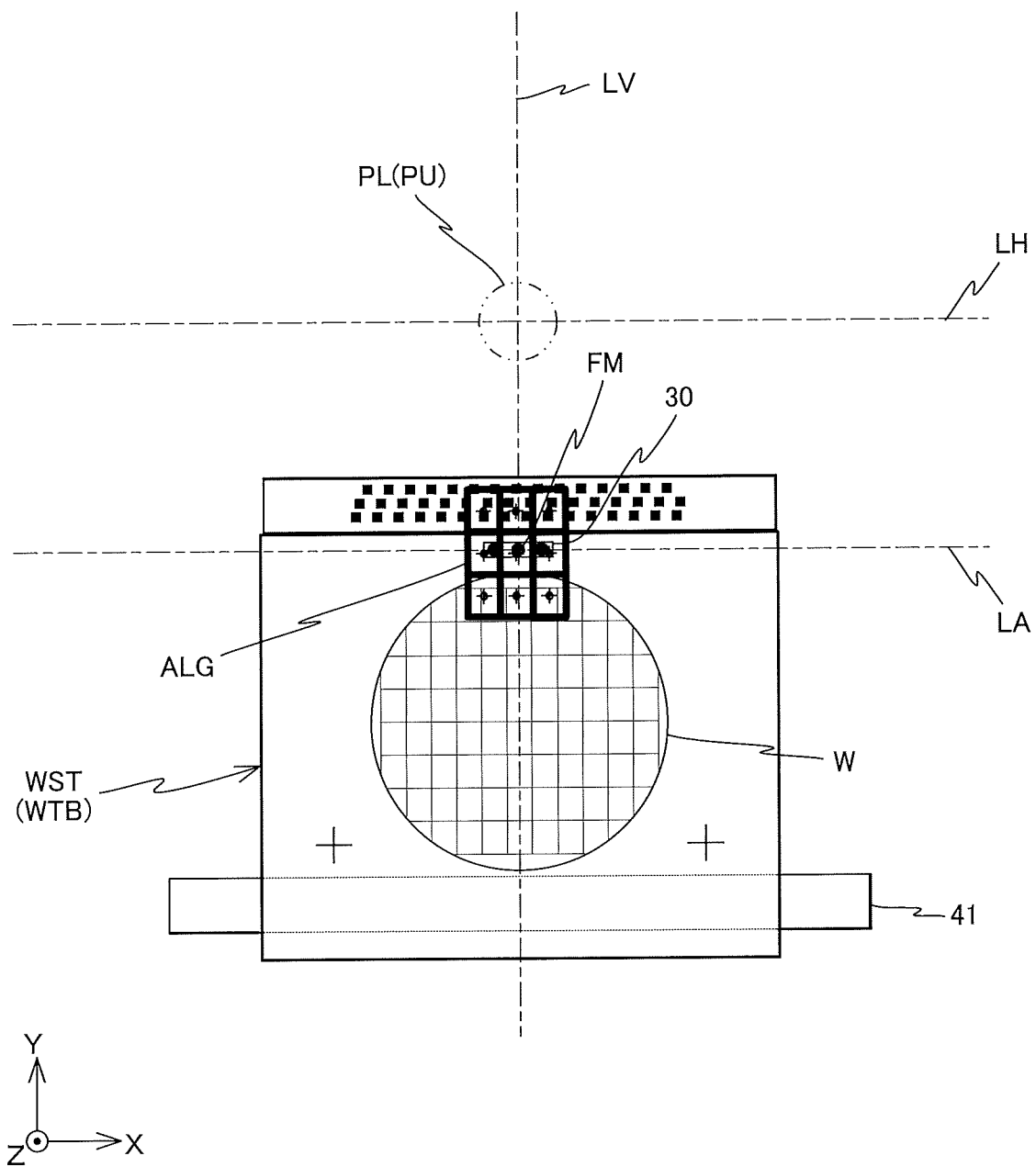
FIG. 15 is a view (No. 1) used to explain an alignment measurement (and base line check of the alignment system) using the alignment system.

Here, alignment measurement of wafer W (and base line check of the alignment system) using alignment system ALG (alignment sensors $AL_{11}$ to $AL_{33}$) will be described. After loading of wafer W, main controller 20, as is shown in FIG. 15, moves wafer stage WST to a position (that is, a position where the first half processing of base line measurement of alignment sensor $AL_{22}$ is performed) where fiducial mark FM on measurement plate 30 is positioned within a detection field (detection area DA) of alignment sensor $AL_{22}$. On this operation, main controller 20 moves (performs position control of) wafer stage WST while measuring position information on wafer table WTB (wafer stage WST) within the XY plane, using Y interferometer 125 and X interferometer 127 of interferometer system 118. Then, main controller 20 performs the first half processing of base line measurement of alignment sensor $AL_{22}$ in which fiducial marks FM are detected using alignment sensor $AL_{22}$.

Figure 16:
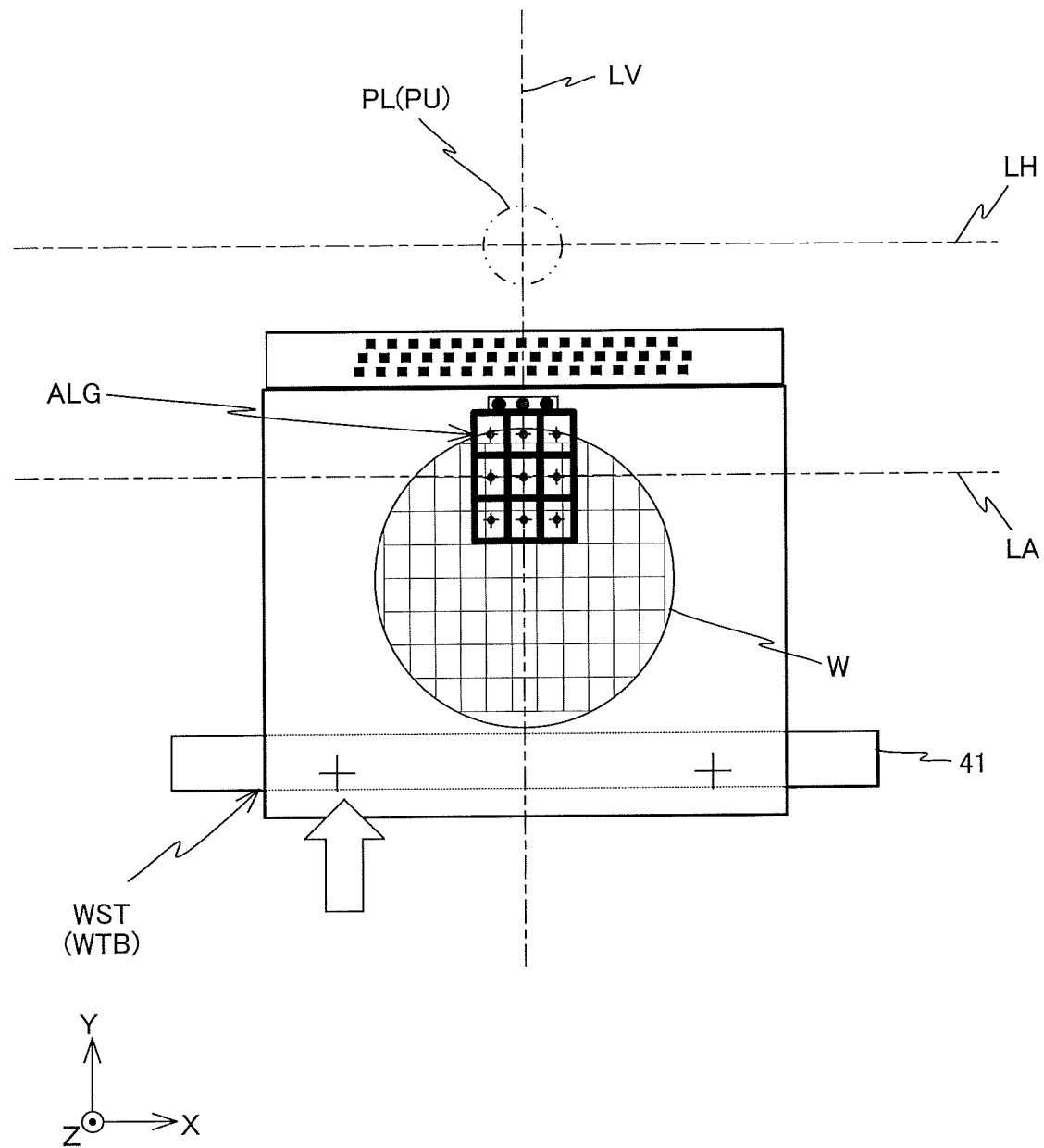
FIG. 16 is a view (No. 2) used to explain an alignment measurement (and base line check of the alignment system) using the alignment system.

Next, as is shown in FIG. 16, main controller 20 moves wafer stage WST in an outlined arrow direction (+Y direction). Then, main controller 20, as is shown in FIG. 16, detects alignment marks M arranged in at least nine first alignment shot areas, using all nine alignment sensors $AL_{11}$ to $AL_{33}$. This detection of the alignment marks arranged in the first alignment shot areas is actually performed in the following manner by main controller 20.

First of all, main controller 20 individually detects alignment mark M located in each of the detection fields concurrently, using the nine alignment sensors $AL_{11}$ to $AL_{33}$. On this operation, main controller 20 executes concurrent detection of alignment marks using alignment sensors $AL_{11}$ to $AL_{33}$, in a state controlling an auto-focus function that each of the alignment sensors $AL_{11}$ to $AL_{33}$ has, so that alignment mark M which is the detection target coincides with (the surface of wafer W coincides with) the focal position of the optical system that each of the alignment sensors $AL_{11}$ to $AL_{33}$ has.

Note that instead of controlling the auto-focus function of each alignment sensor described above, focus-leveling control of wafer W (position control of the Z position, and the θx and the θy directions), or focus control (control of the Z position) may be performed so that the alignment mark which is the detection target coincides with (the surface of wafer W coincides with) the focal position of the optical system that each of the alignment sensors has. In this case, main controller 20 may divide the nine alignment sensors into three sets consisting of three alignment sensors whose detection centers are not on the same straight line, and by sequentially using the alignment sensors in each set, may perform detection of alignment marks concurrently with each of the three alignment sensors. For example, sets such as alignment sensors ($AL_{11}$, $AL_{13}$, $AL_{32}$), alignment sensors ($AL_{12}$, $AL_{21}$, $AL_{23}$), and alignment sensors ($AL_{22}$, $AL_{31}$, $AL_{33}$) may be considered.

Then, main controller 20 associates detection results ((X, Y) coordinate values of each alignment mark when the detection center serves as the origin) of the nine alignment sensors $AL_{11}$ to $AL_{33}$ with position information (that is, X, Y, and θz positions of wafer table WTB) of Y interferometer 125 and X interferometer 127 of interferometer system 118 at the time of each detection, and stores the information in an internal memory.

Figure 17:
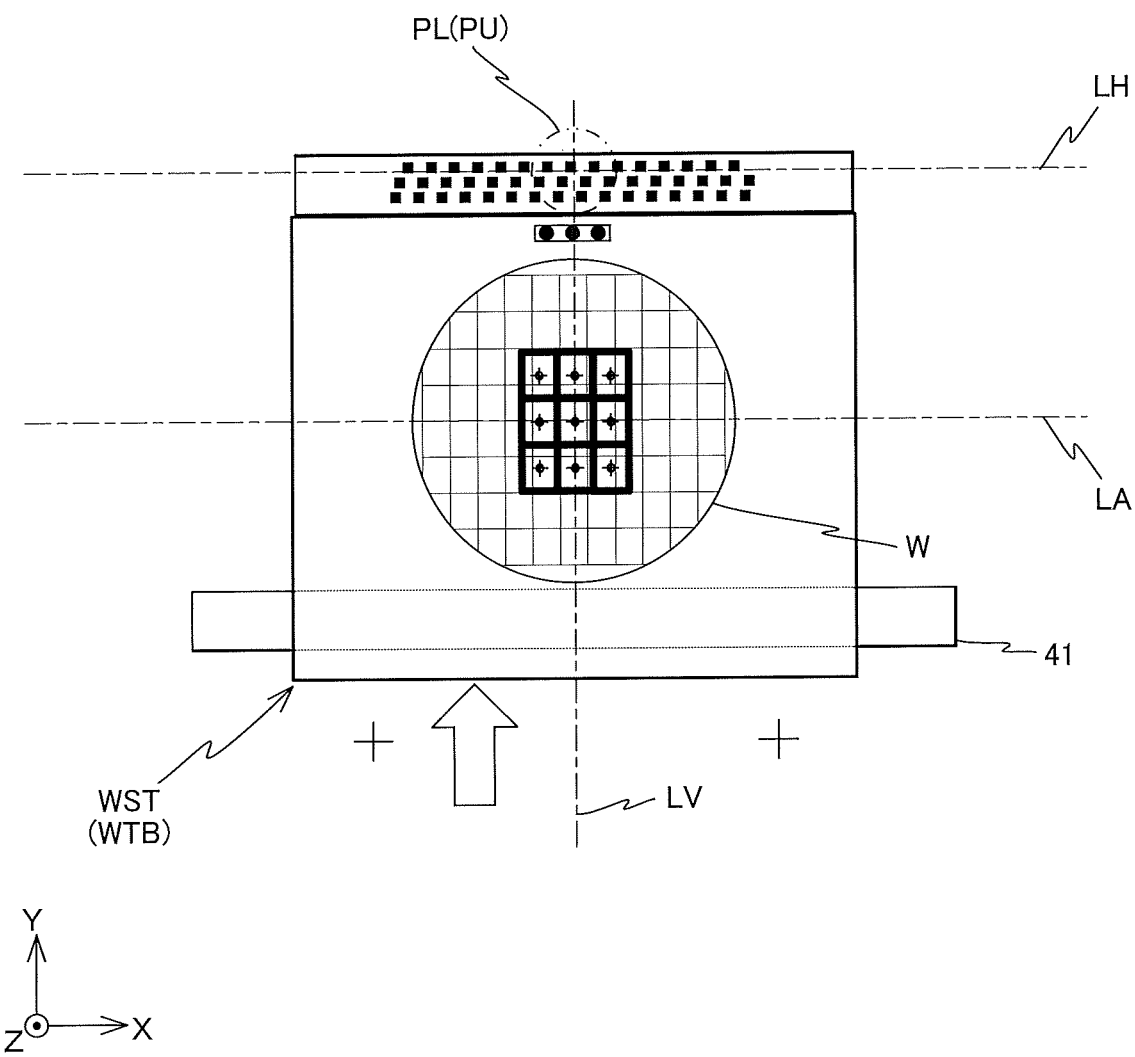
FIG. 17 is a view (No. 3) used to explain an alignment measurement (and base line check of the alignment system) using the alignment system.

When detection described above of the alignment marks arranged in the first alignment shot area is completed, main controller 20 moves wafer stage WST in an outlined arrow direction (+Y direction) by a predetermined distance, as is shown in FIG. 17. Then, main controller 20, as is shown in FIG. 17, detects the alignment marks arranged in at least nine second alignment shot areas, using the nine alignment sensors $AL_{11}$ to $AL_{33}$. This detection of alignment marks arranged in the second alignment shot areas is performed by main controller 20 in a manner similar to that of the detection of alignment marks arranged in the first alignment area described earlier.

Figure 18:
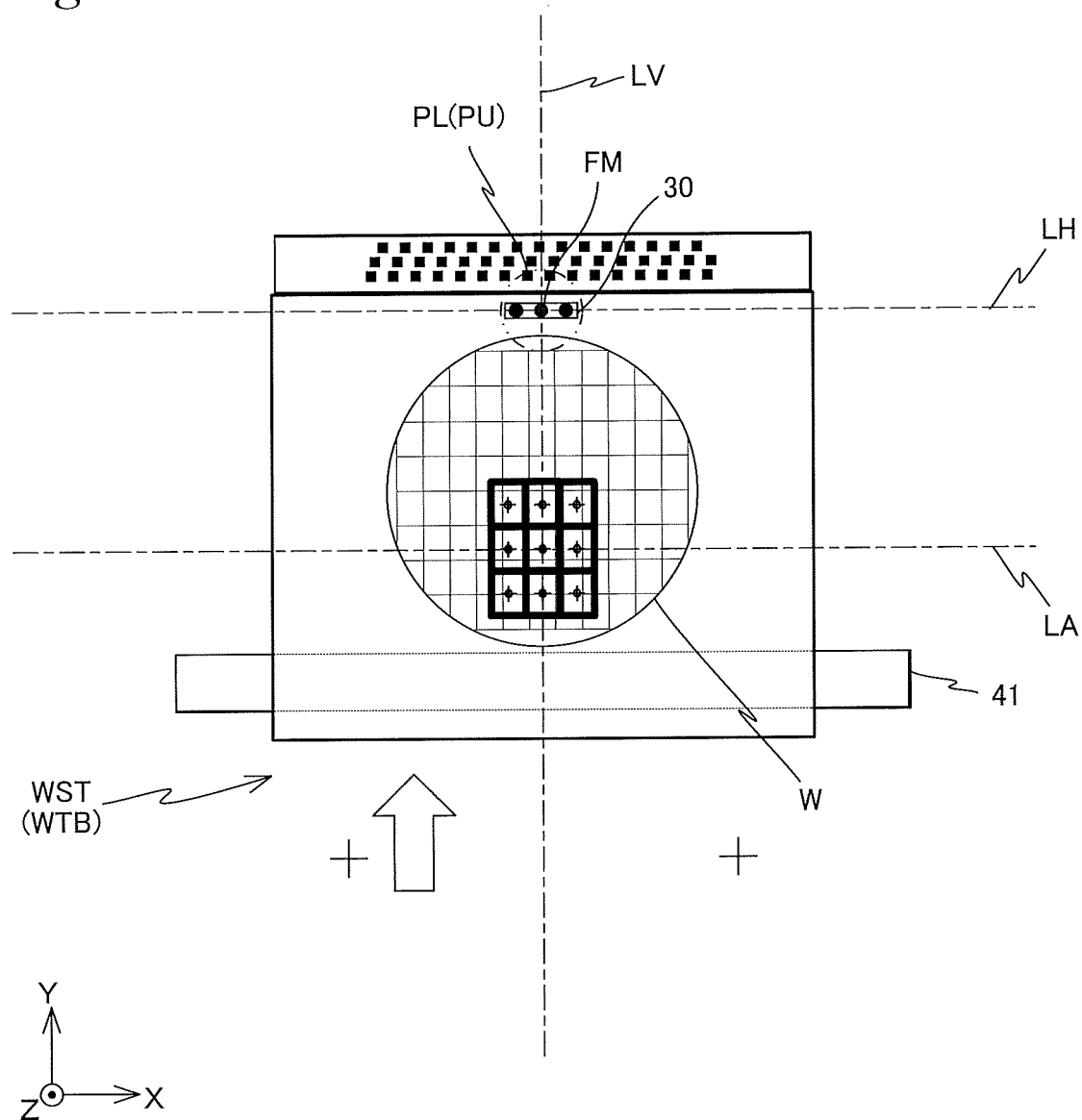
FIG. 18 is a view (No. 4) used to explain an alignment measurement (and base line check of the alignment system) using the alignment system.

When detection described above of the alignment marks arranged in the second alignment shot area is completed, main controller 20 moves wafer stage WST in the +Y direction (refer to an outlined arrow in FIG. 18). Then, as is shown in FIG. 18, when wafer stage WST reaches a position where measurement plate 30 is located directly under projection optical system PL, main controller 20 makes wafer stage WST stop at that position, and executes the second half processing of base line measurement of alignment sensor $AL_{22}$. The second half processing of base line measurement of alignment sensor $AL_{22}$, here, refers to a processing in which a projected image (an aerial image) of a pair of measurement marks on reticle R projected by projection optical system PL are measured using aerial image measurement devices 45A and 45B described earlier including measurement plate 30, in an aerial image measurement operation of a slit scan method using a pair of aerial image measurement slit plates SL similar to the method disclosed in, for example, U.S. Patent Application Publication No. 2002/0041377 and the like. And, the processing means that the measurement results (aerial image intensity according to the X and Y positions of wafer table WTB) are to be stored in the internal memory. Main controller 20 calculates base line of alignment sensor $AL_{22}$, based on results of the first half processing of base line measurement of alignment sensor $AL_{22}$ and results of the second half processing of base line measurement of alignment sensor $AL_{22}$.

Furthermore, main controller 20 moves wafer stage WST in the +Y direction by a predetermined distance and executes detection of alignment marks arranged in at least nine third alignment shot areas, and then associates each of the detection results with position information (that is, X, Y, and θz positions of wafer table WTB) of Y interferometer 125 and X interferometer 127 of interferometer system 118 at the time of each detection, and stores the information in internal memory. Here, detection of alignment marks arranged in the third alignment shot areas is performed in a procedure similarly to that of the detection of alignment marks arranged in the first alignment shot areas described earlier.

By using detection results (two-dimensional position information) of a total of at least 27 alignment marks obtained in this manner and the corresponding position information (that is, X, Y, and θz positions of wafer table WTB) of Y interferometer 125 and X interferometer 127 of interferometer system 118, main controller 20 performs a statistical calculation as is disclosed in, for example, U.S. Pat. No. 4,780,617 and the like, and calculates an arrangement and scaling (shot magnification) for all shot areas on wafer W on a coordinate system (an XY coordinate system with the origin being the center of wafer table WTB) set by the measurement axes of interferometer system 118. Furthermore, based on the calculated shot magnification, main controller 20 controls an adjustment device (not shown) that adjusts optical properties of projection optical system PL by moving a specific movable lens which structures projection optical system PL or by changing pressure of gas inside an air-tight chamber formed in between specific lenses structuring projection optical system PL, so that the optical properties of projection optical system PL, e.g., projection magnification, is adjusted.

Then, main controller 20, performs exposure of a step-and-scan method, based on results of wafer alignment (EGA) performed in advance described earlier and the latest base line of alignment sensors $AL_{11}$ to $AL_{33}$, and sequentially transfers the pattern of reticle R onto each of the plurality of shot areas SA on wafer W. Hereinafter, a similar operation is repeatedly performed.

Note that base line measurement of alignment sensors $AL_{11}$, $AL_{12}$, $AL_{13}$, $AL_{21}$, $AL_{23}$, $AL_{31}$, $AL_{32}$, and $AL_{33}$ other than alignment sensor $AL_{22}$ is performed by simultaneously measuring fiducial mark MM on FD bar 46 within each field using alignment sensors $AL_{11}$ to $AL_{33}$, in a state where θz rotation of FD bar 46 (wafer stage WST) is adjusted at an appropriate timing, based on at least one of the measurement values of the pair of Z interferometers 43A and 43B and Y interferometer 25 described earlier, similarly to the method disclosed in, for example, U.S. Pat. No. 8,054,472. Here, base line of alignment sensors $AL_{11}$, $AL_{12}$, $AL_{13}$, $AL_{21}$, $AL_{23}$, $AL_{31}$, $AL_{32}$, and $AL_{33}$ refers to the distance (or positional relation) between each detection center and the detection center of alignment sensor $AL_{22}$.

Note that in the description above, while alignment measurement was to be performed with stepping movement of wafer stage WST only in the Y-axis direction, alignment measurement may be performed with stepping movement of wafer stage WST in the Y-axis direction and the X-axis direction. For example, a full-shot alignment measurement may be performed in which alignment marks of at least one each is measured for all shot areas on wafer W. Also in this case, at least one each of alignment marks M can be detected concurrently for at least nine shot areas by the nine alignment sensors $AL_{11}$, $AL_{12}$, $AL_{13}$, $AL_{21}$, $AL_{22}$, $AL_{23}$, $AL_{31}$, $AL_{32}$, and $AL_{33}$, in a state where wafer W is stopped at each step position (in a state where static servo control is performed with respect to stage drive system 124 which moves wafer stage WST). Accordingly, it becomes possible to perform wafer alignment within a short time.

Also, as is obvious from FIG. 13, since there are 12 alignment marks M in each of the shot areas SA, two or more alignment marks M may be detected in at least one shot area.

Note that in the description above, the case has been described in which one template was selected from a plurality of templates shown in FIG. 4, and a plurality of shot areas SA and a plurality of alignment marks M were formed on wafer W according to the template. However, if alignment system ALG shown in FIG. 13 is used, not only in the case when any one of the remaining templates shown in FIG. 4 is selected, but also in other cases as well, in the case a plurality of shot areas SA and alignment marks M are formed on wafer W according to a template selected from a plurality of templates displayed on a screen by determination apparatus 50 described earlier using exposure apparatus 100 or other exposure apparatuses, and wafer alignment is performed with the wafer W serving as an exposure target in exposure apparatus 100, at least one each of alignment mark M can be detected concurrently for at least nine shot areas by nine alignment sensors $AL_{11}$, $AL_{12}$, $AL_{13}$, $AL_{21}$, $AL_{22}$, $AL_{23}$, $AL_{31}$, $AL_{32}$, and $AL_{33}$, in a state where wafer W is stopped at each stepping position of wafer W (in a state where static servo control is performed with respect to stage drive system 124 that moves wafer stage WST).

This is because the following relations hold between mark pitch px, detection center pitch Dx, and shot size Wx, and mark pitch py, detection pitch Dy, and shot size Wy.

$$px = Dx/i \text{ ($i$ denotes a natural number)} = Wx/m \text{ ($m$ denotes a natural number)} \quad (3)$$

$$py = Dy/j \text{ ($j$ denotes a natural number)} = Wy/n \text{ ($n$ denotes a natural number)} \quad (4)$$

When Dx>Wx, i>m
When Dy>Wy, j>n

Note that shot sizes Wx and Wy and mark pitches px and py may be determined without having to use determination apparatus 50, by repeating an operation based on detection center pitches Dx and Dy so that formula (3) and formula (4) described above hold.

Note that "formula (3) holds" or "formula (3) is satisfied" includes not only the case when Px completely coincides with Dx/i and Wx/m, but also the case when Px almost coincides with Dx/i and Wx/m. That is, the case in which Dx/i and Wx/m slightly differs is also included, as well as the case in which Px slightly differs with at least one of Dx/i and Wx/m.

Similarly, "formula (4) holds" or "formula (4) is satisfied" includes not only the case when Py completely coincides with Dy/j and Wy/n, but also the case when Py almost coincides with Dy/j and Wx/n. That is, the case in which Dy/j and Wy/n slightly differs is also included, as well as the case in which Py slightly differs with at least one of Dy/j and Wy/n.

Note that whether it is regarded "almost coinciding" or not may be decided, for example, by whether mark detection may be performed concurrently in the plurality of detection areas or not. For example, the judgment may be made, based on at least one of the size of the plurality of detection areas within the XY plane, the size of alignment mark M, and position control error of wafer table WTB (wafer stage WST) within the XY plane.

Also, the detection center of a plurality of detection areas does not have to be arranged completely at pitches Dx and Dy. That is, the detection center of the plurality of detection areas may be slightly displaced from a virtual point. The permissible amount of this displacement may be decided, for example, by whether or not mark detection can be performed concurrently in the plurality of detection areas. For example, this permissible amount of displacement may be decided, based on the size of the plurality of detection areas, the size of alignment mark M and the like.

As is described so far, with determination apparatus 50 and the determination method according to the embodiment, it becomes possible to determine the size of a plurality of shot areas to be formed on a wafer and layout information (template) of alignment marks according to the size, such as in, for example, a layout that can be detected concurrently by a mark detection system whose plurality of detection areas has a positional relation fixed similarly to nine alignment sensors $AL_{11}$ to $AL_{33}$ of alignment system ALG of exposure apparatus 100 in a state where the wafer is stopped, and to display the template on a display screen.

Also, with the alignment measurement (mark detection method) performed in exposure apparatus 100, nine alignment marks arranged on wafer W in the X-axis direction and the Y-axis direction can be concurrently detected, using the nine alignment sensors $AL_{11}$ to $AL_{33}$ whose positional relation is fixed equipped in alignment system ALG. Also, the nine alignment marks can be concurrently detected using alignment sensors $AL_{11}$ to $AL_{33}$ when wafer W is stepped at least a plurality of times in the Y-axis direction, at each stopping position of the stepping movement. As a matter of course, mark detection does not have to be performed in a part (one or a plurality) of alignment sensors $AL_{11}$ to $AL_{33}$, or mark detection may be started in other parts (one or a plurality) after mark detection has been completed in a part (one or a plurality) of alignment sensors $AL_{11}$ to $AL_{33}$.

Also, concurrent detection of alignment marks is executed using alignment sensors $AL_{11}$ to $AL_{33}$, in a state where auto-focus mechanism that each of the alignment sensors $AL_{11}$ to $AL_{33}$ has is controlled. This allows position information on alignment marks to be measured with high precision.

Also, instead of controlling the auto-focus mechanism of alignment sensors $AL_{11}$ to $AL_{33}$, focus-leveling control of wafer W (position control of the Z position, and the θx and the θy directions), or focus control (control of the Z position) may be performed. In this case, alignment sensors $AL_{11}$ to $AL_{33}$ do not have to have the auto-focus mechanism. In this case, main controller 20 divides the nine alignment sensors into three groups consisting of three alignment sensors whose detection centers are not on the same straight line, and by performing concurrent detection of alignment marks by three each of the alignment sensors sequentially, using the alignment sensors of each set, measurement of position information on alignment marks becomes possible with high precision.

Accordingly, with the alignment measurement (mark detection method) performed in exposure apparatus 100, a fixed alignment sensor can be employed as each of the alignment sensors $AL_{11}$ to $AL_{33}$. As a result, cost reduction and improvement in space efficiency inside the exposure apparatus become possible when compared to the case of employing a movable alignment sensor as at least a part of the plurality of alignment sensors. As an example of the latter case of improving space efficiency, for example, since the diameter of the optical system that the alignment system (alignment sensor) can be increased, it becomes possible to employ an optical system having a large numerical aperture N.A., or to incorporate an adjustment mechanism for image forming characteristics and the like inside the optical system.

Also, since exposure is performed in exposure apparatus 100 with respect to the plurality of shot areas on wafer W in a step-and-scan method, by moving wafer stage WST based on detection results with high precision of the marks described above, exposure with high precision (exposure with good overlay accuracy) becomes possible.

Note that main controller 20 of exposure apparatus 100 may be used as determination apparatus 50, or a host computer at a factory or the like where exposure apparatus 100 is installed may be used. Also, as determination apparatus 50, a lap top computer connected to, or not connected to exposure apparatus 100 or to the host computer may be used, or a mobile terminal such as a tablet may also be used.

Figure 19:
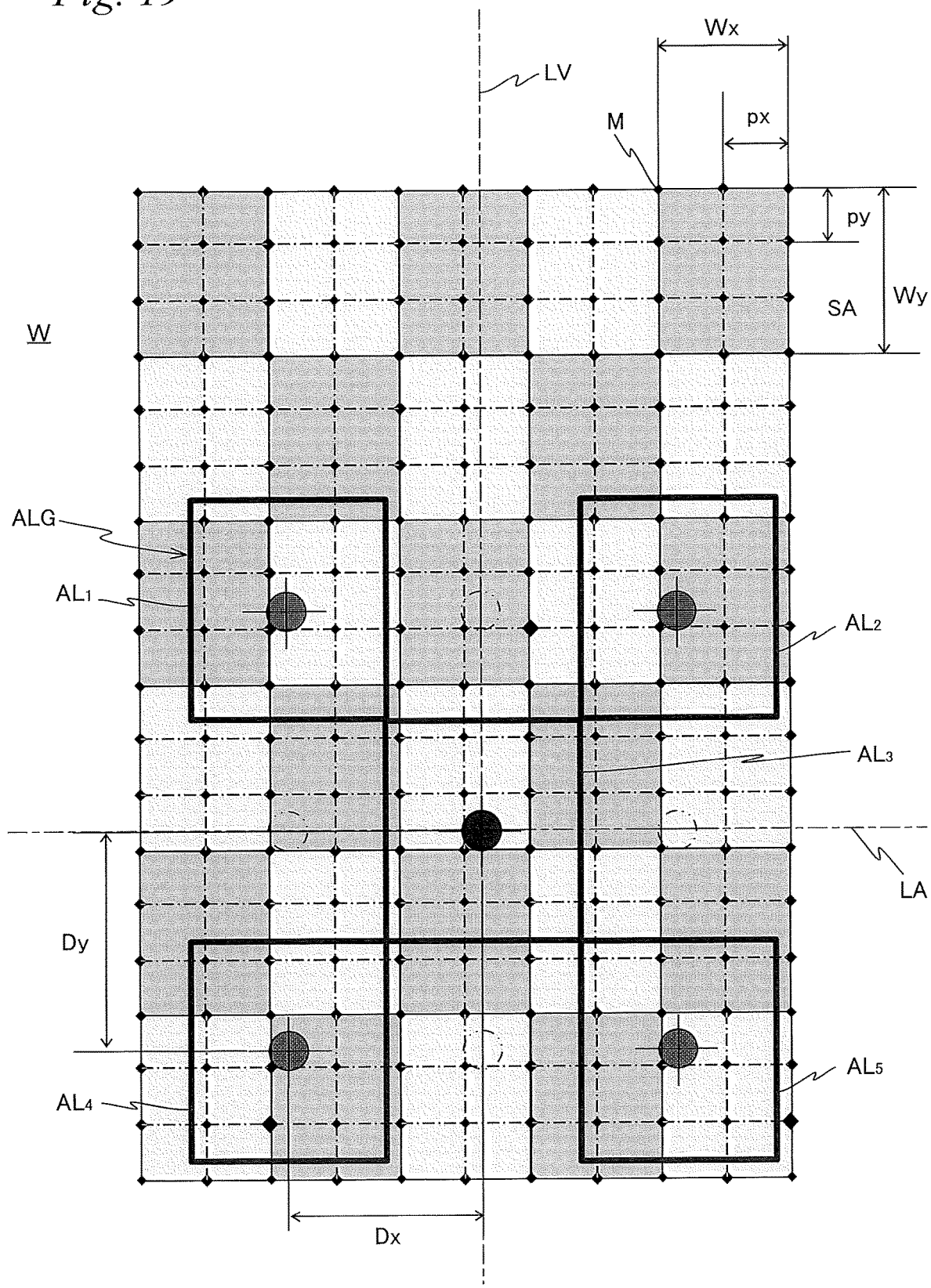
FIG. 19 is a view showing an example of an arrangement of a plurality of alignment sensors (columns) in an arrangement other than a matrix shape.

Note that in the embodiment above, while the case has been described in which alignment system ALG has nine alignment sensors $AL_{11}$ to $AL_{33}$ arranged in the X-axis direction and the Y-axis direction in the shape of a matrix, the arrangement of the plurality of columns of the mark detection system corresponding to the nine alignment sensors $AL_{11}$ to $AL_{33}$ described above is not limited to the matrix shape arrangement. For example, even in a mark detection system having an arrangement of five alignment sensors (columns) $AL_1$ to $AL_5$ as is shown in FIG. 19, by using the layout determination method of the embodiment described above so that formula (3) and formula (4) described earlier are satisfied, shot sizes Wx and Wy and mark spaces px and py can be determined, based on detection center spaces Dx and Dy shown in FIG. 19. That is, also in the case of FIG. 19, it can be regarded that the detection areas (detection centers) of $AL_1$ to $AL_5$ have a two-dimensional arrangement at predetermined spaces (pitches) Dx and Dy. For example, detection center pitches Dx and Dy can be determined considering that detection centers of alignment sensors $AL_1$ to $AL_5$ coincide with five points of a plurality of virtual points arranged two-dimensionally in the X-axis direction and the Y-axis direction including a center point of four virtual detection areas shown in a circle (circle) of a virtual line (two-dot chain line) in FIG. 19. Here, as it can be seen when focusing of alignment sensor $AL_1$ and alignment sensor $AL_2$ shown in FIG. 19, the plurality of columns of the mark detection system does not have to be adjacent to each other.

Also, for example, in the case of a mark detection system that has only a plurality of columns whose detection centers are arranged along a straight line intersecting the X-axis at a predetermined angle as in columns $AL_1$, $AL_3$, and $AL_5$ shown in FIG. 19, by determining detection center pitches Dx and Dy including the virtual detection centers (detection areas) similarly to FIG. 19, shot sizes Wx and Wy and mark pitches px and py can be determined based on detection center pitches Dx and Dy shown in FIG. 19 made to satisfy formula (3) and formula (4) described earlier, with the determination method of the embodiment described above.

Also, for example, in the case the plurality of columns of the mark detection system is arranged in a predetermined direction, e.g., the X-axis direction (or the Y-axis direction) in a line at a predetermined space, shot size Wx and mark pitch px (or shot size Wy and mark pitch py) should be determined based on detection center pitch Dx (or Dy), so that formula (3) (or formula (4)) described earlier is satisfied. Here, in formula (3) and formula (4), the size of the column and the detection area is not included, and as it can be seen from the point that only the detection center pitch is included, adjacent columns may be in contact with one another, or may be arranged apart at a predetermined space.

Also, in the embodiment described above (such as FIGS. 3, 13, and 19), while the columns within the XY plane is illustrated in a square shape, the shape of the columns within the XY plane may be a shape that has no corners such as a circle, or may be other polygons such as a triangle or a pentagon, or may be a shape having corners and curves.

Note that in the embodiment above, while a procedure of acquiring layout information was described step by step, using the flowchart in FIG. 5 to provide a comprehensive explanation, the layout information including the size of divided areas and mark pitches for arranging a plurality of marks detected by a mark detection system having a plurality of detection areas along with a plurality of divided areas (shot areas) on a substrate (wafer), the layout information described above does not necessarily have to be provided according to the procedure. For example, the layout information may be provided by a first layout information providing method which includes calculating (Dx/i) and (Dy/j), which are pitch Dx in a first direction and pitch Dy in a second direction of a plurality of virtual points divided by natural number i and by natural number j, respectively, the plurality of virtual points being arranged in the first direction (e.g., the X-axis direction) and the second direction (e.g., the Y-axis direction) intersecting each other within a predetermined plane (e.g., XY plane) that includes detection centers of a plurality of detection areas, as a plurality of candidates $p_{xi}$ (i=1 to I) and $p_{yj}$ (j=1 to J) for pitch px in the first direction and pitch py in the second direction of a plurality of marks arranged on a substrate, along with calculating $m \cdot p_{xi}$ and $n \cdot p_{yj}$, which are a plurality of candidates $p_{xi}$ (i=1 to I) sequentially multiplied by a natural number m (m=1 to M) and a plurality of candidates $p_{yj}$ (j=1 to J) sequentially multiplied by a natural number n (n=1 to N), as candidates for size Wx in the first direction and size Wy in the second direction of the plurality of divided areas arranged two-dimensionally along the first direction and the second direction on the substrate, and providing the candidates for size Wx and the candidates for size Wy which are calculated, and candidates $p_{xi}$ and $p_{yj}$ for pitch px in the first direction and pitch py in the second direction of the plurality of marks corresponding thereto as the layout information described above.

Also, in the flowchart of FIG. 5, calculation of $px_i$ (steps S108 to S112) and calculation of $py_j$ (steps S114 to S118) may be performed concurrently. Calculation of $W_{xim}$ or $W_{yjn}$ may be performed at the point when at least one of $px_i$ or at least one of $py_j$ is calculated.

In the flowchart of FIG. 8 as well, the layout information does not have to be provided according to the procedure described earlier.

Note that in the case the plurality of detection areas DA is arranged spaced equally in a two-dimensional direction (or a one-dimensional direction) within the XY plane as in the case of FIGS. 3 and 13, pitch Dx in the first direction (e.g., the X-axis direction) and pitch Dy in the second direction (e.g., the Y-axis direction) intersecting the first direction of the plurality of virtual points are none other than the space in the first direction of the detection centers of two detection areas adjacent in the first direction and the space in the second direction of the detection centers of two detection areas adjacent in the second direction. Accordingly, in such a case, the layout information may be provided by a second layout information providing method which includes calculating (Dx/i) and (Dy/j), which are pitch Dx in a first direction (e.g., the X-axis direction) and pitch Dy in a second direction (e.g., the Y-axis direction) intersecting the first direction within a predetermined plane (e.g., an XY plane) divided by natural number i and natural number j, respectively, of a plurality of detection areas within the predetermined plane, as a plurality of candidates $p_{xi}$ (i=1 to I) and $p_{yj}$ (j=1 to J) for pitch px in the first direction and pitch py in the second direction of a plurality of marks arranged on a substrate, along with calculating $m \cdot p_{xi}$ and $n \cdot p_{yj}$, which is a plurality of candidates $p_{xi}$ (i=1 to I) sequentially multiplied by a natural number m (m=1 to M), and a plurality of candidates $p_{yj}$ (j=1 to J) sequentially multiplied by a natural number n (n=1 to N), as candidates for size Wx in the first direction and size Wy in the second direction of a plurality of divided areas arranged two-dimensionally along the first direction and the second direction on the substrate, and providing the candidates for size Wx and size Wy which are calculated and candidates $p_{xi}$ and $p_{yj}$ for pitch px in the first direction and pitch py in the second direction of the plurality of marks corresponding thereto as the layout information described above. Here, the space (detection center pitch) Dx (or Dy) between mutual detection centers may be a distance determined in advance in design, or may be a distance measured using a measurement member (e.g., FD bar 46) provided in wafer table WTB, or may be a distance measured using a sensor provided in wafer table WTB.

Or, the layout information may be provided by a third layout information providing method that includes a case in which when pitches in the first direction (e.g., the X-axis direction) and the second direction (e.g., the Y-axis direction) intersecting within a predetermined plane (e.g., the XY plane) of a plurality of detection areas are to be Dx and Dy, respectively, the size of the plurality of detection areas arranged two-dimensionally along the first direction and the second direction on a substrate are to be Wx and Wy, respectively, and pitches in the first direction and the second direction of a plurality of marks arranged on the substrate are to be px and py, respectively, candidates for each of size Wx and size Wy that satisfy formulas (3) and (4) described above and candidates for pitch px in the first direction and pitch py in the second direction of the plurality of marks corresponding thereto are to be provided as the layout information described above.

Note that the first to third layout information providing method may be achieved using determination apparatus 50 in FIG. 1 or other computers, by appropriately changing the algorithm shown in the flowchart in FIG. 5 described earlier.

Note that even if the layout information is provided by any one of the first to third layout information providing methods, the layout information provided may be displayed on the display screen of determination apparatus 50 or that of other computers.

Note that to make the description easier to understand so far, while the case has been described where a plurality of virtual points set in a first direction (e.g., the X-axis direction) and a second direction (e.g. the Y-axis direction) intersecting the first direction are estimated, and a plurality of detection areas DA is arranged so that the detection centers of the plurality of detection areas DA coincide with the virtual points, the plurality of virtual points does not have to be estimated. For example, as is described above, pitches Dx and Dy of the plurality of detection areas may be a design value, or a value which is acquired (measured) within the device installed in the mark detection system.

Note that the layout method on the wafer and the determination method described above can be suitably applied also to a wafer subject to exposure in exposure apparatuses disclosed in, for example, U.S. Pat. Nos. 8,432,534, 8,054, 472 and the like, equipped with a plurality of alignment sensors including a fixed alignment sensor and a movable alignment sensor. In these exposure apparatuses as well, after the position of movable alignment sensors within the XY plane is adjusted to match a shot map, it becomes possible to effectively detect the plurality of alignment marks on the wafer using the plurality of alignment systems by moving the wafer (wafer stage) within the XY plane while keeping the adjusted position fixed. Note that the adjustment of position of alignment sensors includes adjusting the position within the XY plane of the detection areas (detection centers) of the alignment sensors. The adjustment of position within the XY plane of the detection areas (detection centers) of the alignment sensors may be performed moving the columns of the alignment sensors, or may be performed without moving the columns. For example, the adjustment of position within the XY plane of the detection areas (detection centers) of the alignment sensors may be performed by the optical system structuring the alignment sensors without moving, or with moving the columns.

Note that in the embodiment above, while the case has been described in which the mark detection system has nine alignment sensors, that is, the mark detection system has nine columns and detection areas, the embodiment is not limited to this, and the number of columns in the mark detection system does not matter and the detection areas provided only have to be two or more. In short, by the determination method of the embodiment described above, shot sizes Wy and Wy and mark spaces px and py should be determined based on detection center spaces Dx and Dy, so that one of formula (3) and formula (4) described earlier, or both of the formulas are satisfied.

Also, in the embodiment described above, while the focus was on three sets which are arrangement (pitches Dx and Dy) of detection area DA, shot sizes Wx and Wy, and arrangement of marks (e.g., pitches px and py) described earlier, the focus may be on two sets of the three sets described above. For example, in the case one set of the two sets that are focused on is known, the remaining one set (e.g., the final candidate) may be decided without taking into consideration the one set which is not being focused on.

For example, in the case of focusing on shot sizes Wx and Wy and the arrangement (pitches Dx and Dy) of the detection area, and one is known, then the other may be decided so that formulas (3A) and (4A) below are satisfied.

$$Dx/i \text{ (} i \text{ denotes a natural number)}=Wx/m \text{ (} m \text{ denotes a natural number)} \quad (3A)$$

$$Dy/j \text{ (} j \text{ denotes a natural number)}=Wy/n \text{ (} n \text{ denotes a natural number)} \quad (4A)$$

For example, in the case shot sizes Wx and Wy are known, the final candidates for pitches Dx and Dy may be determined without taking into consideration the mark arrangement, so that formulas (3A) and (4A) below are satisfied. In this case as will, similarly to the embodiment of FIG. 8, for example, when Wx=26, Wy=33, and i=1 to 10, j=1 to 10, m=1 to 10, and n=1 to 10, the final candidates for Dx and Dy that satisfy the conditions described earlier (Dx<Dy, and 60≥Dx>30, and 60≥Dy>30) turn out as in Table 3 described earlier.

For example, the arrangement (pitches Dx and Dy) of the detection area of the alignment sensors of exposure apparatus 100 can be decided so that formulas (3A) and (4A) are satisfied. In the case the detection areas of the alignment sensors are movable as is described above, the detection areas may be moved so that formulas (3A) and (4A) are satisfied.

Note that in the case the arrangement (pitches Dx and Dy) of detection area DA is known, the final candidates for shot sizes Wx and Wy may be decided so that formulas (3A) and (4A) are satisfied, based on shot sizes Wx and Wy.

Also, when the focus is on two sets which are arrangement (e.g., pitches Dx and Dy) of detection area DA and arrangement (e.g., pitches px and py) of marks, and one is known, then the other may be decided so that formulas (3B) and (4B) below are satisfied.

$$px=Dx/i \text{ (} i \text{ denotes a natural number)} \quad (3B)$$

$$py=Dy/j \text{ (} j \text{ denotes a natural number)} \quad (4B)$$

For example, in the case the arrangement (pitches Dx and Dy) of detection area DA is known, the arrangement (pitches Px and Py) of the marks may be decided based on formulas (3B) and (4B) described above, without taking into consideration shot sizes Wx and Wy. In this case, as is shown in FIG. 3 or 4, a partitioned area within each divided area does not have to be estimated, and marks in the four corners of the divided area will not be necessary. In short, the plurality of marks within each divided area and the plurality of marks within the plurality of divided areas which are adjacent only have to be formed on the substrate so that formulas (3B) and (4B) described above are satisfied. Note that similarly to formulas (3) and (4) described above, satisfying formulas (3A), (4A), (3B), and (4B) is not limited to the case in which formulas (3A), (4A), (3B), and (4B) described above are completely satisfied, but also includes the case in which formulas (3A), (4A), (3B), and (4B) are almost satisfied. For example, in formulas (3B) and (4B) described above, Px and Dx/i may be slightly different, or Py and Dy/j may be slightly different. The permissible amount of displacement between Px and Dx/i and/or the permissible amount of displacement between Py and Dy/j may be decided, for example, based on the size of the plurality of detection areas, the size of the marks and the like.

Note that while the description was made so far with the premise that the mark detection system is a multi-column type having a plurality of columns to make the description easy to understand, the number of columns in the mark detection system does not matter as long as the mark detection system has a plurality of detection areas and the marks can be individually detected concurrently in the plurality of detection areas.

Note that in the embodiment above, while an example was given in which an FIA (Field Image Alignment) system of an image processing method is used as each alignment sensor of alignment system ALG, the description is not limited to this and an alignment sensor of a diffracted light interference method may be used that detects position information on the grating mark by irradiating a measurement light (measurement beam) on a grating mark while moving a wafer on which the grating mark is formed, and detecting an interference light of a plurality of diffracted lights generated from the grating mark. In the case of using the alignment sensor of the diffracted light interference method, a plurality of alignment sensors (e.g., nine alignment sensors) may concurrently perform detection while the wafer is moved to a certain position. As for the alignment sensor of the diffracted light interference method, details are disclosed in, for example, U.S. Pat. No. 7,319,506.

Note that in the case of employing the alignment sensor of the diffracted light interference method, the detection center (detection position) can be set by the irradiation position of the measurement beam (detection light), and space (detection center pitch) Dx (or Dy) between mutual detection centers can be set by the space between mutual irradiation positions of the measurement beam. In the case of employing the alignment sensor of the diffracted light interference method as well, the space (detection center pitch) Dx (or Dy) between mutual detection centers may be a distance determined beforehand in design, or may be a distance measured using a measurement member (e.g., FD bar 46) provided in wafer table WTB, or may be a distance measured using a sensor provided in wafer table WTB.

Note that mark M subject to detection of the alignment sensor of the diffracted light interference method is not limited to a grating mark having a periodic direction in the X-axis direction, and a two-dimensional mark may be used, consisting of a one-dimensional mark having a periodic direction tilted by +45 degrees with respect to the X-axis and a one-dimensional mark having a periodic direction tilted by −45 degrees with respect to the X-axis that are arranged in the X-axis direction (or the Y-axis direction). In this case, at the time of measurement, diffracted light generated for the two-dimensional mark only has to be detected by the alignment sensor of the diffracted light interference method, while the wafer is moved in the X-axis direction (or the Y-axis direction).

Also, an alignment sensor of the diffracted light interference method that performs mark detection while changing the irradiation position of the measurement beam may be employed. In this case, relative movement of the measurement beam and the grating mark may be performed while moving the measurement beam in a state where the wafer is stopped, or relative movement of the measurement beam and the grating mark may be performed while moving both the measurement beam and the wafer.

Note that the alignment sensor accompanied with relative movement between the measurement beam and the alignment mark is not limited to the alignment sensor of the diffracted light interference method that uses the grating mark.

Note that in the embodiment described above, "concurrent detection" includes not only the case in which the detection operation period of the plurality of alignment sensors included in one set coincides completely, but also the case in which a part of the detection operation period in one alignment sensor overlaps a part of the detection operation period in another alignment sensor.

Also, the alignment mark detected in the alignment system of the embodiment described above may be a mark used in an overlapping inspection apparatus (Overlay Inspection apparatus).

Also, the embodiment described above can also be applied in an exposure apparatus that has a multi-lens optical system (including a multi-column type optical system), to a TTL alignment system that detects a mark via a part of lenses including at least a front lens located at a position nearest to the image plane of each lens. As for such a TTL alignment system, details are disclosed in, for example, U.S. Pat. Nos. 5,151,750, 6,242,754 and the like.

Also, as the mark detection system, a multi-column type charged particle beam optical system may be used that irradiates a mark corresponding to a plurality of detection areas on a wafer (target) with a charged particle beam, and detects reflected charged particle beams generated at the mark.

As a multi-column type charged particle beam exposure apparatus, for example, the apparatus can have a plurality of optical system columns arranged corresponding about 1:1 to a plurality of shot areas formed on a wafer, and each of the plurality of optical system columns can be switched between an on-state (a state in which the wafer and the like are irradiated with an electron beam) and an off-state (a state in which the wafer and the like are not irradiated with an electron beam), also with the electron beams being deflectable. In such a charged particle beam exposure apparatus, a multi-column type electron beam exposure apparatus is known that exposes a plurality of shot areas on a wafer by switching the state of a plurality of electron beams between an on-state and an off-state, while scanning the wafer with respect to a spot of a predetermined shape (e.g., a circular shape, a rectangular shape or the like) of the plurality of electron beams. Note that the switching between the on-state and the off-state of the electron beam can be performed, for example, by deflecting (beam blanking) the electron beam and the like. In general, the electron beam exposure apparatus also has a function of detecting an alignment mark by scanning an electron beam with respect to a mark on a wafer, and detecting reflected electrons generated from the mark. Therefore, in the multi-column type electron beam exposure apparatus and the like, the irradiation points (irradiation areas) of the electron beams correspond to the detection areas of the alignment marks, and spaces between the irradiation points (irradiation areas) on the wafer (target) of the electron beams from adjacent optical system columns correspond to pitches Dx and Dy of the detection areas (detection centers) described earlier. Accordingly, by determining shot sizes Wx and Wy and mark spaces px and py, so that formula (3) and formula (4) described earlier are satisfied according to the determination method (or the mark layout method) of the embodiment described above based on spaces Dx and Dy of the irradiation points, it becomes possible to irradiate the marks without fail on the wafer with the electron beams from all the optical system columns, and to perform concurrent detection of the plurality of marks using the plurality of optical system columns for the plurality of shots (e.g., all shots) at once.

Also, in the embodiment described above, the plurality of marks detected by alignment sensors $AL_{11}$ to $AL_{33}$ may be a plurality of marks formed one layer prior to the layer on which exposure is to be performed based on the detection results, or a plurality of marks formed on a layer formed earlier than the one layer prior.

Also, in the embodiment described above, while alignment system ALG (alignment sensors $AL_{11}2$ to $AL_{33}$) is installed in exposure apparatus 100, a mark detection operation as in the description above may be performed with a mark detection system having a plurality of detection areas being installed in a measurement device arranged outside exposure apparatus 100. Such a measurement device may, or may not be connected in-line to exposure apparatus 100. Details on the measurement device arranged outside exposure apparatus 100 are disclosed in, for example, U.S. Pat. No. 4,861,162 and the like.

Also, in the embodiment described above, alignment mark M formed in each shot area may be formed on scribe lines of each shot area, and size Wx and size Wy of the shot area may include the scribe lines.

Note that in the case of using an encoder system instead of, or along with the interferometer system as the measurement device for measuring position information on the wafer stage in the exposure apparatus, the encoder system is not limited to an encoder system having a structure in which a grating section (scale) is provided on a wafer table (wafer stage) and an encoder head is arranged outside the wafer stage facing the grating section, and as is disclosed in, for example, U.S. Pat. No. 8,514,395 and the like, an encoder system may be employed having a structure in which an encoder head is provided in a wafer stage, and facing this, a grating section (e.g., a two-dimensional grating, or a one-dimensional grating section arranged two-dimensionally) is arranged outside the wafer stage. In both encoder systems, the encoder head used is not limited to a one-dimensional head, and not only a two-dimensional head with a measurement direction in the X-axis direction and the Y-axis direction, but a sensor head may also be used with a measurement direction in one of the X-axis direction and the Y-axis direction, and in the Z-axis direction. Or, a three-dimensional head may be used whose measurement direction is to be in three-axis directions orthogonal in the X-axis, the Y-axis, and the Z-axis.

Also, in the embodiment described above, while the case has been described where the exposure apparatus is a dry type exposure apparatus that performs exposure of wafer W without using liquid (water), the exposure apparatus is not limited to this, and the embodiment described above can also be applied to an exposure apparatus having a liquid immersion space including an optical path of an illumination light formed between a projection optical system and a wafer that exposes the wafer with the illumination light via the projection optical system and liquid in the liquid immersion space, as is disclosed in, for example, European Patent Application Publication No. 1420298, International Publication WO 2004/055803, U.S. Pat. No. 6,952,253 and the like. Also, the embodiment described above can be applied to a liquid immersion exposure apparatus or the like disclosed in, for example, U.S. Pat. No. 8,054,472.

Also, in the embodiment described above, while the case has been described where the exposure apparatus is a scanning exposure apparatus of a step-and-scan method, the embodiment is not limited to this, and the embodiment described above may also be applied to a static exposure apparatus such as a stepper. Also, the embodiment described above can be applied to a reduction projection exposure apparatus of a step-and-stitch method that synthesizes a shot area and a shot area, an exposure apparatus of a proximity method, a mirror projection aligner and the like. Furthermore, the embodiment described above can also be applied to a multi-stage type exposure apparatus equipped with a plurality of wafer stages, as is disclosed in, for example, U.S. Pat. Nos. 6,590,634, 5,969,441, 6,208,407 and the like. In the multi-stage type exposure apparatus, needless to say, the distance between projection optical system PL (optical axis AX) and the alignment system (AL1 and the like) is longer than that of the case in FIG. 11, so that an exposure operation of one stage under projection optical system PL and a measurement operation of the other stage under the alignment system can be concurrently executed. Note that also in the case of the multi-stage type exposure apparatus, a detection area (detection center) of one of the alignment sensors (e.g., AL1) does not have to be arranged on reference axis LV passing through the optical axis of the projection optical system. Also, the embodiment described above can also be applied to an exposure apparatus equipped with a measurement stage including a measurement member (e.g., a reference mark, and/or a sensor and the like) other than a wafer stage, as is disclosed in, for example, U.S. Pat. No. 7,589,822 and the like.

Also, the projection optical system in the embodiment described above is not limited to a reduction system, and may also either be an equal or a magnifying system, projection optical system PL is not limited to a refraction system and may also either be a reflection system or a catadioptric system, and the projection image may also either be an inverted image or an erected image. Also, while the illumination area and the exposure area previously described had a rectangular shape, the embodiment is not limited to this, and the shape may be, for example, an arc, a trapezoid, or a parallelogram.

Note that the light source of the exposure apparatus in the embodiment described above is not limited to the ArF excimer laser, and may also be a pulse laser light source such as a KrF excimer laser (output wavelength 248 nm), an $F_2$ laser (output wavelength 157 nm), an $Ar_2$ laser (output wavelength 126 nm), a $Kr_2$ laser (output wavelength 146 nm), or an ultra-high pressure mercury lamp that emits a bright line such as a g-line (wavelength 436 nm), i-line (wavelength 365 nm) or the like can also be used. Also, a harmonic generator of a YAG laser or the like can also be used. Other than this, as is disclosed in, for example, U.S. Pat. No. 7,023,610, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal.

Also, in the embodiment described above, illumination light IL of the exposure apparatus is not limited to light with a wavelength of 100 nm or more, and of course, light with a wavelength less than 100 nm may be used. For example, in recent years, to form patterns which are 70 nm or smaller, an EUV exposure apparatus is being developed that uses SOR or plasma laser as a light source to generate EUV (Extreme Ultraviolet) light in the soft X-ray region (e.g. a wavelength range of 5 to 15 nm), as well as a total reflection reduction optical system and a reflective mask designed under this exposure wavelength (e.g. 13.5 nm). In this apparatus, since a structure in which scanning exposure is performed by synchronously scanning the mask and the wafer with an arc illumination can be considered, the embodiment described above can also be suitably applied to such a device. Other than this, the embodiment described above can also be applied to an exposure apparatus that uses charged particle beams such as an electron beam or an ion beam.

Also, in the embodiment described above, while a transmissive type mask (reticle) was used, which is a transmissive substrate on which a predetermined light shielding pattern (or a phase pattern or a light attenuation pattern) is formed, instead of this reticle, as is disclosed in, for example, U.S. Pat. No. 6,778,257, an electron mask (which is also called a variable shaped mask, an active mask or an image generator, and includes, for example, a DMD (Digital Micro-mirror Device) that is a type of non-emission type image display device (spatial light modulator) or the like) which forms a light-transmitting pattern, a reflection pattern, or an emission pattern according to electronic data of the pattern that is to be exposed may also be used.

Also, the embodiment described above can be suitably applied to an exposure apparatus (a lithography system) that forms a line-and-space pattern on a wafer, for example, by forming an interference fringe on the wafer.

Furthermore, as is disclosed in, for example, U.S. Pat. No. 6,611,316, the embodiment described above can also be applied to an exposure apparatus that synthesizes two reticle patterns via a projection optical system and almost simultaneously performs double exposure of one shot area by one scanning exposure.

Note that an object on which a pattern is to be formed (an object subject to exposure irradiated with an energy beam) in the embodiment above is not limited to a wafer, and may be other objects such as a glass plate, a ceramic substrate, a film member, or a mask blank.

The usage of the exposure apparatus to which the embodiment is applied is not limited to an exposure apparatus for fabricating semiconductor devices, and the embodiment can be widely adapted to, for example, an exposure apparatus for fabricating liquid crystal devices in which a liquid crystal display device pattern is transferred to a rectangular glass plate, along with exposure apparatuses for fabricating organic ELs, thin film magnetic heads, image capturing devices (e.g., CCDs), micro-machines, and DNA chips. Also, the embodiment described above can be adapted not only to an exposure apparatus for micro-devices such as semiconductor devices, but also to an exposure apparatus that transfers a circuit pattern to a glass substrate, a silicon wafer, or the like in order to fabricate a reticle or a mask used by a light exposure apparatus, an EUV exposure apparatus, an X-ray exposure apparatus, an electron beam exposure apparatus, and the like.

Figure 20:
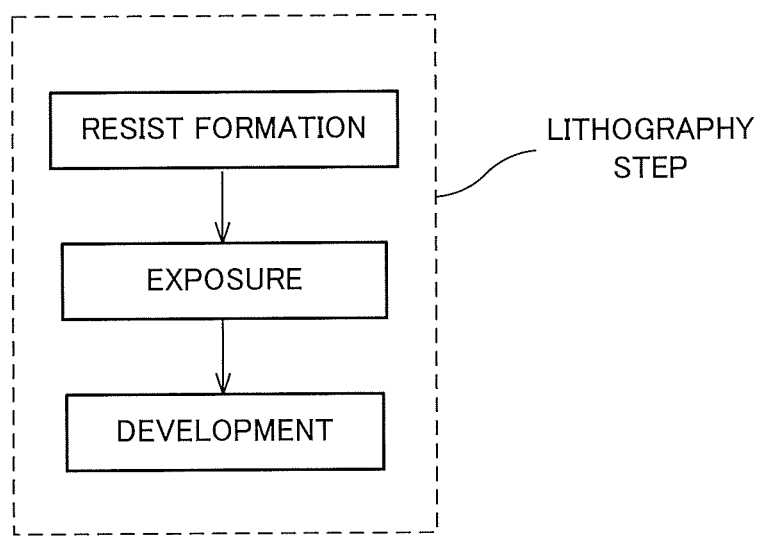

Electronic devices such as a semiconductor device are manufactured, as is shown in FIG. 20, through the steps of coating a resist (sensitive agent) on a wafer, exposing a wafer (sensitive object) using a reticle (mask) on which a pattern is formed with an exposure apparatus (pattern forming apparatus) described earlier in the embodiment described above, and with a lithography step in which the wafer that has been exposed is developed. In this case, highly integrated devices can be manufactured at high yield.

Note that other than the lithography step, the manufacturing process of semiconductor devices may include steps such as; a step for performing function/performance design of a device, a step for making a reticle (mask) based on this design step, a device assembly step (including a dicing process, a bonding process, and a package process), and an inspection step.

Note that the disclosures of all publications, International Publications, U.S. Patent Application Publications, and U.S. Patents related to exposure apparatuses and the like referred to so far in the description are incorporated herein by reference as a part of the present specification.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A mark formation method in which a plurality of marks, to be detected by a mark detection system having a plurality of mark detectors arranged in a matrix extending in a first direction and in a second direction that intersects the first direction, are arranged on a substrate on which a plurality of divided areas is set, the method comprising:
   determining a plurality of candidate mark templates, each of the candidate mark templates being a different arrangement of the plurality of marks, the plurality of candidate mark templates being determined based on a pitch of the plurality of mark detectors in the first and second directions and a size of the divided areas in the first and second directions;
   selecting one of the plurality of candidate mark templates as a final mark template; and
   forming the plurality of marks on the substrate according to the arrangement of the plurality of marks of the final mark template.

2. The method according to claim 1, wherein the arrangement of the plurality of marks includes a pitch of the plurality of marks.

3. The method according to claim 1, wherein the final mark template makes concurrent detection of the plurality of marks on the substrate by the plurality of mark detectors possible.

4. The method according to claim 1, wherein the plurality of mark detectors includes a first mark detector, a second mark detector arranged apart in the first direction with respect to the first mark detector, and a third mark detector arranged apart in the second direction which intersects the first direction within a predetermined plane with respect to the first mark detector.

5. The method according to claim 4, wherein the second mark detector is arranged apart in the first direction and the second direction with respect to the first mark detector.

6. The method according to claim 5, wherein the pitch includes information related to a space between the first mark detector and the second mark detector in the first direction.

7. The method according to claim 6, wherein the pitch includes information related to space between the first mark detector and the third mark detector in the second direction.

8. The method according to claim 4, wherein a space between the first mark detector and the third mark detector in the second direction is larger than a space between the first mark detector and the second mark detector in the first direction.

9. The method according to claim 1, wherein the size of the divided areas is selected from a plurality of candidates for the size of the divided areas.

10. The method according to claim 1, wherein the size of the divided areas in the first direction and the size of the divided areas in the second direction differ from each other.

11. The method according to claim 1, wherein each of the divided areas includes a pattern area on which a device pattern is formed, and
   each of the plurality of candidate mark templates includes an arrangement in which a part of the plurality of marks is formed within the pattern area on the substrate.

12. The method according to claim 1, further comprising:
   displaying the plurality of candidate mark templates on a display screen.

13. A mark formation method in which a plurality of marks, to be detected by a mark detection system having a plurality of mark detectors, are arranged on a substrate on which a plurality of divided areas is set, the method comprising:
   determining an arrangement of the plurality of marks based on a pitch of the plurality of mark detectors; and
   forming the plurality of marks on the substrate according to the arrangement that has been determined, wherein
   the plurality of mark detectors are arranged in a matrix extending in a first direction and in a second direction crossing the first direction, and
   where pitches in the first direction and the second direction of the plurality of mark detectors are $D_1$ and $D_2$, respectively, and pitches in the first direction and the second direction of the plurality of marks are $p_1$ and $p_2$, respectively, the arrangement of the plurality of marks includes information on pitch $p_1$ in the first direction and pitch $p_2$ in the second direction of the plurality of marks that satisfy formulas (c) and (d) below:

$$p_1 = D_1/i \text{ (}i\text{ denotes a natural number)} \quad \text{(c),}$$

$$p_2 = D_2/j \text{ (}j\text{ denotes a natural number)} \quad \text{(d).}$$

14. A mark formation method in which a plurality of marks, to be detected by a mark detection system having a plurality of mark detectors, are arranged on a substrate on which a plurality of divided areas is set, the method comprising:
   determining an arrangement of the plurality of marks based on a pitch of the plurality of mark detectors; and
   forming the plurality of marks on the substrate according to the arrangement that has been determined, wherein
   the plurality of mark detectors includes a first mark detector, a second mark detector arranged apart in a first direction with respect to the first mark detector, and a third mark detector arranged apart in a second direction which intersects the first direction within a predetermined plane with respect to the first mark detector,
   the arrangement of the plurality of marks is determined based on pitches of the plurality of mark detectors in the first and second directions,
   where pitches in the first direction and the second direction of the plurality of mark detectors are $D_1$ and $D_2$, respectively, sizes in the first direction and the second direction of the divided areas are $W_1$ and $W_2$, respectively, and pitch in the first direction and pitch in the second direction of the plurality of marks are $p_1$ and $p_2$, respectively, the arrangement of the plurality of marks includes information on pitch $p_1$ in the first direction and pitch $p_2$ in the second direction of the plurality of marks that satisfy formulas (a) and (b) below:

$$p_1 = D_1/i \text{ ($i$ denotes a natural number)} = W_1/m \text{ ($m$ denotes a natural number)} \quad \text{(a)}$$

$$p_2 = D_2/j \text{ ($j$ denotes a natural number)} = W_2/n \text{ ($n$ denotes a natural number)} \quad \text{(b)}.$$

* * * * *